(12) United States Patent
Takahashi et al.

(10) Patent No.: US 11,329,071 B2
(45) Date of Patent: May 10, 2022

(54) DISPLAY DEVICE, DISPLAY MODULE, AND ELECTRONIC DEVICE

(71) Applicant: Semiconductor Energy Laboratory Co., Ltd., Atsugi (JP)

(72) Inventors: Kei Takahashi, Kanagawa (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/794,348

(22) Filed: Feb. 19, 2020

(65) Prior Publication Data

US 2020/0185421 A1 Jun. 11, 2020

Related U.S. Application Data

(63) Continuation of application No. 15/873,174, filed on Jan. 17, 2018, now Pat. No. 10,608,017.

(30) Foreign Application Priority Data

Jan. 31, 2017 (JP) .................................. 2017-015379

(51) Int. Cl.
*H01L 27/12* (2006.01)
*G09G 3/20* (2006.01)
(Continued)

(52) U.S. Cl.
CPC ......... *H01L 27/124* (2013.01); *G09G 3/2092* (2013.01); *G09G 3/32* (2013.01);
(Continued)

(58) Field of Classification Search
CPC ... G09G 2300/0426; G09G 2300/0443; G09G 2300/0452; G09G 2310/0221;
(Continued)

(56) References Cited

U.S. PATENT DOCUMENTS 7,023,419 B2 4/2006 Park
7,542,031 B2 6/2009 Jo et al.
(Continued)

FOREIGN PATENT DOCUMENTS

CN 001870110 A 11/2006
CN 101251660 A 8/2008
(Continued)

OTHER PUBLICATIONS

Kumakura.T et al., "Development of a Novel Wide-Gamut 8K 120Hz LCD Complying with ITU-R BT.2020", SID Digest '15 : SID International Symposium Digest of Technical Papers, Jun. 2, 2015, pp. 1070-1073.
(Continued)

*Primary Examiner* — Dmitriy Bolotin
(74) *Attorney, Agent, or Firm* — Fish & Richardson P.C.

(57) ABSTRACT

A display device with high resolution is provided. A display device with high display quality is provided. A display device includes a display portion, a first terminal group, and a second terminal group. The display portion includes pixels, scan lines, and signal lines. The first terminal group and the second terminal group are apart from each other. The first terminal group includes first terminals and the second terminal group includes second terminals. The scan lines are each electrically connected to the pixels arranged in a row direction. The signal lines are each electrically connected to the pixels arranged in a column direction. The signal lines are each electrically connected to the first terminal or the second terminal. The display portion includes a first region where the signal lines electrically connected to the first terminals and the signal lines electrically connected to the second terminals are mixed.

9 Claims, 28 Drawing Sheets

(51) Int. Cl.
  *G09G 3/36* (2006.01)
  *G09G 5/00* (2006.01)
  *G09G 3/32* (2016.01)
  *H01L 29/786* (2006.01)

(52) U.S. Cl.
  CPC ......... *G09G 3/3611* (2013.01); *G09G 3/3659* (2013.01); *G09G 3/3666* (2013.01); *G09G 5/003* (2013.01); *G09G 2300/0426* (2013.01); *G09G 2300/0443* (2013.01); *G09G 2300/0452* (2013.01); *G09G 2310/0221* (2013.01); *G09G 2310/0278* (2013.01); *G09G 2320/0238* (2013.01); *G09G 2370/08* (2013.01); *H01L 27/1222* (2013.01); *H01L 27/1225* (2013.01); *H01L 29/7869* (2013.01); *H01L 29/78648* (2013.01); *H01L 29/78663* (2013.01); *H01L 29/78696* (2013.01)

(58) Field of Classification Search
  CPC ... G09G 2310/0278; G09G 2320/0238; G09G 2370/08; G09G 3/2092; G09G 3/32; G09G 3/3611; G09G 3/3659; G09G 3/3666; G09G 5/003; H01L 27/1225; H01L 27/124; H01L 29/78663; H01L 29/7869; H01L 27/1222; H01L 29/78648; H01L 29/78696
  See application file for complete search history.

(56) References Cited

U.S. PATENT DOCUMENTS

| | | | |
|---|---|---|---|
| 8,294,702 B2 | 10/2012 | Tanikame | |
| 8,319,725 B2 | 11/2012 | Okamoto et al. | |
| 8,384,708 B2* | 2/2013 | Moon | G09G 3/3607 345/214 |
| 8,552,973 B2 | 10/2013 | Ono | |
| 8,810,508 B2 | 8/2014 | Okamoto et al. | |
| 9,024,863 B2 | 5/2015 | Okamoto et al. | |
| 9,397,117 B2 | 7/2016 | Okamoto et al. | |
| 9,466,255 B2* | 10/2016 | Park | G09G 3/3614 |
| 9,633,589 B2* | 4/2017 | Kim | G09G 3/20 |
| 9,865,210 B2* | 1/2018 | Lee | G09G 3/3614 |
| 9,905,312 B2 | 2/2018 | Nonaka | |
| 9,980,389 B2 | 5/2018 | Okamoto et al. | |
| 10,101,626 B2 | 10/2018 | Wang et al. | |
| 10,211,274 B2 | 2/2019 | Kim | |
| 10,228,595 B2 | 3/2019 | Yamamoto et al. | |
| 10,241,369 B2 | 3/2019 | Yamamoto et al. | |
| 10,580,796 B2 | 3/2020 | Okamoto et al. | |
| 10,824,037 B2 | 11/2020 | Im et al. | |
| 2004/0036070 A1 | 2/2004 | Yun | |
| 2005/0052439 A1 | 3/2005 | Liou | |
| 2006/0115948 A1 | 6/2006 | Tokunaga | |
| 2006/0262050 A1 | 11/2006 | Ogawa et al. | |
| 2006/0274005 A1* | 12/2006 | Miyazaki | G09G 3/3688 345/89 |
| 2007/0072439 A1 | 3/2007 | Akimoto et al. | |
| 2007/0171215 A1 | 7/2007 | Song | |
| 2008/0204434 A1 | 8/2008 | Lee et al. | |
| 2009/0033818 A1 | 2/2009 | Nakajima et al. | |
| 2009/0040243 A1* | 2/2009 | Hisada | G09G 3/3648 345/690 |
| 2009/0096975 A1 | 4/2009 | Kwon et al. | |
| 2009/0167730 A1* | 7/2009 | Kwak | G09G 3/3688 345/204 |
| 2011/0080387 A1 | 4/2011 | Park | |
| 2013/0120340 A1* | 5/2013 | Yamashita | G09G 3/3648 345/211 |
| 2013/0222216 A1* | 8/2013 | Park | G09G 3/3614 345/55 |
| 2013/0314390 A1* | 11/2013 | Yamamoto | G09G 3/36 345/211 |
| 2014/0132873 A1* | 5/2014 | Ogasawara | G02F 1/1309 349/43 |
| 2016/0019856 A1* | 1/2016 | Tanaka | G09G 3/3677 345/206 |
| 2016/0026052 A1 | 1/2016 | Ogasawara et al. | |
| 2016/0275893 A1 | 9/2016 | Tanaka et al. | |
| 2017/0221436 A1* | 8/2017 | Guo | G09G 3/3607 |
| 2017/0263204 A1 | 9/2017 | Tanaka et al. | |
| 2017/0323606 A1* | 11/2017 | Wang | G09G 3/3614 |
| 2017/0336667 A1 | 11/2017 | Yamamoto et al. | |
| 2017/0336688 A1 | 11/2017 | Yamamoto et al. | |
| 2021/0013770 A1 | 1/2021 | Yamasaki et al. | |

FOREIGN PATENT DOCUMENTS

| | | |
|---|---|---|
| CN | 101414087 A | 4/2009 |
| CN | 101465095 A | 6/2009 |
| CN | 102479491 A | 5/2012 |
| CN | 104597651 A | 5/2015 |
| CN | 105068349 A | 11/2015 |
| CN | 105719606 A | 6/2016 |
| EP | 1962270 | 8/2008 |
| JP | 10-325962 A | 12/1998 |
| JP | 2001-053283 A | 2/2001 |
| JP | 2002-287721 A | 10/2002 |
| JP | 2005-070722 A | 3/2005 |
| JP | 2005-338157 A | 12/2005 |
| JP | 2007-096055 A | 4/2007 |
| JP | 2007-123861 A | 5/2007 |
| JP | 2007-164100 A | 6/2007 |
| JP | 2007-322747 A | 12/2007 |
| JP | 2008-216436 | 9/2008 |
| JP | 2010-176013 A | 8/2010 |
| JP | 2013-178480 A | 9/2013 |
| JP | 2016-170443 A | 9/2016 |
| KR | 2013-0098762 A | 9/2013 |
| TW | 201106332 | 2/2011 |
| TW | 201417072 | 5/2014 |
| WO | WO-2009/148006 | 12/2009 |
| WO | WO-2010/128614 | 11/2010 |
| WO | WO-2010/147049 | 12/2010 |

OTHER PUBLICATIONS

Taiwanese Office Action (Application No. 107102179) dated Apr. 27, 2021.
Chinese Office Action (Application No. 201810052526.2) dated Sep. 10, 2021, with English Translation.
Chinese Office Action (Application No. 201810052526.2) dated Sep. 10, 2021.

* cited by examiner

FIG. 8A

| 101a | | | 110 | | 101b | | |
|---|---|---|---|---|---|---|---|
| SL_2n-3 | SL_2n-2 | SL_2n-1 | SL_2n | SL_2n+1 | SL_2n+2 | SL_2n+3 | SL_2n+4 |
| a | a | a | b | a | b | b | b |

FIG. 8B

| 101a | | 110 | | | | | 101b |
|---|---|---|---|---|---|---|---|
| SL_2n-3 | SL_2n-2 | SL_2n-1 | SL_2n | SL_2n+1 | SL_2n+2 | SL_2n+3 | SL_2n+4 |
| a | b | a | b | a | b | a | b |

FIG. 8C

| 101a | | 110 | | | |
|---|---|---|---|---|---|
| SL_2n-5 | SL_2n-4 | SL_2n-3 | SL_2n-2 | SL_2n-1 | SL_2n |
| a | a | b | b | a | a |

⇒ ⇒

⇒ ⇒

| 110 | | | | 101b | |
|---|---|---|---|---|---|
| SL_2n+1 | SL_2n+2 | SL_2n+3 | SL_2n+4 | SL_2n+5 | SL_2n+6 |
| b | b | a | a | b | b |

FIG. 8D

| 101a | | 110 | | | |
|---|---|---|---|---|---|
| SL_2n-5 | SL_2n-4 | SL_2n-3 | SL_2n-2 | SL_2n-1 | SL_2n |
| a | a | b | a | b | b |

⇒ ⇒

⇒ ⇒

| 110 | | | 101b | |
|---|---|---|---|---|
| SL_2n+1 | SL_2n+2 | SL_2n+3 | SL_2n+4 | SL_2n+5 |
| a | b | a | b | b |

FIG. 8E

| 101a | | 110 | | | | |
|---|---|---|---|---|---|---|
| SL_2n-9 | SL_2n-8 | SL_2n-7 | SL_2n-6 | SL_2n-5 | SL_2n-4 | SL_2n-3 |
| a | a | b | a | a | a | b |

⇒ ⇒

⇒ ⇒

| 110 | | | | | |
|---|---|---|---|---|---|
| SL_2n-2 | SL_2n-1 | SL_2n | SL_2n+1 | SL_2n+2 | SL_2n+3 |
| a | a | b | a | b | b |

⇒ ⇒

⇒ ⇒

| 110 | | | | 101b | |
|---|---|---|---|---|---|
| SL_2n+4 | SL_2n+5 | SL_2n+6 | SL_2n+7 | SL_2n+8 | SL_2n+9 | SL_2n+10 |
| a | b | b | b | a | b | b |

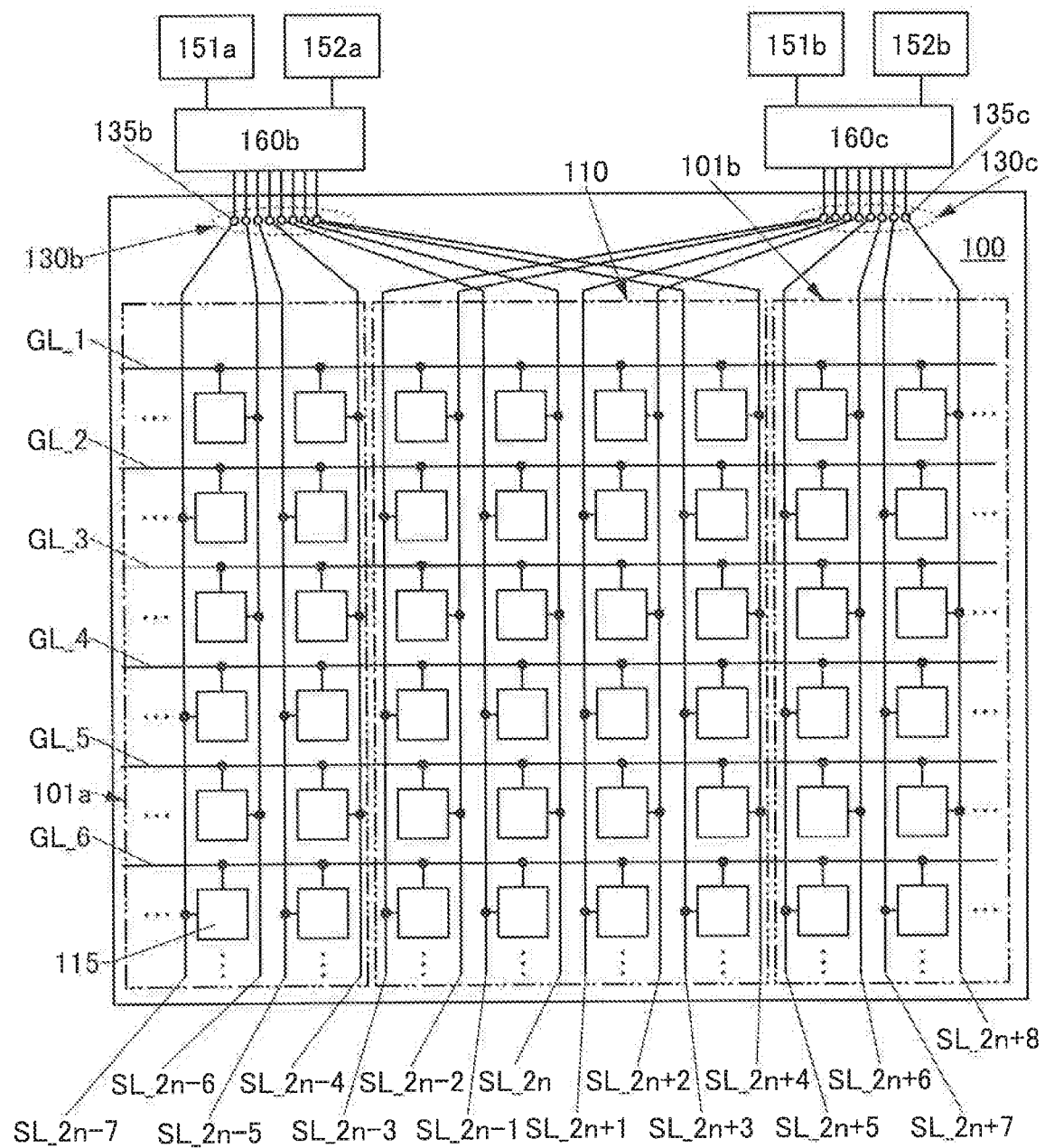

|  | 101a | 110 | | | | | | | 101b |
|---|---|---|---|---|---|---|---|---|---|
|  | SL_2n-6 | SL_2n-4 | SL_2n-2 | SL_2n | SL_2n+2 | SL_2n+4 | SL_2n+6 | SL_2n+8 |
| GL_i | a | b | b | b | b | b | b | b |
|  | SL_2n-7 | SL_2n-5 | SL_2n-3 | SL_2n-3 | SL_2n+1 | SL_2n+3 | SL_2n+5 | SL_2n+7 |
| GL_i+1 | a | a | a | a | a | a | a | b |

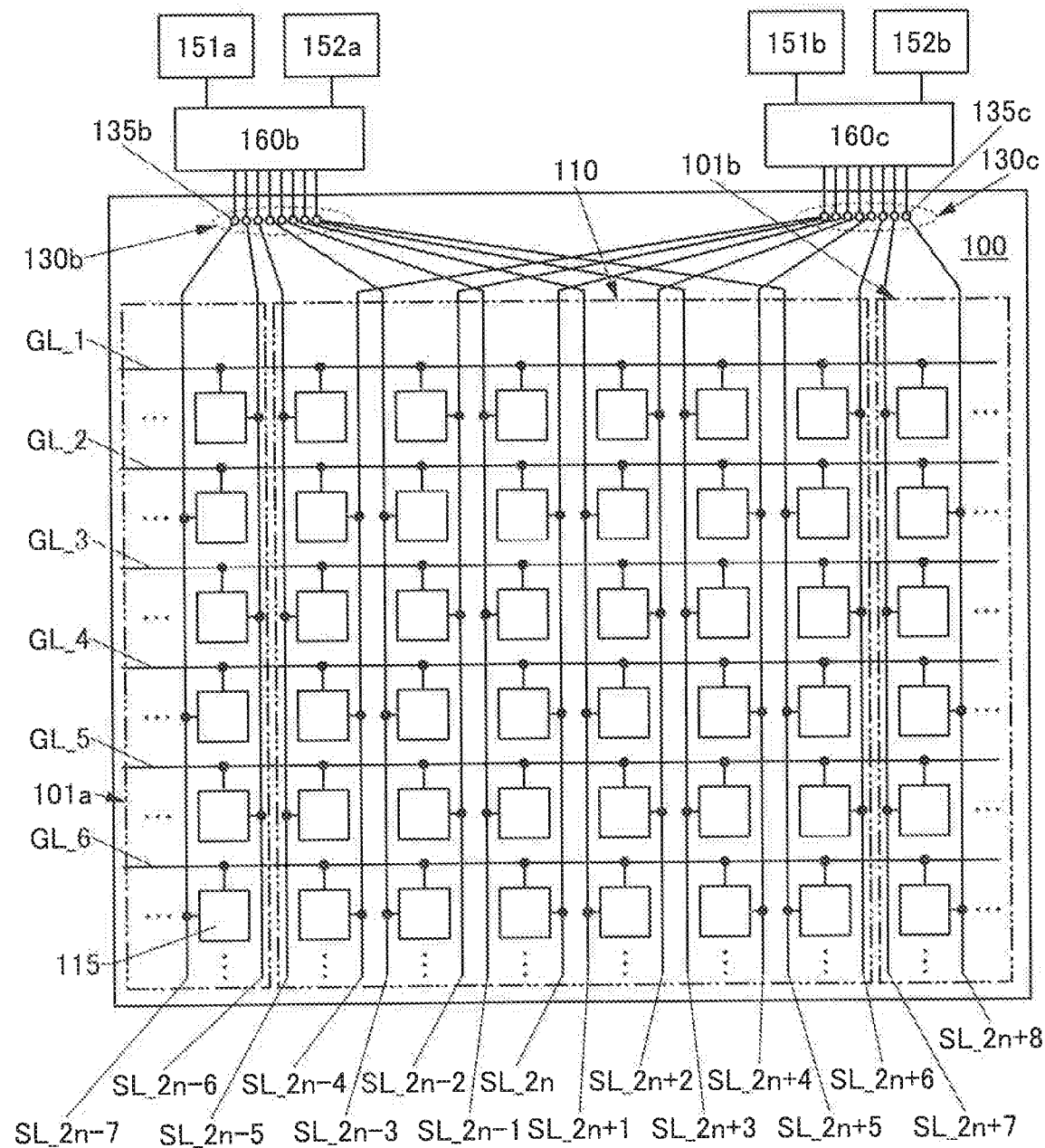

DISPLAY DEVICE, DISPLAY MODULE, AND ELECTRONIC DEVICE

CROSS-REFERENCE TO RELATED APPLICATIONS

This application is a continuation of U.S. application Ser. No. 15/873,174, filed Jan. 17, 2018, now allowed, which claims the benefit of a foreign priority application filed in Japan as Serial No. 2017-015379 on Jan. 31, 2017, both of which are incorporated by reference.

BACKGROUND OF THE INVENTION

1. Field of the Invention

One embodiment of the present invention relates to a display device, a display module, and an electronic device.

Note that one embodiment of the present invention is not limited to the above technical field. Examples of the technical field of one embodiment of the present invention include a semiconductor device, a display device, a light-emitting device, an electronic device, a lighting device, an input-output device (e.g., a touch panel), a driving method thereof, and a manufacturing method thereof.

In this specification and the like, a semiconductor device generally means a device that can function by utilizing semiconductor characteristics. A display device (e.g., a liquid crystal display device and a light-emitting display device), a projection device, a lighting device, an electro-optical device, a power storage device, a memory device, a semiconductor circuit, an imaging device, an electronic device, and the like may be referred to as a semiconductor device. Alternatively, they may include a semiconductor device.

2. Description of the Related Art

In recent years, display devices with high resolution have been demanded. For example, display devices including a large number of pixels, such as full high definition (1920×1080 pixels), 4K (e.g., 3840×2160 pixels or 4096×2160 pixels), and 8K (e.g., 7680×4320 pixels or 8192×4320 pixels) display devices, have been actively developed.

Flat panel displays typified by liquid crystal display devices and light-emitting display devices are widely used as display devices. Although transistors used in such display devices are mainly formed using silicon as a semiconductor material, a technique in which a transistor formed using a metal oxide is used for a pixel of a display device has been developed in recent years.

Patent Document 1 discloses a technique in which amorphous silicon is used for a semiconductor material of a transistor. Patent Documents 2 and 3 each disclose a technique in which a metal oxide is used for a semiconductor material of a transistor.

REFERENCE

Patent Document

[Patent Document 1] Japanese Published Patent Application No. 2001-53283
[Patent Document 2] Japanese Published Patent Application No. 2007-123861
[Patent Document 3] Japanese Published Patent Application No. 2007-096055

SUMMARY OF THE INVENTION

A transistor including amorphous silicon or a metal oxide has advantages over a transistor or the like including polycrystalline silicon in productivity and ease of being formed over a large substrate. On the other hand, the transistor including amorphous silicon or a metal oxide has difficulty in having high field-effect mobility as compared with the transistor including polycrystalline silicon. In the case where a load connected to the transistor is heavy, it might be difficult to drive the transistor at a high frequency.

An increase in size of television devices (also referred to as a TV or a television receiver), monitors, digital signage, and the like is demanded. In addition, a higher frame frequency is required for smooth display of moving images. However, the higher the resolution is or the larger the screen size is, the more significant an increase in load becomes, which makes operation at a high frame frequency difficult.

An object of one embodiment of the present invention is to provide a display device with high resolution. Another object of one embodiment of the present invention is to provide a display device capable of operating at a high frame frequency. Another object of one embodiment of the present invention is to provide a large display device. Another object of one embodiment of the present invention is to provide a display device with high productivity. Another object of one embodiment of the present invention is to provide a display device with high display quality.

Note that the descriptions of these objects do not disturb the existence of other objects. One embodiment of the present invention does not necessarily achieve all the objects. Other objects can be derived from the description of the specification, the drawings, and the claims.

[1] One embodiment of the present invention is a display device including a display portion, a first terminal group, and a second terminal group. The display portion includes a plurality of pixels, a plurality of scan lines, and a plurality of signal lines. The first terminal group and the second terminal group are apart from each other. The first terminal group includes a plurality of first terminals. The second terminal group includes a plurality of second terminals. The plurality of scan lines are each electrically connected to the plurality of pixels arranged in the row direction. The plurality of signal lines are each electrically connected to the plurality of pixels arranged in the column direction. The plurality of signal lines are each electrically connected to the first terminal or the second terminal. The display portion includes a first region. The signal lines electrically connected to the first terminals and the signal lines electrically connected to the second terminals are mixed in the first region. In the case where the signal line electrically connected to the first terminal and the signal line electrically connected to the second terminal are respectively referred to as a first signal line and a second signal line, for example, one of the plurality of first signal lines is provided between two of the plurality of second signal lines in the first region.

In [1], the plurality of pixels may be arranged in 2n columns (n is an integer greater than or equal to 2). Here, the first region preferably includes the signal line electrically connected to the pixels in the n-th column and the signal line electrically connected to the pixels in the (n+1)-th column.

Alternatively, in [1], the plurality of pixels may be arranged in n columns (n is an integer greater than or equal to 300). Here, the number of the signal lines in the first region is preferably greater than or equal to 2 and less than or equal to 300. In other words, the sum of the number of the first signal lines and the number of the second signal lines in the first region is preferably greater than or equal to 2 and less than or equal to 300.

Alternatively, in [1], the plurality of pixels may be arranged in m rows and n columns (m and n are each an integer greater than or equal to 2) and the number of the signal lines in the display portion may be 2n. Here, the pixel in an odd-numbered row and the j-th column (j is an integer greater than or equal to 1 and less than or equal to n) and the pixel in an even-numbered row and the j-th column are preferably electrically connected to different signal lines. Moreover, the pixel in the (i−1)-th row and the j-th column (i is an integer greater than or equal to 1 and less than or equal to m) is preferably electrically connected to the signal line electrically connected to the first terminal and the pixel in the i-th row and the j-th column is preferably electrically connected to the signal line electrically connected to the second terminal.

In the above structures, the signal line electrically connected to the first terminal and the signal line electrically connected to the second terminal may be regularly arranged in the first region. For example, the signal line electrically connected to the first terminal and the signal line electrically connected to the second terminal or a set of the signal lines each electrically connected to the first terminal and a set of the signal lines each electrically connected to the second terminal are preferably alternately arranged in the first region.

In the above structures, the display portion may include a second region and a third region. Here, the second region and the third region are provided with the first region positioned therebetween. The signal lines in the second region are each electrically connected to the first terminal. The signal lines in the third region are each electrically connected to the second terminal.

In the above structures, the pixel may include a display element and a transistor electrically connected to the display element. The display element is preferably a liquid crystal element or a light-emitting element. The transistor preferably includes a semiconductor layer including amorphous silicon. Alternatively, the transistor preferably includes a semiconductor layer including a metal oxide.

In the above structures, the diagonal size of the display portion can be greater than or equal to 50 inches, greater than or equal to 55 inches, greater than or equal to 60 inches, or greater than or equal to 65 inches.

In the above structures, the resolution of the display portion is preferably higher than or equal to 4K, further preferably higher than or equal to 8K.

[2] One embodiment of the present invention is a display module including the display device with any of the above structures, a first signal line driver circuit, and a second signal line driver circuit. The first signal line driver circuit is electrically connected to the first terminal group, and the second signal line driver circuit is electrically connected to the second terminal group.

In [2], the display module preferably further includes a first reference voltage generating circuit and a second reference voltage generating circuit. The first reference voltage generating circuit is electrically connected to the first signal line driver circuit. The second reference voltage generating circuit is electrically connected to the second signal line driver circuit.

In this specification and the like, a structure in which a connector such as a flexible printed circuit (FPC) or a tape carrier package (TCP) is attached to a substrate of a display device, or a structure in which an IC is mounted on a substrate by a chip on glass (COG) method or the like is referred to as a display module.

[3] One embodiment of the present invention is an electronic device including the display module with any of the above structures and at least one of an antenna, a battery, a housing, a camera, a speaker, a microphone, and an operation button.

One embodiment of the present invention can provide a display device with high resolution. One embodiment of the present invention can provide a display device capable of operating at a high frame frequency. One embodiment of the present invention can provide a large display device. One embodiment of the present invention can provide a display device with high productivity. One embodiment of the present invention can provide a display device with high display quality.

Note that the descriptions of these effects do not preclude the existence of other effects. One embodiment of the present invention does not necessarily achieve all the effects. Other effects can be derived from the description of the specification, the drawings, and the claims.

BRIEF DESCRIPTION OF THE DRAWINGS

In the accompanying drawings:
FIGS. 8A to 8E each illustrate a display module;
FIGS. 10A and 10B each illustrate a display module;
FIGS. 12A and 12B each illustrate a display module.

DETAILED DESCRIPTION OF THE INVENTION

Figure 1:
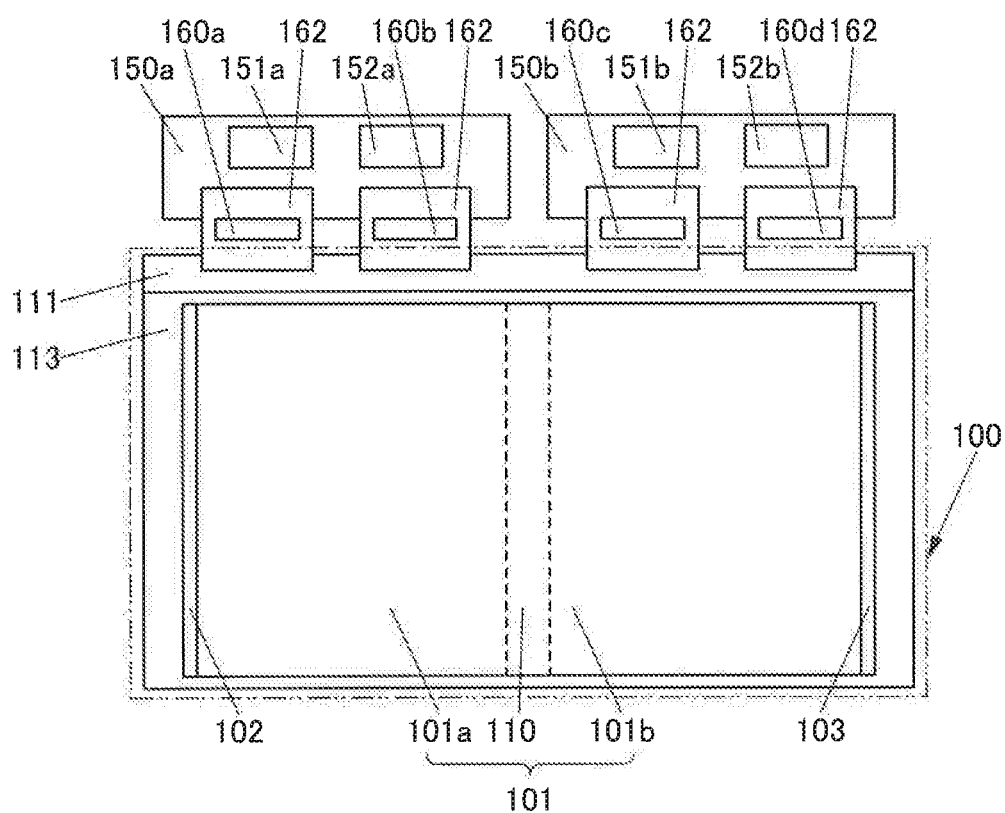
FIG. 1 illustrates a display module.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. Thus, the present invention should not be construed as being limited to the description in the following embodiments.

Note that in the structures of the present invention described below, the same portions or portions having similar functions are denoted by the same reference numerals in common in different drawings and repetitive description thereof will be omitted. Further, the same hatching pattern is applied to portions having similar functions, and the portions are not especially denoted by reference numerals in some cases.

The position, size, range, or the like of each structure illustrated in drawings is not accurately represented in some cases for easy understanding. Therefore, the disclosed invention is not necessarily limited to the position, size, range, or the like disclosed in the drawings.

Note that the terms "film" and "layer" can be interchanged with each other depending on the case or circumstances. For example, the term "conductive layer" can be changed into the term "conductive film". Also, the term "insulating film" can be changed into the term "insulating layer".

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in a semiconductor layer of a transistor is called an oxide semiconductor in some cases. In other words, an OS FET is a transistor including a metal oxide or an oxide semiconductor.

In this specification and the like, a metal oxide including nitrogen is also called a metal oxide in some cases. Moreover, a metal oxide including nitrogen may be called a metal oxynitride.

Embodiment 1

In this embodiment, a display device and a display module of embodiments of the present invention are described with reference to FIG. 1, FIG. 2, FIGS. 3A and 3B, FIG. 4, FIG. 5, FIG. 6, FIG. 7, FIGS. 8A to 8E, FIG. 9, FIGS. 10A and 10B, FIGS. 11A and 11B, FIGS. 12A and 12B, FIG. 13, FIG. 14, FIG. 15, FIGS. 16A to 16E, FIGS. 17A and 17B, FIG. 18, FIG. 19, FIG. 20, FIG. 21, FIGS. 22A to 22C, FIGS. 23A to 23D, and FIGS. 24A to 24F.

One embodiment of the present invention is a display device including a display portion, a first terminal group, and a second terminal group. The display portion includes pixels, scan lines, and signal lines. The first terminal group and the second terminal group are apart from each other. The first terminal group includes first terminals. The second terminal group includes second terminals. The scan lines are each electrically connected to the pixels arranged in the row direction. The signal lines are each electrically connected to the pixels arranged in the column direction. The signal lines are each electrically connected to the first terminal or the second terminal. The display portion includes a first region. The signal lines electrically connected to the first terminals and the signal lines electrically connected to the second terminals are mixed in the first region.

One embodiment of the present invention is a display module including a display device with the above structure, a first signal line driver circuit, a second signal line driver circuit, a first reference voltage generating circuit, and a second reference voltage generating circuit. The first signal line driver circuit is electrically connected to the first terminal group. The second signal line driver circuit is electrically connected to the second terminal group. The first reference voltage generating circuit is electrically connected to the first signal line driver circuit. The second reference voltage generating circuit is electrically connected to the second signal line driver circuit.

In the case where a transistor with low field-effect mobility is used in a large-sized high-resolution display module, image rewriting cannot be done in a frame period and driving cannot be performed in some cases. In such a case, a configuration in which a display portion is divided into a plurality of regions (e.g., four regions) and a scan line driver circuit (also referred to as a gate driver) and a signal line driver circuit (also referred to as a source driver) are electrically connected to each region can be employed. With such a configuration, image rewriting of the plurality of regions can be performed at the same time; thus, image rewriting can be performed in a frame period even when a transistor with low field-effect mobility is used.

In the case where the resolution of the display module is 8K, the resolution of one region of the display portion that is divided into four regions is 4K, for example. Thus, one 8K display module can be driven by using a plurality of IC chips (also simply referred to as ICs) and a plurality of printed circuit boards (also referred to as PCBs) that are for 4K display modules. That is, the IC, the printed circuit board, and the like that are for 4K display modules can be used for the 8K display module, and a technique relating to a display module with lower resolution can be effectively used.

However, it is difficult for reference voltage generating circuits to generate perfectly the same reference voltage, so that different reference voltages are likely to be supplied to signal line driver circuits. This difference might cause variation in signals supplied from the signal line driver circuits to signal lines. In the case where two regions express the same gray level, for example, when different potentials are supplied to the signal lines, the two regions perform display at different luminances and a boundary between the two regions is recognized as a dividing line by a viewer in some cases.

In the display module of one embodiment of the present invention, a region where signal lines electrically connected to the first signal line driver circuit and signal lines electrically connected to the second signal line driver circuit are mixed is provided between two regions into which the display portion is divided. The reference voltages supplied to the two signal line driver circuits are averaged in the region between the two regions. That is, the luminances of the two regions are averaged in the region between the two regions. Therefore, the provision of the region between the two regions can make a dividing line hardly visible. Accordingly, deterioration of the display quality of the display module can be suppressed.

In this specification and the like, the order of arrangement of signal lines x and signal lines y in a region where the signal lines x and the signal lines y are mixed may be regular or irregular. For example, the signal line x and the signal line y or a set of the signal lines x and a set of the signal lines y may be alternately arranged. Alternatively, for example, a region where the number of the signal lines x provided between two signal lines y changes in a stepwise manner and/or a region where the number of the signal lines y provided between two signal lines x changes in a stepwise manner may be provided (also referred to as gradation). The number of the signal lines x and the number of the signal lines y included in the display device of one embodiment of the present invention are preferably the same.

The display device of one embodiment of the present invention includes a region where the signal lines electrically connected to the first terminals and the signal lines electrically connected to the second terminals are mixed. Thus, a dividing line can hardly be recognized even when a signal line driver circuit electrically connected to the first terminal group and a signal line driver circuit electrically connected to the second terminal group are electrically connected to different reference voltage generating circuits. Accordingly, deterioration of the display quality of the display device can be suppressed.

<1-1. Structure Example 1 of Display Module>

Structure examples of a display module of one embodiment of the present invention are described with reference to FIG. 1, FIG. 2, FIGS. 3A and 3B, FIG. 4, and FIG. 5.

FIG. 1 is a top view of the display module of one embodiment of the present invention.

The display module illustrated in FIG. 1 includes a display device 100 (also referred to as a display panel). The display device 100 includes a display portion 101, a scan line driver circuit 102, and a scan line driver circuit 103 in a region sealed with a first substrate 111 and a second substrate 113. The display portion 101 includes a region 101a, a region 101b, and a region 110.

Four FPCs 162 are connected to the first substrate 111 in a region different from the region sealed with the first substrate 111 and the second substrate 113. An IC is connected to each of the FPCs 162 by a chip on film (COF) method. An IC 160a, an IC 160b, an IC 160c, and an IC 160d each include a signal line driver circuit.

The display module illustrated in FIG. 1 includes two printed circuit boards (a printed circuit board 150a and a printed circuit board 150b). Two FPCs 162 are connected to each printed circuit board, and each printed circuit board is connected to the first substrate 111 through the FPCs 162.

FIG. 1 illustrates an example in which two printed circuit boards are connected to one side of the display device 100.

A timing controller 151a and a reference voltage generating circuit 152a are provided over the printed circuit board 150a. Similarly, a timing controller 151b and a reference voltage generating circuit 152b are provided over the printed circuit board 150b. Another integrated circuit may be further provided over each printed circuit board.

The timing controllers 151a and 151b each generate a signal such as a clock signal or a start pulse signal and output it to the signal line driver circuit of the IC.

The reference voltage generating circuits 152a and 152b each supply a reference voltage to the signal line driver circuit of the IC.

In the display module illustrated in FIG. 1, the IC and the printed circuit board are mounted on the display device 100. In one embodiment of the present invention, there is no particular limitation on a method for connecting an integrated circuit to the display device; a wire bonding method, a COG method, a TCP method, a COF method, or the like can be used. The numbers of ICs and printed circuit boards mounted on the display device are not limited.

In the display module illustrated in FIG. 1, the display device 100 includes a scan line driver circuit. One embodiment of the present invention is not limited to this structure, and not only the signal line driver circuit but also the scan line driver circuit may be provided over the substrate externally attached to the display device.

Figure 2:
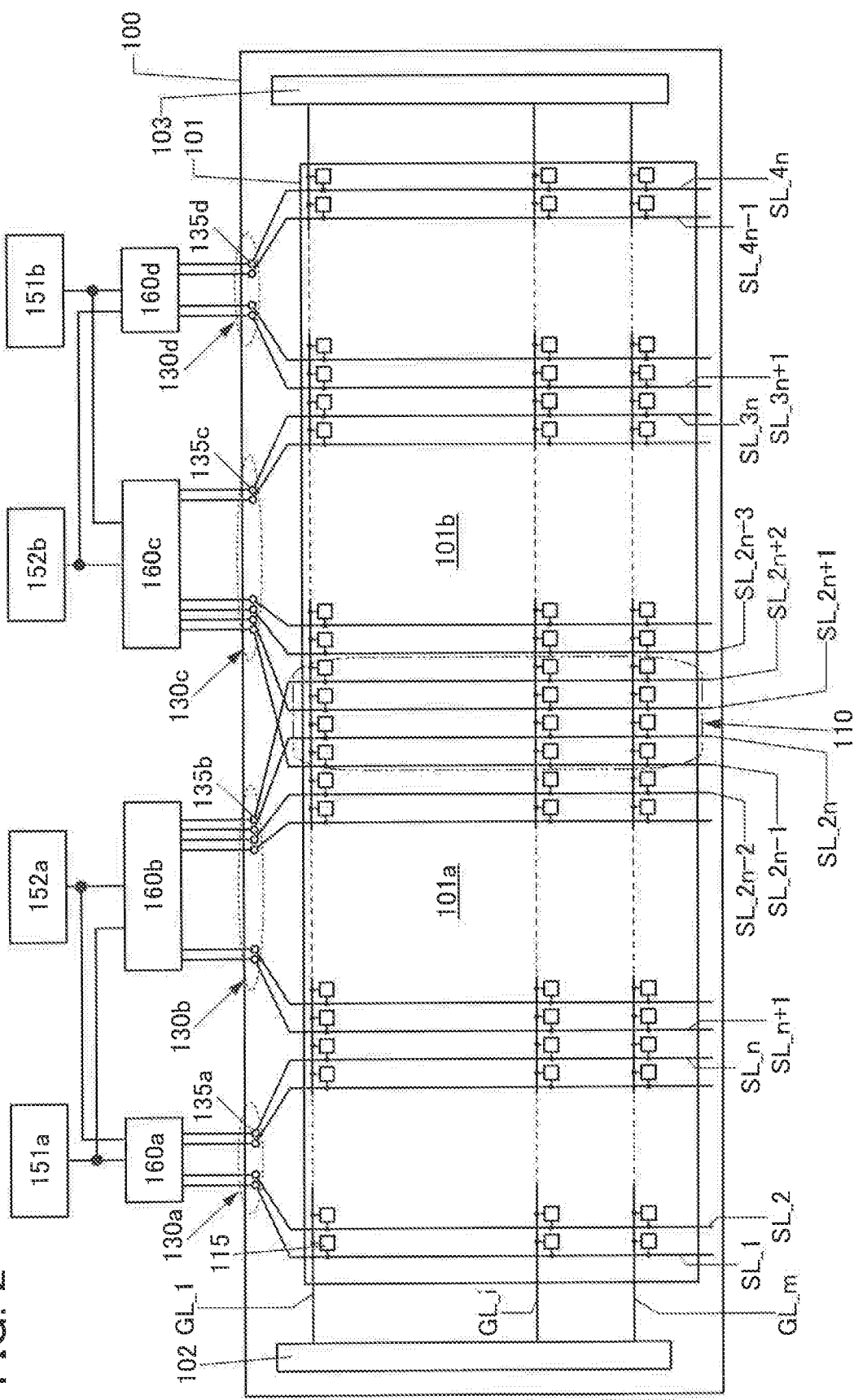
FIG. 2 illustrates a display module.

FIG. 2 is a block diagram of the display module of one embodiment of the present invention.

The display portion 101 includes pixels 115 as illustrated in FIG. 2. FIG. 2 illustrates an example in which the display portion 101 includes the pixels 115 arranged in a matrix of m rows and 4n columns (m and n are each an integer greater than or equal to 1).

The display device 100 includes m scan lines GL. The m scan lines GL each extend in the row direction. In addition, the m scan lines GL are each electrically connected to the pixels 115 arranged in the row direction in the display portion 101.

In this specification and the like, the scan line GL electrically connected to the pixels 115 in the i-th row (i is an integer greater than or equal to 1 and less than or equal to m) is referred to as a scan line GL_i, unless otherwise specified.

One end of the scan line GL_is electrically connected to the scan line driver circuit 102 and the other end of the scan line GL_is electrically connected to the scan line driver circuit 103. That is, the scan line driver circuit 102 and the scan line driver circuit 103 face each other with the display portion 101 positioned therebetween.

The scan line driver circuits 102 and 103 each have a function of supplying selection signals to the scan lines GL. The scan line GL has a function of transmitting the selection signals supplied from the scan line driver circuits 102 and 103 to the pixel 115.

The scan line driver circuits 102 and 103 each have a function of sequentially supplying selection signals to scan lines GL_1 to GL_m. In other words, the scan line driver circuits 102 and 103 each have a function of sequentially scanning the scan lines GL_1 to GL_m. After being performed up to the scan line GL_m, scanning is sequentially performed again from the scan line GL_1.

The scan line driver circuits 102 and 103 simultaneously supply selection signals to the same scan line GL, so that capability of supplying the selection signals to the scan lines GL can be improved. Note that one of the scan line driver circuits 102 and 103 may be omitted depending on the purpose or the like.

The display device 100 includes 4n signal lines SL. The 4n signal lines SL each extend in the column direction. In addition, the 4n signal lines SL are each electrically connected to the pixels 115 arranged in the column direction in the display portion 101.

In this specification and the like, the scan line SL electrically connected to the pixels 115 in the j-th column (j is an integer greater than or equal to 1 and less than or equal to 4n) is referred to as a signal line SL_j, unless otherwise specified.

The 4n signal lines SL are each electrically connected to the signal line driver circuit. The signal line driver circuit has a function of supplying an image signal to the signal line SL. The signal line SL has a function of transmitting, to the pixel 115, the image signal supplied from the signal line driver circuit.

The display device 100 includes four terminal groups (terminal groups 130a to 130d) and the terminal groups each include terminals (the terminal group 130a includes terminals 135a, for example). The four terminal groups are apart from each other and connected to different ICs. The terminals of the same terminal group are electrically connected to the same IC (in other words, the same signal line driver circuit). One terminal is connected to one signal line SL. That is, the signal lines SL connected to the terminals of the same terminal group are electrically connected to the same IC (the same signal line driver circuit).

Figure 3:
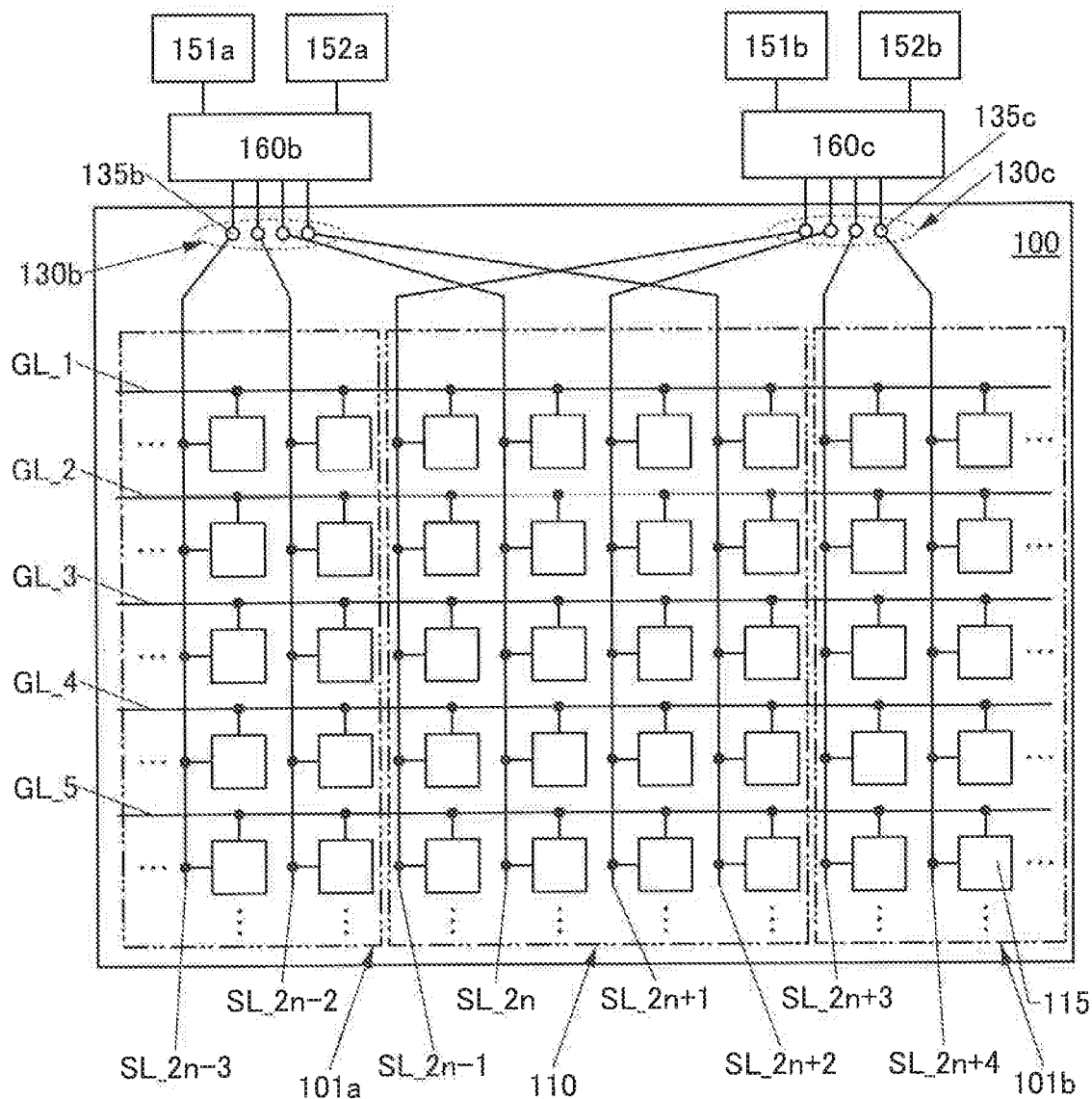
FIGS. 3A and 3B each illustrate a display module.

A connection relationship between the signal lines and the signal line driver circuit is described with reference to FIG. 2 and FIG. 3A. FIG. 3A specifically illustrates structures of a boundary between the region 101a and the region 110, a boundary between the region 110 and the region 101b, and the vicinities of the boundaries in the display portion 101 illustrated in FIG. 2. Each region includes m scan lines GL. FIG. 3A illustrates the scan line GL_1 in the first row to a scan line GL_5 in the fifth row.

The region 101a includes a signal line SL_1 in the first column to a signal line SL_2n−2 in the (2n−2)-th column.

The signal line SL_1 in the first column to a signal line SL_n in the n-th column are each connected to one of the terminals 135a of the terminal group 130a and electrically connected to the signal line driver circuit of the IC 160a.

A signal line SL_n+1 in the (n+1)-th column to the signal line SL_2n−2 in the (2n−2)-th column are each connected to one of the terminals 135b of the terminal group 130b and electrically connected to the signal line driver circuit of the IC 160b.

The ICs 160a and 160b are electrically connected to the timing controller 151a and the reference voltage generating circuit 152a.

That is, in the region 101a, an image signal is supplied to the signal line SL from the signal line driver circuit electrically connected to the timing controller 151a and the reference voltage generating circuit 152a.

As described above, both the signal line driver circuit of the IC 160a, to which some signal lines are electrically connected, and the signal line driver circuit of the IC 160b, to which other signal lines are electrically connected, are electrically connected to the timing controller 151a and the reference voltage generating circuit 152a in the region 101a. Thus, a large difference between reference voltages supplied to the two signal line driver circuits is hardly generated. Accordingly, a dividing line is hardly recognized by a viewer in the region 101a, so that high display quality can be obtained.

The region 101b includes a signal line SL_2n+3 in the (2n+3)-th column to a signal line SL_4n in the 4n-th column.

The signal line SL_2n+3 in the (2n+3)-th column to a signal line SL_3n in the 3n-th column are each connected to one of the terminals 135c of the terminal group 130c and electrically connected to the signal line driver circuit of the IC 160c.

A signal line SL_3n+1 in the (3n+1)-th column to the signal line SL_4n in the 4n-th column are each connected to one of the terminals 135d of the terminal group 130d and electrically connected to the signal line driver circuit of the IC 160d.

The ICs 160c and 160d are electrically connected to the timing controller 151b and the reference voltage generating circuit 152b.

That is, in the region 101b, an image signal is supplied to the signal line SL from the signal line driver circuit electrically connected to the timing controller 151b and the reference voltage generating circuit 152b.

As described above, both the signal line driver circuit of the IC 160c, to which some signal lines are electrically connected, and the signal line driver circuit of the IC 160d, to which other signal lines are electrically connected, are electrically connected to the timing controller 151b and the reference voltage generating circuit 152b in the region 101b. Thus, a large difference between reference voltages supplied to the two signal line driver circuits is hardly generated. Accordingly, as in the region 101a, a dividing line is hardly recognized by a viewer in the region 101b, so that high display quality can be obtained.

The region 110 between the region 101a and the region 101b includes a signal line SL_2n−1 in the (2n−1)-th column to a signal line SL_2n+2 in the (2n+2)-th column.

The signal line SL_2n−1 in the (2n−1)-th column and a signal line SL_2n+1 in the (2n+1)-th column are each connected to one of the terminals 135c of the terminal group 130c and electrically connected to the signal line driver circuit of the IC 160c.

A signal line SL_2n in the 2n-th column and the signal line SL_2n+2 in the (2n+2)-th column are each connected to one of the terminals 135b of the terminal group 130b and electrically connected to the signal line driver circuit of the IC 160b.

That is, in the region 110, the signal line SL to which an image signal is supplied from the signal line driver circuit electrically connected to the timing controller 151a and the reference voltage generating circuit 152a and the signal line SL to which an image signal is supplied from the signal line driver circuit electrically connected to the timing controller 151b and the reference voltage generating circuit 152b are alternately provided.

FIG. 3B shows a relationship between the signal line and the reference voltage generating circuit to which the signal line is electrically connected through the signal line driver circuit in the display module illustrated in FIG. 3A. In FIG. 3B, "a" means that the signal line is electrically connected to the reference voltage generating circuit 152a, and "b" means that the signal line is electrically connected to the reference voltage generating circuit 152b.

All the signal lines in the region 101a are electrically connected to the reference voltage generating circuit 152a. All the signal lines in the region 101b are electrically connected to the reference voltage generating circuit 152b. The four signal lines in the region 110 are electrically connected to the reference voltage generating circuit 152a and the reference voltage generating circuit 152b alternately. It can be said that, in the region 110, one signal line electrically connected to the reference voltage generating circuit 152a is provided between two signal lines electrically connected to the reference voltage generating circuit 152b.

The pixel in the region 110 that is positioned closest to the region 101a is electrically connected to the signal line driver circuit to which no pixel in the region 101a is electrically connected. Similarly, the pixel in the region 110 that is positioned closest to the region 101b is electrically connected to the signal line driver circuit to which no pixel in the region 101b is electrically connected.

As described above, in the region 110, some signal lines are electrically connected to the signal line driver circuit of the IC 160b and other signal lines are electrically connected to the signal line driver circuit of the IC 160c. Since these two signal line driver circuits are electrically connected to different reference voltage generating circuits, different reference voltages may be supplied to the two signal line driver circuits. Here, in the region 110, the signal lines are electrically connected to the two signal line driver circuits alternately. The reference voltages supplied to the two signal line driver circuits are averaged in the region 110 with such a structure. Therefore, when the same gray level is expressed in the regions, for example, a viewer perceives the display luminance of the region 110 as the luminance between the display luminance of the region 101a and the display luminance of the region 101b. That is, difference in the display luminance generated at each of the boundaries between the regions is less likely to be recognized by the viewer in the case where the region 110 is provided between the region 101*a* and the region 101*b* than in the case where the region 101*a* and the region 101*b* are adjacent to each other. Accordingly, deterioration of the display quality of the display device can be suppressed.

Note that the region 110 preferably includes the central portion of the display portion 101 and the vicinity thereof. In the case where the pixels 115 are arranged in 2n columns (n is an integer greater than or equal to 2), for example, the region 110 preferably includes the signal line SL electrically connected to the pixels 115 in the n-th column. In this way, a dividing line can hardly be recognized in the central portion of the display portion 101, whereby deterioration of the display quality of the display device can be suppressed.

The number of the signal lines SL in the region 110 can be greater than or equal to 2 and less than or equal to 300, or greater than or equal to 4 and less than or equal to 100, for example. As the number of the signal lines SL in the region 110 becomes large, the length of leading some signal lines SL is extended; thus, wiring resistance of those signal lines SL becomes higher than that of the other signal lines SL in some cases. Therefore, the region 110 is preferably provided only in part of the display portion 101.

Here, a display module not including the region 110 is described as a comparative example.

Figure 4:
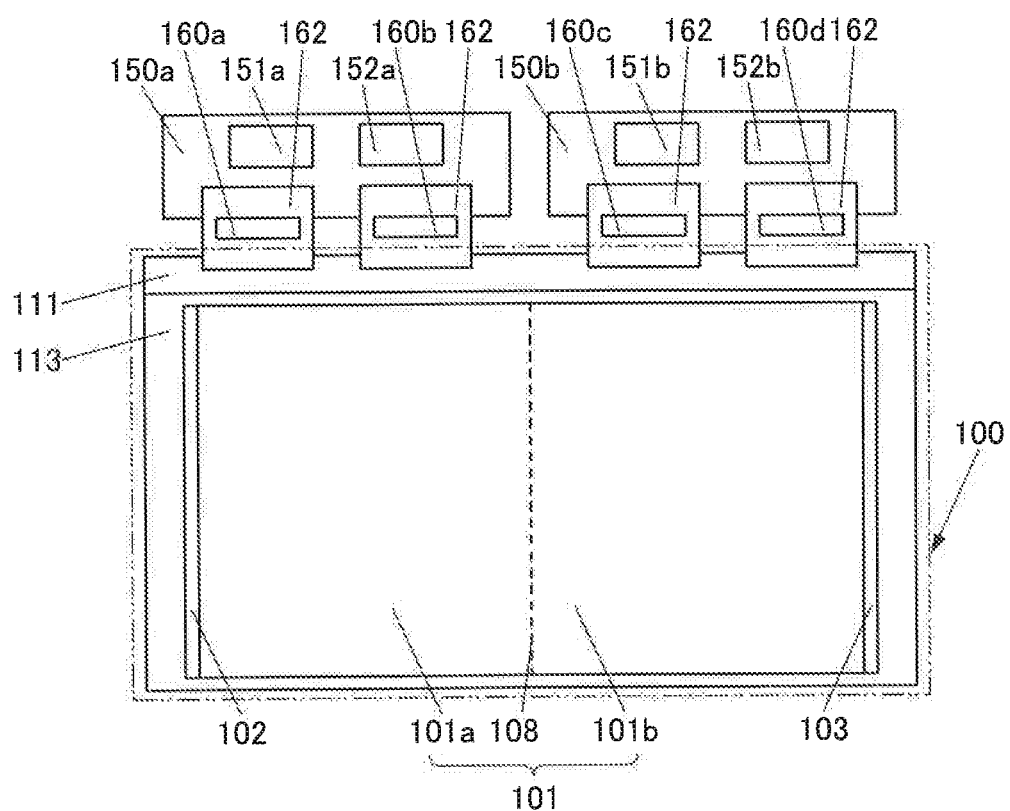
FIG. 4 illustrates a display module.

FIG. 4 is a top view of the display module that is a comparative example. The display module illustrated in FIG. 4 is different from the display module illustrated in FIG. 1 in that the display portion 101 does not include the region 110 and the region 101*a* and the region 101*b* are adjacent to each other.

Figure 5:
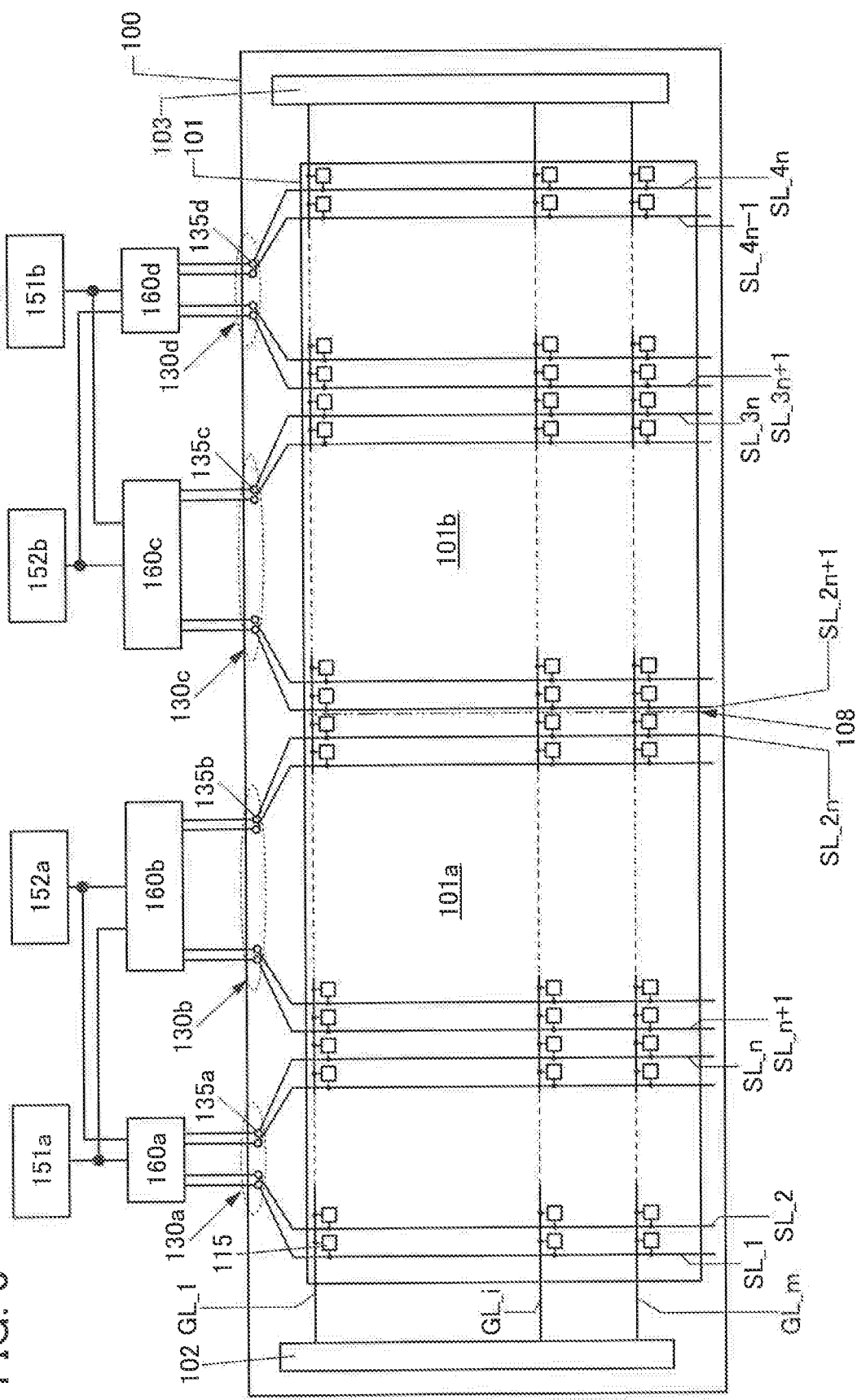
FIG. 5 illustrates a display module.

FIG. 5 is a block diagram of the display module that is a comparative example.

The region 101*a* includes the signal line SL_1 in the first column to the signal line SL_2n in the 2n-th column.

The signal line SL_1 in the first column to the signal line SL_n in the n-th column are each connected to one of the terminals 135*a* of the terminal group 130*a* and electrically connected to the signal line driver circuit of the IC 160*a*.

The signal line SL_n+1 in the (n+1)-th column to the signal line SL_2n in the 2n-th column are each connected to one of the terminals 135*b* of the terminal group 130*b* and electrically connected to the signal line driver circuit of the IC 160*b*.

The ICs 160*a* and 160*b* are electrically connected to the timing controller 151*a* and the reference voltage generating circuit 152*a*.

That is, in the region 101*a*, an image signal is supplied to the signal line SL from the signal line driver circuit electrically connected to the timing controller 151*a* and the reference voltage generating circuit 152*a*.

The region 101*b* includes the signal line SL_2n+1 in the (2n+1)-th column to the signal line SL_4n in the 4n-th column.

The signal line SL_2n+1 in the (2n+1)-th column to the signal line SL_3n in the 3n-th column are each connected to one of the terminals 135*c* of the terminal group 130*c* and electrically connected to the signal line driver circuit of the IC 160*c*.

The signal line SL_3n+1 in the (3n+1)-th column to the signal line SL_4n in the 4n-th column are each connected to one of the terminals 135*d* of the terminal group 130*d* and electrically connected to the signal line driver circuit of the IC 160*d*.

The ICs 160*c* and 160*d* are electrically connected to the timing controller 151*b* and the reference voltage generating circuit 152*b*.

That is, in the region 101*b*, an image signal is supplied to the signal line SL from the signal line driver circuit electrically connected to the timing controller 151*b* and the reference voltage generating circuit 152*b*.

As described above, the signal line driver circuit electrically connected to the signal line and the timing controller and the reference voltage generating circuit that are electrically connected to the signal line driver circuit are different between the region 101*a* and the region 101*b*. Therefore, when the same gray level is expressed in the regions 101*a* and 101*b*, for example, the two regions perform display at different luminances and a viewer perceives a boundary between the two regions as a dividing line 108 (FIG. 4) in some cases.

On the contrary, the display module of one embodiment of the present invention illustrated in FIG. 1, FIG. 2, and FIG. 3A includes the above-described region 110. The provision of the region 110 between the region 101*a* and the region 101*b* can make a dividing line hardly visible. Thus, the display quality of a large display device with high resolution can be improved.

<1-2. Structure Example 2 of Display Module>

A structure example of a display module of one embodiment of the present invention is described with reference to FIG. 6 and FIG. 7. Note that detailed descriptions of components similar to those in the above structure example might be omitted.

Figure 6:
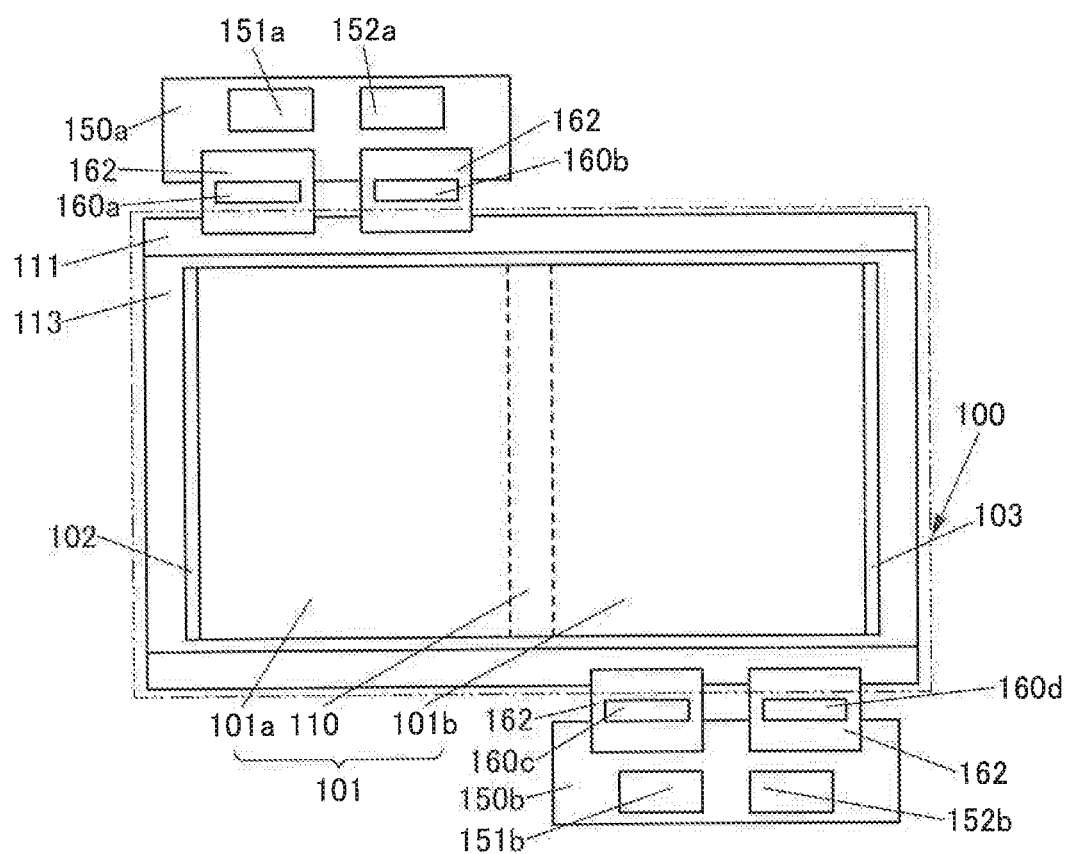
FIG. 6 illustrates a display module.

FIG. 6 is a top view of the display module of one embodiment of the present invention.

The display module illustrated in FIG. 6 is different from the display module illustrated in FIG. 1 in that the printed circuit board is mounted on each of two opposite sides of the display device 100.

Figure 7:
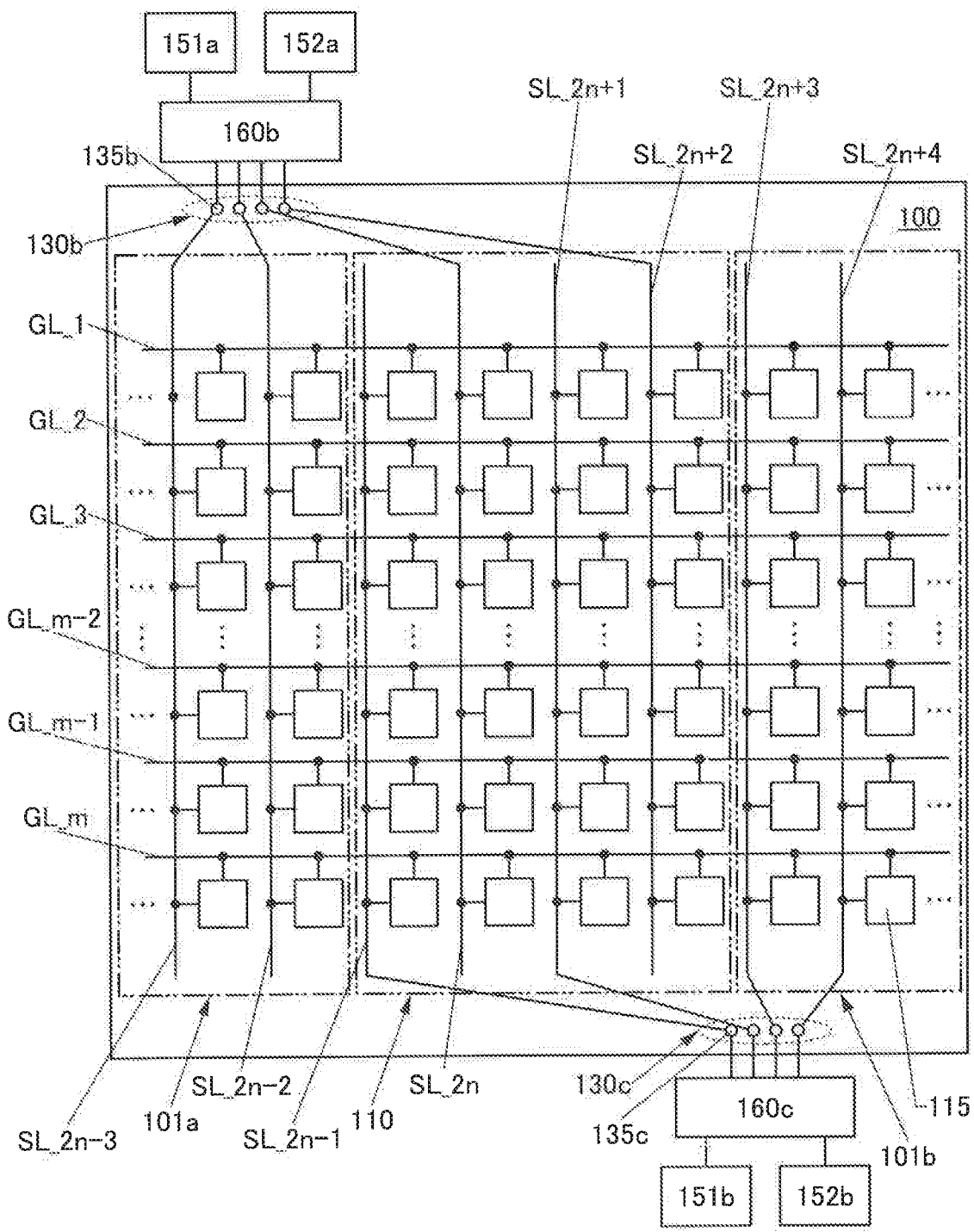
FIG. 7 illustrates a display module.

FIG. 7 is a block diagram illustrating structures of a boundary between the region 101*a* and the region 110, a boundary between the region 110 and the region 101*b*, and the vicinities of the boundaries in the display portion 101 illustrated in FIG. 6 in detail.

A relationship between the signal line and the reference voltage generating circuit to which the signal line is electrically connected through the signal line driver circuit shown in FIG. 7 is similar to that shown in FIG. 3B.

The signal line connected to the terminal group 130*b* and the signal line connected to the terminal group 130*c* intersect with each other in the structure illustrated in FIG. 3A. On the contrary, the signal line connected to the terminal group 130*b* and the signal line connected to the terminal group 130*c* do not intersect with each other in the structure illustrated in FIG. 7. When two signal lines intersect with each other, parasitic capacitance and a load are increased, whereby signal delay may occur. As a result, operation at a high frame frequency may be difficult. Moreover, when two signal lines intersect with each other, electrical noise transmitted from one signal line to the other may affect display. Thus, the area where the signal lines intersect with each other is preferably reduced or even eliminated.

<1-3. Modification Example>

FIGS. 8A to 8E each show a relationship between the signal line and the reference voltage generating circuit to which the signal line is electrically connected through the signal line driver circuit in the display module of one embodiment of the present invention.

FIGS. 8A to 8E each show an example in which 4n signal lines are provided as in the display module illustrated in FIG. 2. That is, it can be said that the central portion of the display portion 101 is between the signal line SL_2n in the 2n-th column and the signal line SL_2n+1 in the (2n+1)-th column.

In FIGS. 8A to 8E, "a" means that the signal line is electrically connected to one of the reference voltage generating circuits (also referred to as a reference voltage generating circuit A), and "b" means that the signal line is electrically connected to the other of the reference voltage generating circuits (also referred to as a reference voltage generating circuit B). The two reference voltage generating circuits may be replaced with the reference voltage generating circuit 152a and the reference voltage generating circuit 152b in FIG. 2, for example.

FIG. 8A shows an example in which the region 110 includes two signal lines SL and FIG. 8B shows an example in which the region 110 includes six signal lines SL. In FIG. 8A, the signal line (also referred to as a signal line B) electrically connected to the reference voltage generating circuit B is provided on the region 101a side, and the signal line (also referred to as a signal line A) electrically connected to the reference voltage generating circuit A is provided on the region 101b side. In FIG. 8B, the signal line A and the signal line B are alternately arranged in the region 110.

FIG. 8C shows an example in which the region 110 includes eight signal lines SL and a pair of signal lines A and a pair of signal lines B are alternately arranged.

FIG. 8D shows an example in which the region 110 includes seven signal lines SL and the signal line A and the signal line B are irregularly arranged.

FIG. 8E shows an example in which the region 110 includes 16 signal lines SL. The number of the signal lines A provided between two signal lines B is changed from three to one stepwise from the region 101a side in the region 110. Similarly, the number of the signal lines B provided between two signal lines A is changed from three to one stepwise from the region 101b side in the region 110.

As described above, the signal lines A and the signal lines B can be arranged in various orders in the region 110.

<1-4. Structure Example 3 of Display Module>

Structure examples of a display module of one embodiment of the present invention are described with reference to FIG. 9, FIGS. 10A and 10B, FIGS. 11A and 11B, and FIGS. 12A and 12B.

Figure 9:
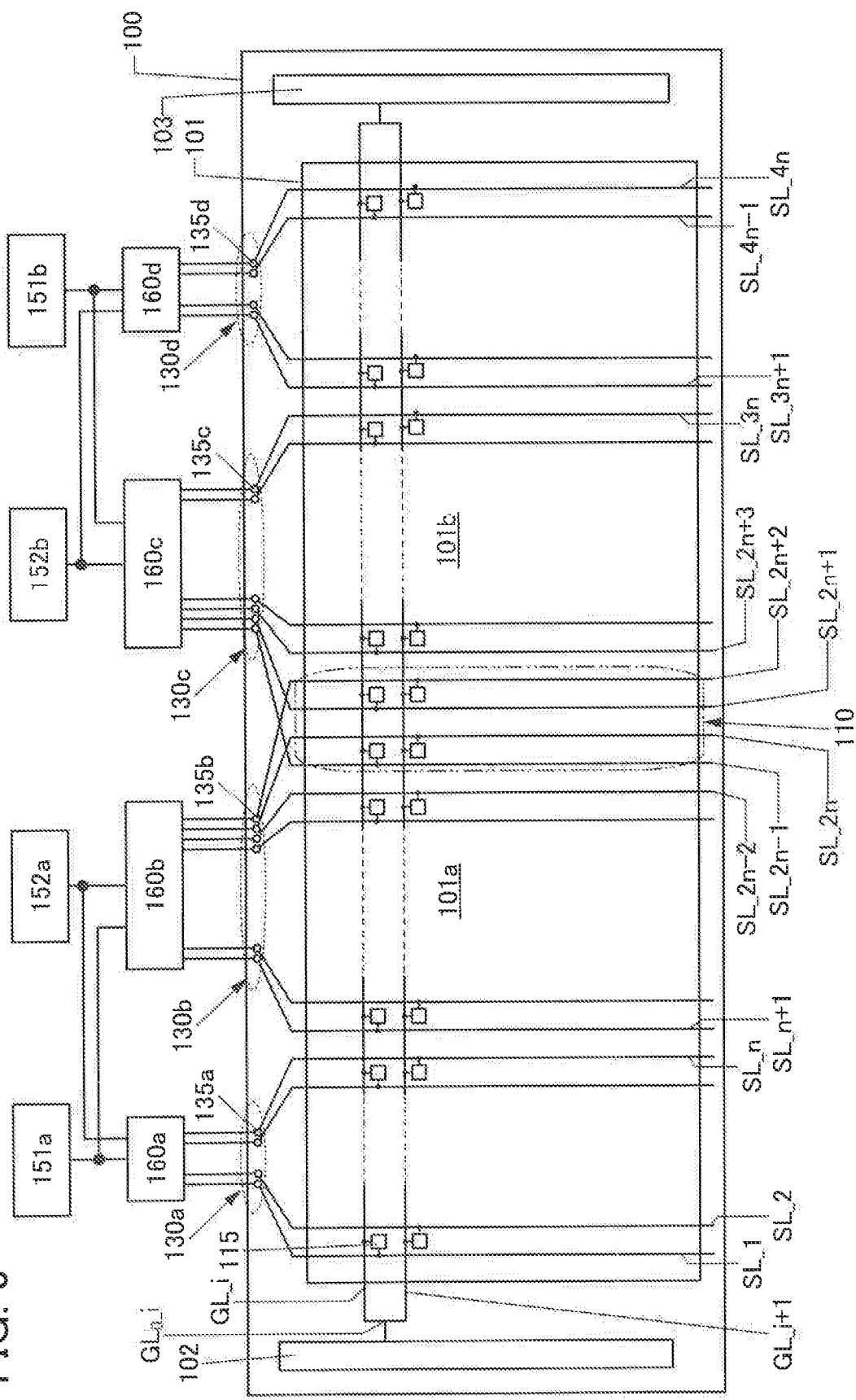
FIG. 9 illustrates a display module.

FIG. 9 is a block diagram of the display module of one embodiment of the present invention.

The display module illustrated in FIG. 9 is different from the display module illustrated in FIG. 2 in that two signal lines SL are provided for the pixels 115 in one column in the display portion 101 and that the pixel 115 electrically connected to one signal line SL and the pixel 115 electrically connected to the other signal line SL are alternately arranged.

The display portion 101 includes the pixels 115 arranged in a matrix of 2m rows and 2n columns (m and n are each an integer greater than or equal to 1), for example. Here, the display device 100 includes m scan lines $GL_O$, 2m scan lines GL, and 4n signal lines SL.

In the display module illustrated in FIG. 9, selection signals are supplied to two scan lines GL simultaneously, whereby two pixels 115 adjacent to each other in the column direction are selected simultaneously. One end of the scan line $GL_O$ is electrically connected to the scan line driver circuit 102 and the other end of the scan line $GL_O$ is electrically connected to the scan line driver circuit 103. A scan line $GL_{O\_i}$ is electrically connected to the scan line GL_i and a scan line GL_i+1, and the scan line GL_i and the scan line GL_i+1 are selected simultaneously.

Since the scan lines GL in two rows can be selected simultaneously, the time for writing an image signal can be longer. Therefore, failing in writing of the image signal can be prevented even when high-speed operation at a high frame frequency is performed. For example, even when the frame frequency is more than or equal to 120 Hz, insufficient writing of the image signal can be prevented.

Alternatively, the frame frequency of the display device of one embodiment of the present invention may be adjustable from 1 Hz to 120 Hz. In the case where a still image is displayed, for example, a low frame frequency enables a reduction in power consumption of the display device. In addition, a high frame frequency enables high visibility of a displayed moving image.

The structure of the display device of one embodiment of the present invention is not limited to the structure in which two signal lines SL are provided for the pixels 115 in one column, and three, four, or five or more signal lines SL may be provided for the pixels 115 in one column.

In FIG. 9, FIGS. 10A and 10B, FIGS. 11A and 11B, and FIGS. 12A and 12B, the signal lines SL electrically connected to the pixels 115 in the j-th column (j is an integer greater than or equal to 1 and less than or equal to 2n) are a signal line SL_2j–1 and a signal line SL_2j.

A connection relationship between the signal lines and the signal line driver circuit is described with reference to FIG. 9 and FIG. 10A. FIG. 10A specifically illustrates structures of a boundary between the region 101a and the region 110, a boundary between the region 110 and the region 101b, and the vicinities of the boundaries in the display portion 101 illustrated in FIG. 9. Each region includes 2m scan lines GL. FIG. 10A illustrates the scan line GL_1 in the first row to a scan line GL_6 in the sixth row.

FIG. 10B shows a relationship between the signal line and the reference voltage generating circuit to which the signal line is electrically connected through the signal line driver circuit in the display module illustrated in FIG. 10A. In FIG. 10B, "a" means that the signal line is electrically connected to the reference voltage generating circuit 152a, and "b" means that the signal line is electrically connected to the reference voltage generating circuit 152b.

The scan line GL_i is a scan line in an odd-numbered row and the scan line GL_i+1 is a scan line in an even-numbered row in FIG. 10B.

The region 101a includes the signal line SL_1 in the first column to a signal line SL_2n–4 in the (2n–4)-th column.

The signal line SL_1 in the first column to the signal line SL_n in the n-th column are each connected to one of the terminals 135a of the terminal group 130a and electrically connected to the signal line driver circuit of the IC 160a.

The signal line SL_n+1 in the (n+1)-th column to the signal line SL_2n–4 in the (2n–4)-th column are each connected to one of the terminals 135b of the terminal group 130b and electrically connected to the signal line driver circuit of the IC 160b.

The ICs 160a and 160b are electrically connected to the timing controller 151a and the reference voltage generating circuit 152a.

That is, in the region 101a, an image signal is supplied to the signal line SL from the signal line driver circuit electrically connected to the timing controller 151a and the reference voltage generating circuit 152a.

The region 101b includes a signal line SL 2n+5 in the (2n+5)-th column to the signal line SL_4n in the 4n-th column.

The signal line SL_2n+5 in the (2n+5)-th column to the signal line SL_3n in the 3n-th column are each connected to one of the terminals 135c of the terminal group 130c and electrically connected to the signal line driver circuit of the IC 160c.

The signal line SL_3n+1 in the (3n+1)-th column to the signal line SL_4n in the 4n-th column are each connected to one of the terminals 135d of the terminal group 130d and electrically connected to the signal line driver circuit of the IC 160d.

The ICs 160c and 160d are electrically connected to the timing controller 151b and the reference voltage generating circuit 152b.

That is, in the region 101b, an image signal is supplied to the signal line SL from the signal line driver circuit electrically connected to the timing controller 151b and the reference voltage generating circuit 152b.

The region 110 between the region 101a and the region 101b includes a signal line SL_2n−3 in the (2n−3)-th column to a signal line SL_2n+4 in the (2n+4)-th column.

The signal line SL_2n−3 in the (2n−3)-th column, the signal line SL_2n−2 in the (2n−2)-th column, the signal line SL_2n+1 in the (2n+1)-th column, and the signal line SL_2n+2 in the (2n+2)-th column are each connected to one of the terminals 135c of the terminal group 130c and electrically connected to the signal line driver circuit of the IC 160c.

The signal line SL_2n−1 in the (2n−1)-th column, the signal line SL_2n in the 2n-th column, the signal line SL_2n+3 in the (2n+3)-th column, and the signal line SL_2n+4 in the (2n+4)-th column are each connected to one of the terminals 135b of the terminal group 130b and electrically connected to the signal line driver circuit of the IC 160b.

That is, in the region 110, a pair of the signal lines SL to each of which an image signal is supplied from the signal line driver circuit electrically connected to the timing controller 151a and the reference voltage generating circuit 152a and a pair of the signal lines SL to each of which an image signal is supplied from the signal line driver circuit electrically connected to the timing controller 151b and the reference voltage generating circuit 152b are alternately provided. Therefore, image signals are supplied from the same signal line driver circuit to the pixel 115 in an odd-numbered row and the pixel 115 in an even-numbered row that are in the same column.

In the region 110, some signal lines are electrically connected to the signal line driver circuit of the IC 160b and other signal lines are electrically connected to the signal line driver circuit of the IC 160c. Since these two signal line driver circuits are electrically connected to different reference voltage generating circuits, different reference voltages may be supplied to the two signal line driver circuits. Here, in the region 110, a pair of signal lines electrically connected to one signal line driver circuit and a pair of signal lines electrically connected to the other signal line driver circuit are alternately provided. The reference voltages supplied to the two signal line driver circuits are averaged in the region 110 with such a structure. Therefore, when the same gray level is expressed in the regions, for example, a viewer perceives the display luminance of the region 110 as the luminance between the display luminance of the region 101a and the display luminance of the region 101b. That is, difference in the display luminance generated at each of the boundaries between the regions is less likely to be recognized by the viewer in the case where the region 110 is provided between the region 101a and the region 101b than in the case where the region 101a and the region 101b are adjacent to each other. Accordingly, deterioration of the display quality of the display device can be suppressed.

Figures 11A, 11B:
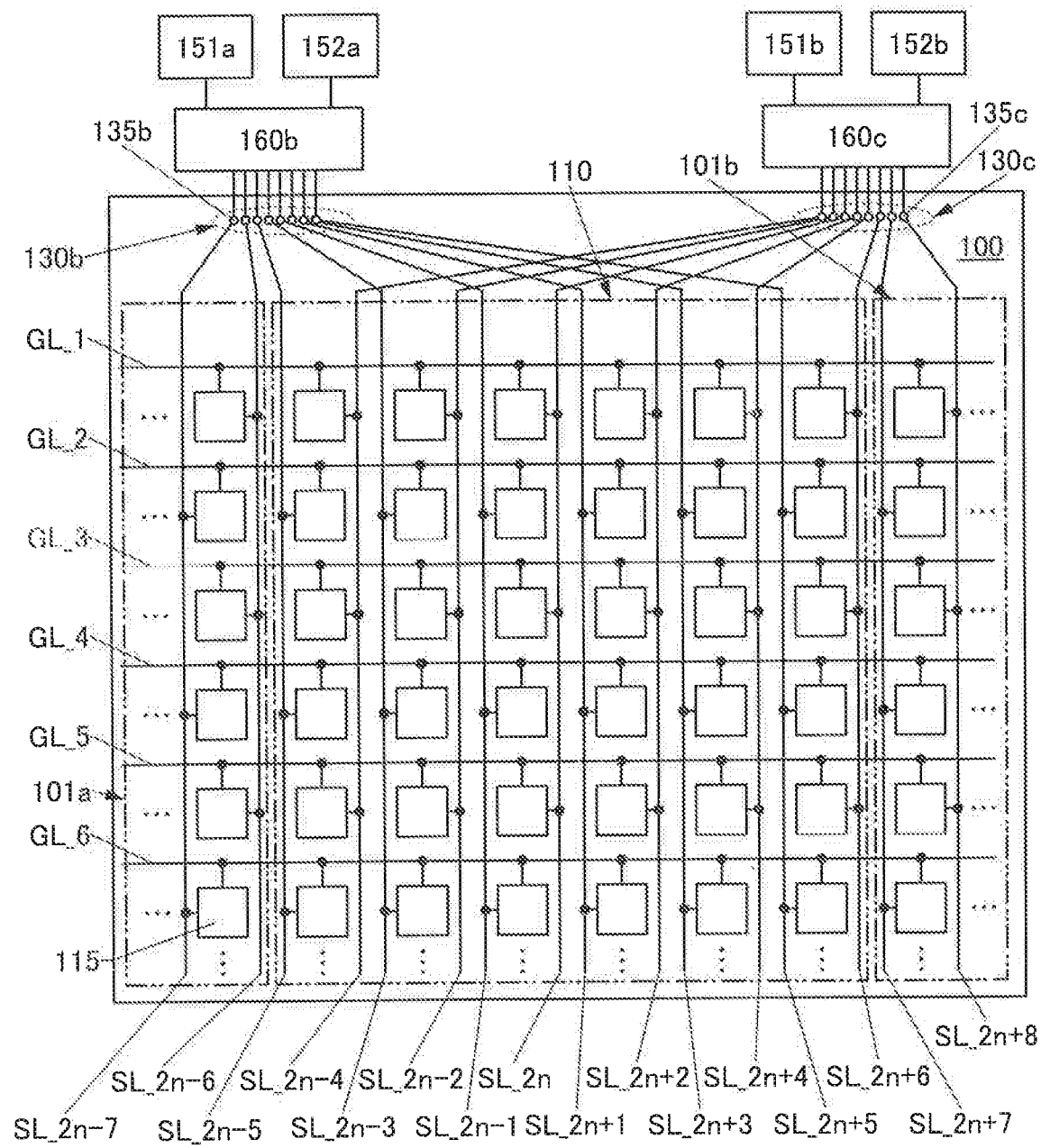
FIGS. 11A and 11B each illustrate a display module.

FIG. 11A illustrates an example of a structure of the region 110 which is different from that in FIG. 9 and FIG. 10A. FIG. 11B shows a relationship between the signal line and the reference voltage generating circuit to which the signal line is electrically connected through the signal line driver circuit in the display module illustrated in FIG. 11A. In FIG. 11B, "a" means that the signal line is electrically connected to the reference voltage generating circuit 152a, and "b" means that the signal line is electrically connected to the reference voltage generating circuit 152b.

The scan line GL_i is a scan line in an odd-numbered row and the scan line GL_i+1 is a scan line in an even-numbered row in FIG. 11B.

The region 110 illustrated in FIG. 11A includes a signal line SL_2n−5 in the (2n−5)-th column to a signal line SL_2n+6 in the (2n+6)-th column.

In the region 110 illustrated in FIG. 11A, the signal line SL to which an image signal is supplied from the signal line driver circuit electrically connected to the timing controller 151a and the reference voltage generating circuit 152a and the signal line SL to which an image signal is supplied from the signal line driver circuit electrically connected to the timing controller 151b and the reference voltage generating circuit 152b are alternately provided.

As illustrated in FIGS. 11A and 11B, the pixels 115 in an odd-numbered row in the region 110 are each electrically connected to the signal line SL to which an image signal is supplied from the signal line driver circuit electrically connected to the timing controller 151b and the reference voltage generating circuit 152b. The pixels 115 in an even-numbered row in the region 110 are each electrically connected to the signal line SL to which an image signal is supplied from the signal line driver circuit electrically connected to the timing controller 151a and the reference voltage generating circuit 152a. That is, when the same gray level is expressed in the regions, display luminance may differ between the region 101a and the region 110 in an odd-numbered row, and display luminance may differ between the region 101b and the region 110 in an even-numbered row. Since the boundary between the column in which the signal line is electrically connected to the reference voltage generating circuit 152a and the column in which the signal line is electrically connected to the reference voltage generating circuit 152b differs from row to row, a dividing line can hardly be recognized by a viewer.

FIG. 12A illustrates a structure of the display portion 101 which is different from that in FIG. 9, FIG. 10A, and FIG. 11A. FIG. 12B shows a relationship between the signal line and the reference voltage generating circuit to which the signal line is electrically connected through the signal line driver circuit in the display module illustrated in FIG. 12A. In FIG. 12B, "a" means that the signal line is electrically connected to the reference voltage generating circuit 152a, and "b" means that the signal line is electrically connected to the reference voltage generating circuit 152b.

The scan line GL_i is a scan line in an odd-numbered row and the scan line GL_i+1 is a scan line in an even-numbered row in FIG. 12B.

The region 110 illustrated in FIG. 12A includes the signal line SL_2n−5 in the (2n−5)-th column to the signal line SL_2n+6 in the (2n+6)-th column.

The signal line to which the pixels in an odd-numbered row are electrically connected and the signal line to which the pixels in an even-numbered row are electrically connected are alternately provided in the display portion 101 illustrated in FIG. 10A and FIG. 11A. In the display portion 101 illustrated in FIG. 12A, a pair of the signal lines to each of which the pixels in an odd-numbered row are electrically connected and a pair of the signal lines to each of which the pixels in an even-numbered row are electrically connected are alternately provided.

In the region 110 illustrated in FIG. 12A, the signal line SL to which an image signal is supplied from the signal line driver circuit electrically connected to the timing controller 151a and the reference voltage generating circuit 152a and the signal line SL to which an image signal is supplied from the signal line driver circuit electrically connected to the timing controller 151b and the reference voltage generating circuit 152b are alternately provided.

As illustrated in FIGS. 12A and 12B, the order of electrical connection of the pixel 115 to the reference voltage generating circuit 152a and electrical connection of the pixel 115 to the reference voltage generating circuit 152b is different between an odd-numbered row and an even-numbered row in the region 110. That is, one pixel in the region 110 is electrically connected to the signal line driver circuit different from the signal line driver circuits to which the left, right, top, and bottom pixels adjacent to the one pixel are electrically connected. Also with such a structure, a dividing line can hardly be recognized by a viewer.

<1-5. Structure Example 4 of Display Module>

A structure example of a display module of one embodiment of the present invention is described with reference to FIGS. 13 to 15.

Figure 13:
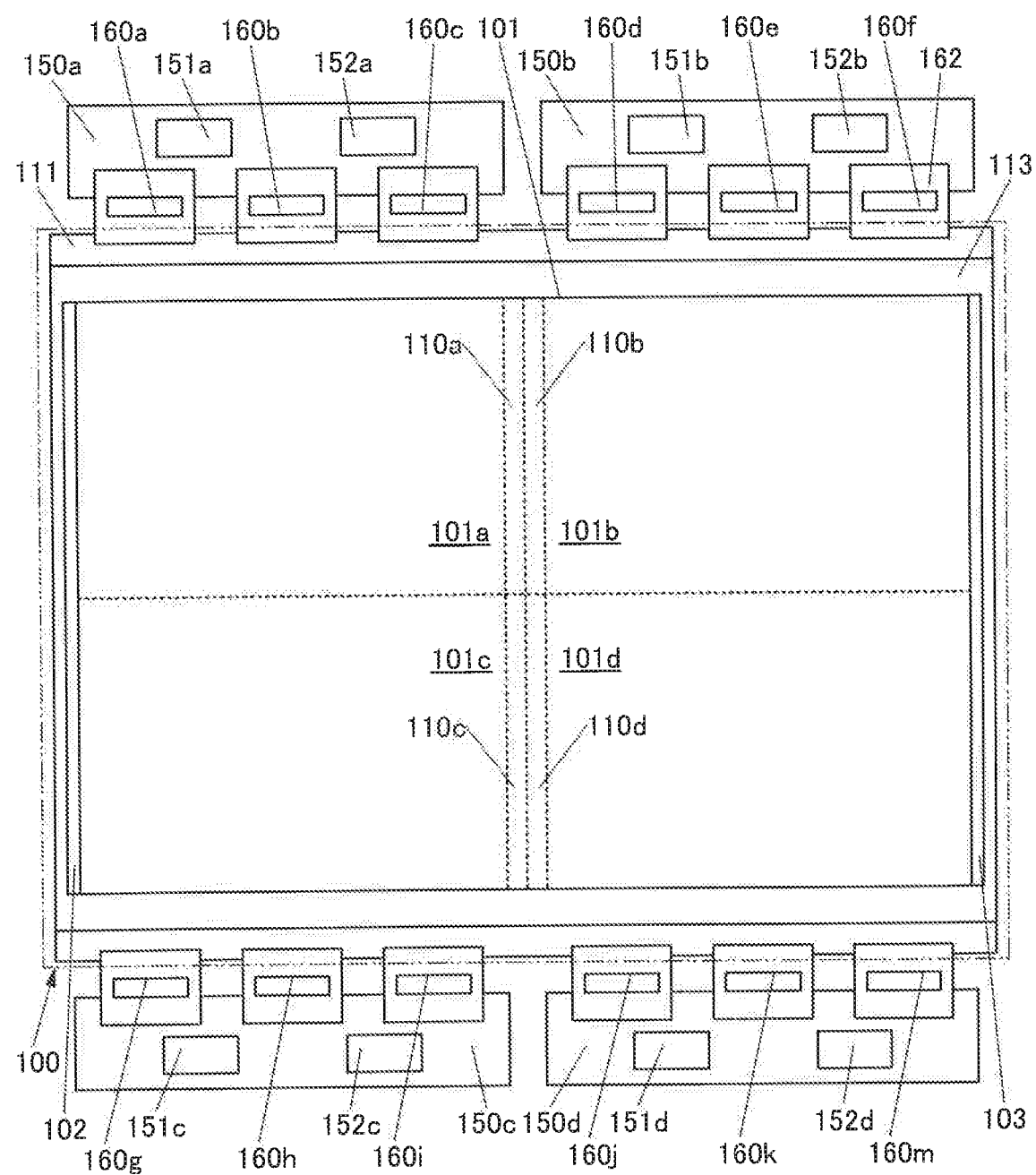
FIG. 13 illustrates a display module.

FIG. 13 is a top view of the display module of one embodiment of the present invention.

The display module illustrated in FIG. 13 includes the display device 100. The display device 100 includes the display portion 101, the scan line driver circuit 102, and the scan line driver circuit 103 in the region sealed with the first substrate 111 and the second substrate 113. The display portion 101 includes the region 101a, the region 101b, a region 101c, a region 101d, a region 110a, a region 110b, a region 110c, and a region 110d. These regions are electrically connected to different combinations of the scan line driver circuit and the signal line driver circuit.

In a region different from the region sealed with the first substrate 111 and the second substrate 113, 12 FPCs 162 are connected to the first substrate 111. An IC is connected to each FPC 162 by a COF method. The ICs each include a signal line driver circuit.

The display module illustrated in FIG. 13 includes four printed circuit boards. Three FPCs 162 are connected to each printed circuit board, and each printed circuit board is connected to the first substrate 111 through the FPCs 162.

FIG. 13 illustrates an example in which two printed circuit board are connected to each of two opposite sides of the display device 100.

A structure of each of the printed circuit boards is similar to that of the printed circuit board illustrated in FIG. 1. Specifically, one timing controller and one reference voltage generating circuit are provided over each of the printed circuit boards.

Figure 14:
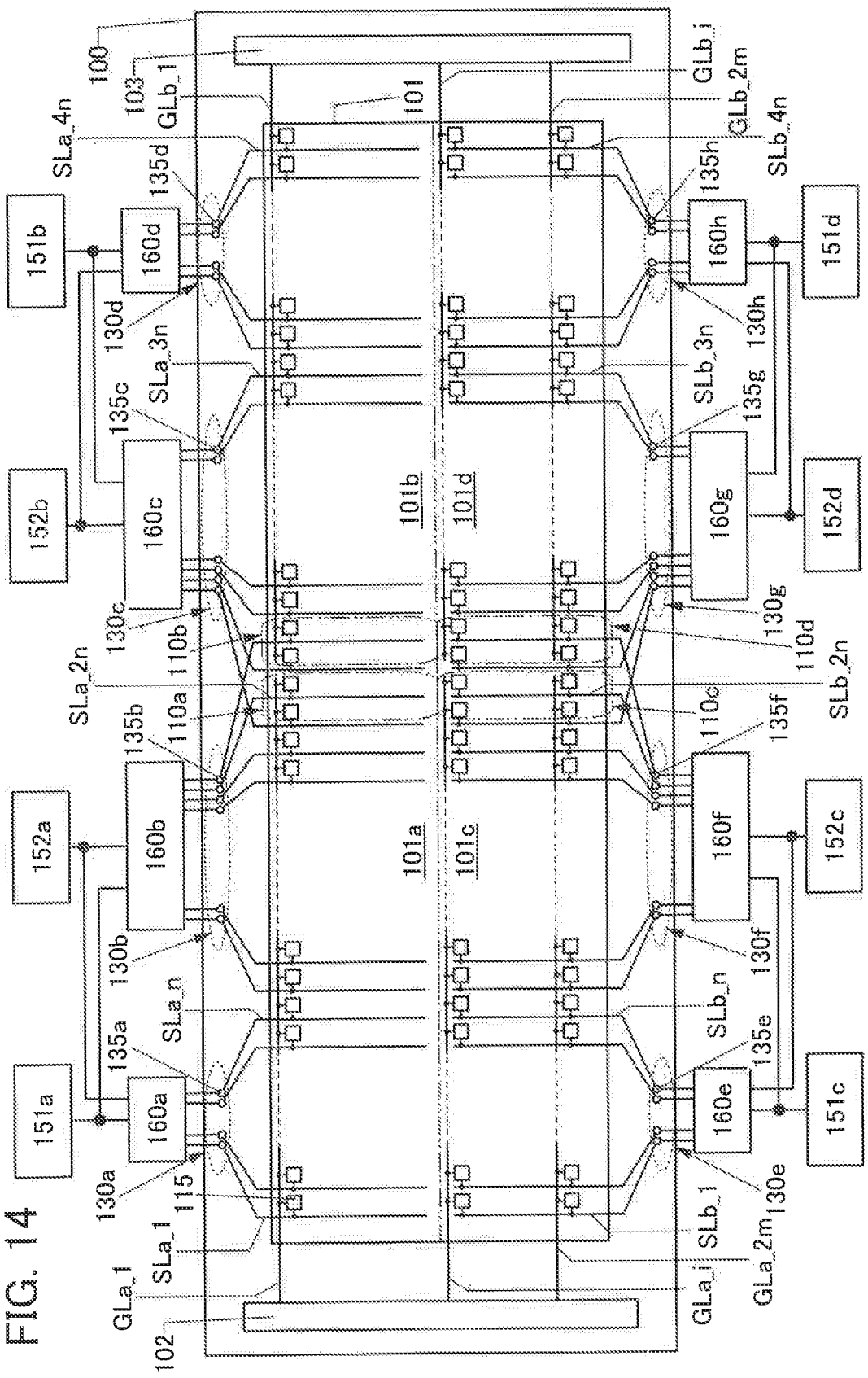
FIG. 14 illustrates a display module.
Figure 15:
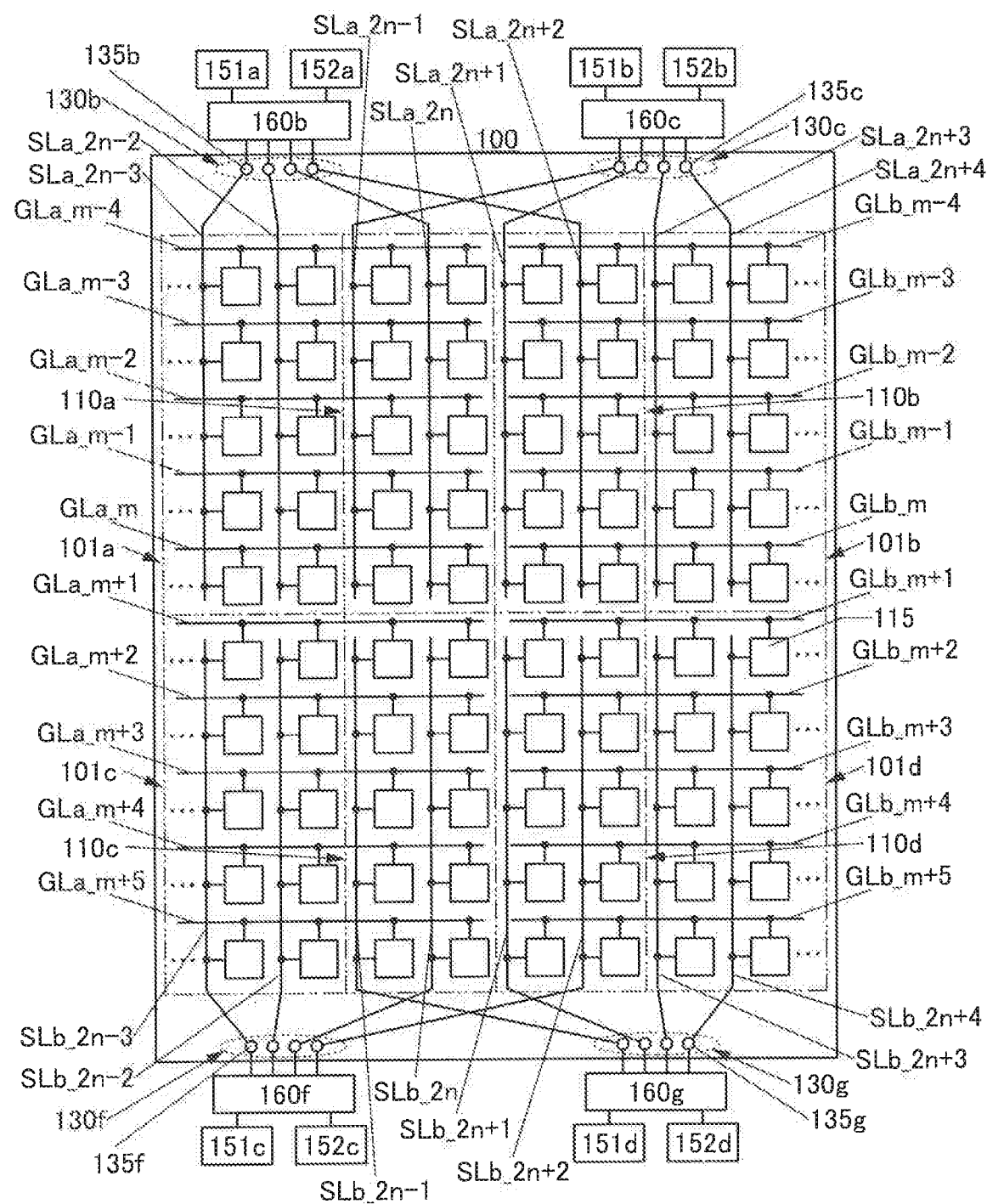
FIG. 15 illustrates a display module.

FIG. 14 is a block diagram of the display module of one embodiment of the present invention.

The display portion 101 includes the pixels 115 as illustrated in FIG. 14. FIG. 14 illustrates an example in which the display portion 101 includes the pixels 115 arranged in a matrix of 2m rows and 4n columns (m and n are each an integer greater than or equal to 1).

The display device 100 includes 2m scan lines GLa and 2m scan lines GLb. The 2m scan lines GLa and the 2m scan lines GLb each extend in the row direction. The 2m scan lines GLa are electrically connected to the pixels 115 in the first to 2n-th columns that are arranged in the row direction in the display portion 101. The 2m scan lines GLb are electrically connected to the pixels 115 in the (2n+1)-th to 4n-th columns that are arranged in the row direction in the display portion 101.

One end of the scan line GLa is electrically connected to the scan line driver circuit 102 and one end of the scan line GLb is electrically connected to the scan line driver circuit 103.

The scan line driver circuits 102 and 103 have a function of supplying selection signals to the scan line GLa and the scan line GLb, respectively. The scan lines GLa and GLb each have a function of transmitting the selection signal supplied from the scan line driver circuit 102 or 103 to the pixel 115.

The display device 100 includes 4n signal lines SLa and 4n signal lines SLb. The 4n signal lines SLa and the 4n signal lines SLb each extend in the column direction. The 4n signal lines SLa are electrically connected to the pixels 115 in the first to m-th rows that are arranged in the column direction in the display portion 101. The 4n signal lines SLb are electrically connected to the pixels 115 in the (m+1)-th to 2m-th rows that are arranged in the column direction in the display portion 101.

The signal line SLa and the signal line SLb are each electrically connected to the signal line driver circuit. The signal line driver circuit has a function of supplying an image signal to the signal line SLa or the signal line SLb. The signal line SLa and the signal line SLb each have a function of transmitting, to the pixel 115, the image signal supplied from the signal line driver circuit.

The display device 100 includes eight terminal groups (terminal groups 130a to 130h) and the terminal groups each include terminals (the terminal group 130a includes terminals 135a, for example). The eight terminal groups are apart from each other and connected to different ICs. The terminals of the same terminal group are electrically connected to the same IC (in other words, the same signal line driver circuit). One terminal is connected to one signal line SLa or one signal line SLb. That is, signal lines connected to the terminals of the same terminal group are electrically connected to the same IC (the same signal line driver circuit).

A connection relationship between the signal lines and the signal line driver circuit is described with reference to FIG. 14 and FIG. 15. FIG. 15 specifically illustrates structures of boundaries between the eight regions and the vicinities of the boundaries in the display portion 101 illustrated in FIG. 14. Each region includes m scan lines GLa or m scan lines GLb. FIG. 15 illustrates a scan line in the (m−4)-th row to a scan line in the (m+5)-th row.

The region 101a includes a scan line GLa_1 in the first row to a scan line GLa_m in the m-th row. The region 101a includes a signal line SLa_1 in the first column to a signal line SLa_2n−2 in the (2n−2)-th column.

The signal line SLa_1 in the first column to a signal line SLa_n in the n-th column are each connected to one of the terminals 135a of the terminal group 130a and electrically connected to the signal line driver circuit of the IC 160a.

A signal line SLa_n+1 in the (n+1)-th column to the signal line SL_2n−2 in the (2n−2)-th column are each connected to one of the terminals 135b of the terminal group 130b and electrically connected to the signal line driver circuit of the IC 160b.

The ICs 160a and 160b are electrically connected to the timing controller 151a and the reference voltage generating circuit 152a.

That is, in the region 101a, an image signal is supplied to the signal line SLa from the signal line driver circuit electrically connected to the timing controller 151a and the reference voltage generating circuit 152a.

The region 101b includes a scan line GLb_1 in the first row to a scan line GLb_m in the m-th row. The region 101b includes a signal line SLa_2n+3 in the (2n+3)-th column to a signal line SLa_4n in the 4n-th column.

The signal line SLa_2n+3 in the (2n+3)-th column to a signal line SLa_3n in the 3n-th column are each connected to one of the terminals 135c of the terminal group 130c and electrically connected to the signal line driver circuit of the IC 160c.

A signal line SLa_3n+1 in the (3n+1)-th column to the signal line SLa_4n in the 4n-th column are each connected to one of the terminals 135d of the terminal group 130d and electrically connected to the signal line driver circuit of the IC 160d.

The ICs 160c and 160d are electrically connected to the timing controller 151b and the reference voltage generating circuit 152b.

That is, in the region 101b, an image signal is supplied to the signal line SLa from the signal line driver circuit electrically connected to the timing controller 151b and the reference voltage generating circuit 152b.

The region 101c includes a scan line GLa_m+1 in the (m+1)-th row to a scan line GLa_2m in the 2m-th row. The region 101c includes a signal line SLb_1 in the first column to a signal line SLb_2n−2 in the (2n−2)-th column.

The signal line SLb_1 in the first column to a signal line SLb_n in the n-th column are each connected to one of the terminals 135e of the terminal group 130e and electrically connected to the signal line driver circuit of the IC 160e.

A signal line SLb_n+1 in the (n+1)-th column to the signal line SLb_2n−2 in the (2n−2)-th column are each connected to one of the terminals 135f of the terminal group 130f and electrically connected to the signal line driver circuit of the IC 160f.

The ICs 160e and 160f are electrically connected to the timing controller 151c and the reference voltage generating circuit 152c.

That is, in the region 101c, an image signal is supplied to the signal line SLb from the signal line driver circuit electrically connected to the timing controller 151c and the reference voltage generating circuit 152c.

The region 101d includes a scan line GLb_m+1 in the (m+1)-th row to a scan line GLb_2m in the 2m-th row. The region 101d includes a signal line SLb_2n+3 in the (2n+3)-th column to a signal line SLb_4n in the 4n-th column.

The signal line SLb_2n+3 in the (2n+3)-th column to a signal line SLb_3n in the 3n-th column are each connected to one of the terminals 135g of the terminal group 130g and electrically connected to the signal line driver circuit of the IC 160g.

A signal line SL_3n+1 in the (3n+1)-th column to the signal line SLb_4n in the 4n-th column are each connected to one of the terminals 135h of the terminal group 130h and electrically connected to the signal line driver circuit of the IC 160h.

The ICs 160g and 160h are electrically connected to the timing controller 151d and the reference voltage generating circuit 152d.

That is, in the region 101d, an image signal is supplied to the signal line SLb from the signal line driver circuit electrically connected to the timing controller 151d and the reference voltage generating circuit 152d.

The region 110a between the region 101a and the region 101b includes a signal line SLa_2n−1 in the (2n−1)-th column and a signal line SLa_2n in the 2n-th column. The region 110a includes the scan line GLa_1 in the first row to the scan line GLa_m in the m-th row.

The region 110b between the region 101a and the region 101b includes a signal line SLa_2n+1 in the (2n+1)-th column and a signal line SLa_2n+2 in the (2n+2)-th column. The region 110b includes the scan line GLb_1 in the first row to the scan line GLb_m in the m-th row.

That is, the region 110a and the region 110b are regions where the signal line SLa to which an image signal is supplied from the signal line driver circuit electrically connected to the timing controller 151a and the reference voltage generating circuit 152a and the signal line SLa to which an image signal is supplied from the signal line driver circuit electrically connected to the timing controller 151b and the reference voltage generating circuit 152b are alternately provided.

The region 110c between the region 101c and the region 101d includes a signal line SLb_2n−1 in the (2n−1)-th column and a signal line SLb_2n in the 2n-th column. The region 110c includes the scan line GLa_m+1 in the (m+1)-th row to the scan line GLa 2m in the 2m-th row.

The region 110d between the region 101c and the region 101d includes a signal line SLb_2n+1 in the (2n+1)-th column and a signal line SLb_2n+2 in the (2n+2)-th column. The region 110d includes the scan line GLb_m+1 in the (m+1)-th row to the scan line GLb_2m in the 2m-th row.

The region 110c and the region 110d are regions where the signal line SLb to which an image signal is supplied from the signal line driver circuit electrically connected to the timing controller 151c and the reference voltage generating circuit 152c and the signal line SLb to which an image signal is supplied from the signal line driver circuit electrically connected to the timing controller 151d and the reference voltage generating circuit 152d are alternately provided.

In the regions 110a, 110b, 110c, and 110d, the reference voltages supplied to two signal line driver circuits are averaged. Therefore, when the same gray level is expressed, for example, a viewer perceives the display luminance of the regions 110a and 110b as the luminance between the display luminance of the region 101a and the display luminance of the region 101b. That is, difference in the display luminance generated at each of the boundaries between the regions is less likely to be recognized by the viewer in the case where the regions 110a and 110b are provided between the region 101a and the region 101b than in the case where the region 101a and the region 101b are adjacent to each other. The same can also apply to the regions 110c and 110d. With such a structure, deterioration of the display quality of the display device can be suppressed.

<1-6. Structure Example of Pixel>

Then, structure examples of a pixel 120 are described with reference to FIGS. 16A to 16E.

The pixel 120 includes the pixels 115. The pixels 115 each function as a subpixel. The pixel 120 is formed of the pixels 115 exhibiting different colors, and thus full-color display can be achieved in a display portion.

Figure 16A:
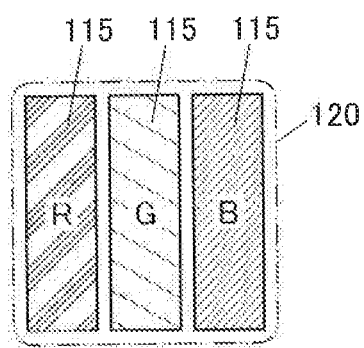
FIGS. 16A to 16E each illustrate a structure example of a pixel.
Figure 16B:
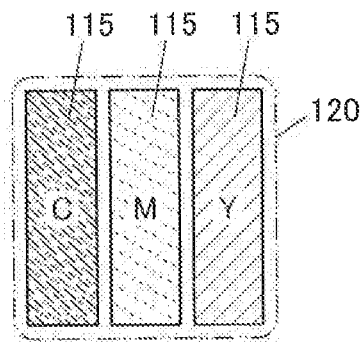

The pixels 120 illustrated in FIGS. 16A and 16B each include three subpixels. The combination of colors exhibited by the pixels 115 of the pixel 120 illustrated in FIG. 16A is red (R), green (G), and blue (B). The combination of colors exhibited by the pixels 115 of the pixel 120 illustrated in FIG. 16B is cyan (C), magenta (M), and yellow (Y).

Figure 16C:
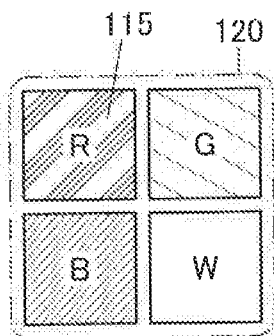
Figure 16D:
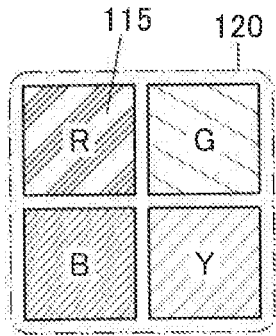
Figure 16E:
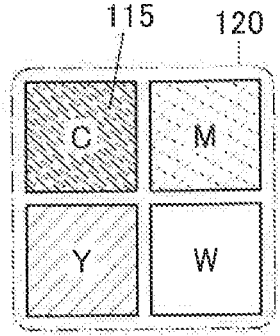

The pixels 120 illustrated in FIGS. 16C to 16E each include four subpixels. The combination of colors exhibited by the pixels 115 of the pixel 120 illustrated in FIG. 16C is red (R), green (G), blue (B), and white (W). The use of the subpixel that exhibits white can increase the luminance of the display region. The combination of colors exhibited by the pixels 115 of the pixel 120 illustrated in FIG. 16D is red (R), green (G), blue (B), and yellow (Y). The combination of colors exhibited by the pixels 115 of the pixel 120 illustrated in FIG. 16E is cyan (C), magenta (M), yellow (Y), and white (W).

When subpixels that exhibit red, green, blue, cyan, magenta, yellow, and the like are combined as appropriate with more subpixels functioning as one pixel, the reproducibility of halftones can be increased. Thus, the display quality can be improved.

The display device of one embodiment of the present invention can reproduce the color gamut of various standards. For example, the display device of one embodiment of the present invention can reproduce the color gamut of the following standards: the Phase Alternating Line (PAL) or National Television System Committee (NTSC) standard used for TV broadcasting; the standard RGB (sRGB) or Adobe RGB standard used widely for display devices in electronic devices such as personal computers, digital cameras, and printers; the International Telecommunication Union Radiocommunication Sector Broadcasting Service (Television) 709 (ITU-R BT.709) standard used for high-definition televisions (HDTV, also referred to Hi-Vision); the Digital Cinema Initiatives P3 (DCI-P3) standard used for digital cinema projection; and the ITU-R BT.2020 Recommendation 2020 (REC.2020) standard used for ultra-high-definition televisions (UHDTV, also referred to as Super Hi-Vision televisions); and the like.

Using the pixels 120 arranged in a 1920×1080 matrix, the display device can display a full-color image with "full high definition" (also referred to as "2K resolution," "2K1K," "2K," and the like). Moreover, for example, using the pixels 120 arranged in a 3840×2160 matrix, the display device can display a full-color image with "ultra high definition" (also referred to as "4K resolution," "4K2K," "4K," and the like). Furthermore, for example, using the pixels 120 arranged in a 7680×4320 matrix, the display device can display a full-color image with "super high definition" (also referred to as "8K resolution," "8K4K," "8K," and the like). Using a larger number of the pixels 120, the display device can display a full-color image with 16K or 32K resolution.

<1-7. Configuration Example of Pixel Circuit>

Examples of a display element included in the display device of one embodiment of the present invention include a light-emitting element such as an inorganic EL element, an organic EL element, or an LED, a liquid crystal element, an electrophoretic element, and a display element using micro electro mechanical systems (MEMS).

A configuration example of a pixel circuit including a light-emitting element is described below with reference to FIG. 17A. In addition, a configuration example of a pixel circuit including a liquid crystal element is described with reference to FIG. 17B.

Figure 17A:
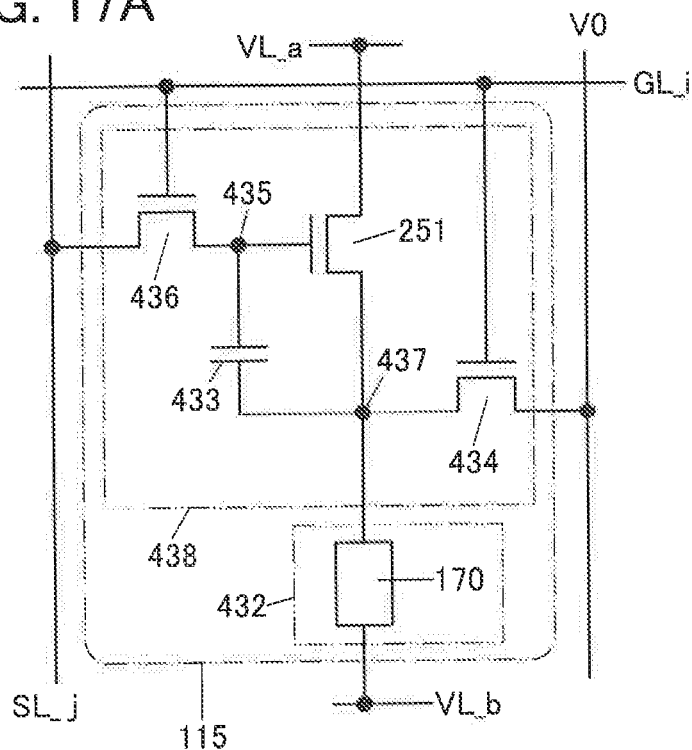
FIGS. 17A and 17B each illustrate a configuration example of a pixel circuit.

A pixel circuit 438 illustrated in FIG. 17A includes a transistor 436, a capacitor 433, a transistor 251, and a transistor 434. The pixel circuit 438 is electrically connected to a light-emitting element 170 that can function as a display element 432.

One of a source electrode and a drain electrode of the transistor 436 is electrically connected to the signal line SL_j to which an image signal is supplied. A gate electrode of the transistor 436 is electrically connected to the scan line GL_i to which a selection signal is supplied.

The transistor 436 has a function of controlling whether to write an image signal to a node 435.

One of a pair of electrodes of the capacitor 433 is electrically connected to the node 435, and the other of the pair of electrodes of the capacitor 433 is electrically connected to a node 437. The other of the source electrode and the drain electrode of the transistor 436 is electrically connected to the node 435.

The capacitor 433 functions as a storage capacitor for storing data written to the node 435.

One of a source electrode and a drain electrode of the transistor 251 is electrically connected to a potential supply line VL_a, and the other of the source electrode and the drain electrode of the transistor 251 is electrically connected to the node 437. A gate electrode of the transistor 251 is electrically connected to the node 435.

One of a source electrode and a drain electrode of the transistor 434 is electrically connected to a potential supply line V0, and the other of the source electrode and the drain electrode of the transistor 434 is electrically connected to the node 437. A gate electrode of the transistor 434 is electrically connected to the scan line GL_i.

One of an anode and a cathode of the light-emitting element 170 is electrically connected to a potential supply line VL_b, and the other is electrically connected to the node 437.

As a power supply potential, a potential on the relatively high potential side or a potential on the relatively low potential side can be used, for example. A power supply potential on the high potential side is referred to as a high power supply potential (also referred to as VDD), and a power supply potential on the low potential side is referred to as a low power supply potential (also referred to as VSS). A ground potential can be used as the high power supply potential or the low power supply potential. For example, in the case where a ground potential is used as the high power supply potential, the low power supply potential is a potential lower than the ground potential, and in the case where a ground potential is used as the low power supply potential, the high power supply potential is a potential higher than the ground potential.

A high power supply potential VDD is supplied to one of the potential supply line VL_a and the potential supply line VL_b, and a low power supply potential VSS is supplied to the other, for example.

In the display device including the pixel circuit 438 in FIG. 17A, the pixel circuits 438 are sequentially selected row by row by the scan line driver circuit 102 and/or the scan line driver circuit 103, whereby the transistors 436 and the transistors 434 are turned on and an image signal is written to the nodes 435.

When the transistors 436 and the transistors 434 are turned off, the pixel circuits 438 in which the data has been written to the nodes 435 are brought into a holding state. Furthermore, the amount of current flowing between the source electrode and the drain electrode of the transistor 251 is controlled in accordance with the potential of the data written to the node 435. The light-emitting element 170 emits light with a luminance corresponding to the amount of current flow. This operation is sequentially performed row by row; thus, an image can be displayed.

Figure 17B:
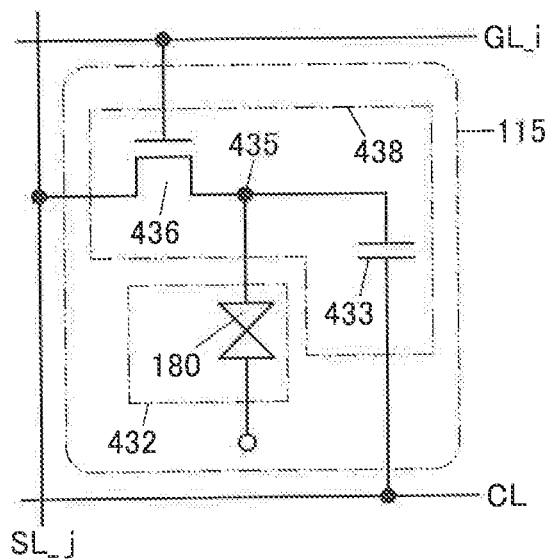

The pixel circuit 438 in FIG. 17B includes the transistor 436 and the capacitor 433. The pixel circuit 438 is electrically connected to a liquid crystal element 180 functioning as the display element 432.

The potential of one of a pair of electrodes of the liquid crystal element 180 is set in accordance with the specifications of the pixel circuit 438 as appropriate. The alignment state of the liquid crystal element 180 depends on data written to the node 435. A common potential may be applied to one of the pair of electrodes of the liquid crystal element 180 included in each of the pixel circuits 438. The potential applied to one of the pair of electrodes of the liquid crystal element 180 in the pixel circuit 438 may differ between rows.

In the pixel circuit 438 in the i-th row and the j-th column, one of the source electrode and the drain electrode of the transistor 436 is electrically connected to the signal line SL_j, and the other of the source electrode and the drain electrode of the transistor 436 is electrically connected to the node 435. The gate electrode of the transistor 436 is electrically connected to the scan line GL_i. The transistor 436 has a function of controlling whether to write an image signal to the node 435.

One of the pair of electrodes of the capacitor 433 is electrically connected to a wiring to which a specific potential is supplied (hereinafter, referred to as a capacitor line CL), and the other of the pair of electrodes of the capacitor 433 is electrically connected to the node 435. The other of the pair of electrodes of the liquid crystal element 180 is electrically connected to the node 435. The potential of the capacitor line CL is set in accordance with the specifications of the pixel circuit 438 as appropriate. The capacitor 433 functions as a storage capacitor for storing data written to the node 435.

In the display device including the pixel circuit 438 in FIG. 17B, the pixel circuits 438 are sequentially selected row by row by the scan line driver circuit 102 and/or the scan line driver circuit 103, whereby the transistors 436 are turned on and an image signal is written to the nodes 435. When the transistors 436 are turned off, the pixel circuits 438 in which the image signal has been written to the nodes 435 are brought into a holding state. This operation is sequentially performed row by row; thus, an image can be displayed on the display portion 101.

<1-8. Structure Example of Display Device>

Next, structure examples of the display device are described with reference to FIGS. 18 to 21.

Figure 18:
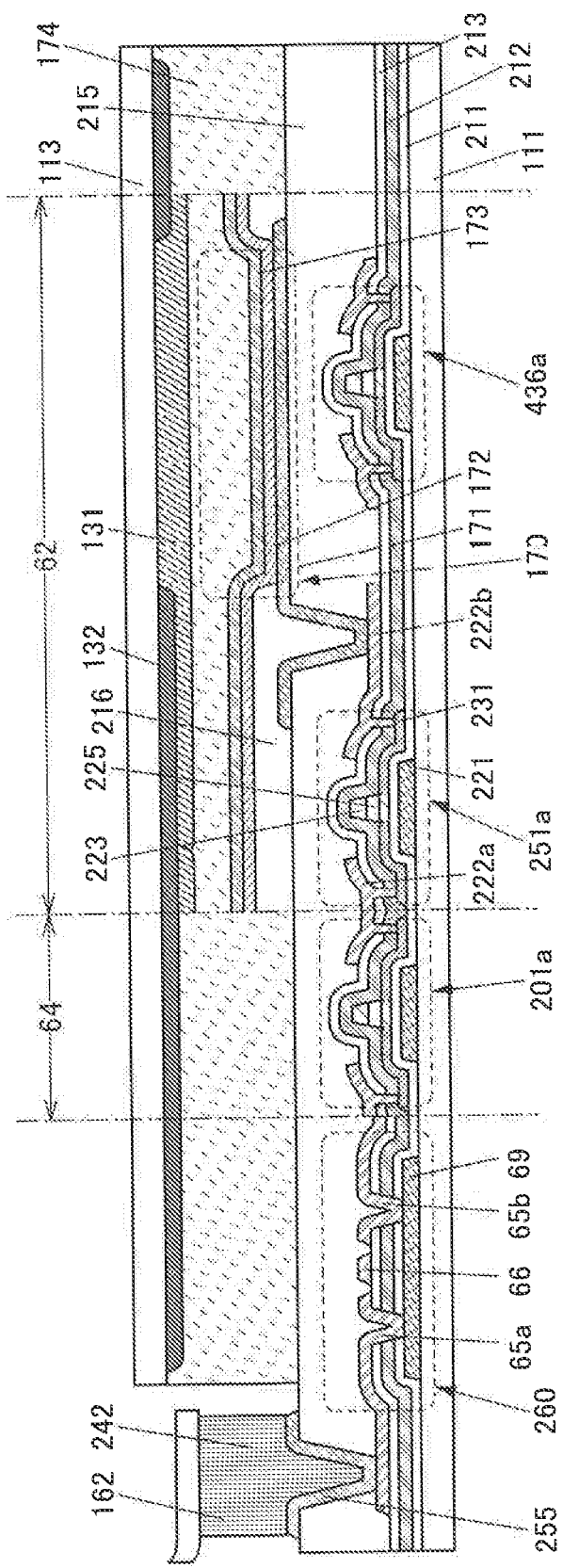
FIG. 18 illustrates a structure example of a display device.

FIG. 18 is a cross-sectional view of a light-emitting display device employing a color filter method and having a top-emission structure.

The display device illustrated in FIG. 18 includes a display portion 62 and a scan line driver circuit 64.

A transistor 251a, a transistor 436a, the light-emitting element 170, and the like are provided over the first substrate 111 in the display portion 62. A transistor 201a and the like are provided over the first substrate 111 in the scan line driver circuit 64.

The transistor 251a includes a conductive layer 221 functioning as a first gate electrode, an insulating layer 211 functioning as a first gate insulating layer, a semiconductor layer 231, a conductive layer 222a and a conductive layer 222b functioning as a source electrode and a drain electrode, a conductive layer 223 functioning as a second gate electrode, and an insulating layer 225 functioning as a second gate insulating layer. The semiconductor layer 231 includes a channel region and a low-resistance region. The channel region overlaps with the conductive layer 223 with the insulating layer 225 positioned therebetween. The low-resistance region includes a region connected to the conductive layer 222a and a region connected to the conductive layer 222b.

The transistor 251a includes the gate electrodes above and below the channel. It is preferable that the two gate electrodes be electrically connected to each other. A transistor with two gate electrodes that are electrically connected to each other can have a higher field-effect mobility and thus have higher on-state current than other transistors. Consequently, a circuit capable of high-speed operation can be obtained. Furthermore, the area occupied by a circuit portion can be reduced. The use of the transistor having a high on-state current can reduce signal delay in wirings and can suppress display unevenness even in a display device in which the number of wirings is increased because of an increase in size or resolution. In addition, the area occupied by a circuit portion can be reduced, whereby the bezel of the display device can be narrowed. Moreover, with such a structure, a highly reliable transistor can be formed.

An insulating layer 212 and an insulating layer 213 are provided over the conductive layer 223, and the conductive layer 222a and the conductive layer 222b are provided thereover. In the transistor 251a, the conductive layer 221 can be physically distanced from the conductive layer 222a or 222b easily; thus, the parasitic capacitance between the conductive layer 221 and the conductive layer 222a or 222b can be reduced.

There is no particular limitation on the structure of the transistor in the display device. For example, a planar transistor, a staggered transistor, or an inverted staggered transistor may be used. A top-gate transistor or a bottom-gate transistor may be used. Gate electrodes may be provided above and below a channel.

The transistor 251a includes a metal oxide in the semiconductor layer 231. The metal oxide can serve as an oxide semiconductor.

The transistors 436a and 201a each have the same structure as the transistor 251a. Structures of the transistors may be different in one embodiment of the present invention. A transistor included in a driver circuit portion and a transistor included in the display portion 62 may have the same structure or different structures. The transistors included in the driver circuit portion may have the same structure or the combination of two or more kinds of structures. Similarly, the transistors included in the display portion 62 may have the same structure or the combination of two or more kinds of structures.

The transistor 436a and the light-emitting element 170 overlap with each other with an insulating layer 215 positioned therebetween. A transistor, a capacitor, a wiring, and the like are provided to overlap with a light-emitting region of the light-emitting element 170, whereby an aperture ratio of the display portion 62 can be increased.

The light-emitting element 170 includes a pixel electrode 171, an EL layer 172, and a common electrode 173. The light-emitting element 170 emits light to the coloring layer 131 side.

One of the pixel electrode 171 and the common electrode 173 functions as an anode and the other functions as a cathode. When a voltage higher than the threshold voltage of the light-emitting element 170 is applied between the pixel electrode 171 and the common electrode 173, holes are injected to the EL layer 172 from the anode side and electrons are injected to the EL layer 172 from the cathode side. The injected electrons and holes are recombined in the EL layer 172 and a light-emitting substance contained in the EL layer 172 emits light.

The pixel electrode 171 is electrically connected to the conductive layer 222b of the transistor 251a. They may be directly connected to each other or may be connected via another conductive layer. The pixel electrode 171 functioning as a pixel electrode is provided for each light-emitting element 170. Two adjacent pixel electrodes 171 are electrically insulated from each other by an insulating layer 216.

The EL layer 172 contains a light-emitting substance.

The common electrode 173 functioning as a common electrode is shared by the light-emitting elements 170. A fixed potential is supplied to the common electrode 173.

The light-emitting element 170 and the coloring layer 131 overlap with each other with a bonding layer 174 positioned therebetween. The insulating layer 216 and a light-blocking layer 132 overlap with each other with the bonding layer 174 positioned therebetween.

The light-emitting element 170 may have a microcavity structure. Owing to the combination of a color filter (the coloring layer 131) and the microcavity structure, light with high color purity can be extracted from the display device.

The coloring layer 131 is a colored layer that transmits light in a specific wavelength range. For example, a color filter for transmitting light in a red, green, blue, or yellow wavelength range can be used. Examples of a material that can be used for the coloring layer 131 include a metal material, a resin material, and a resin material containing pigment or dye.

Note that one embodiment of the present invention is not limited to a color filter method, and a separate coloring method, a color conversion method, a quantum dot method, or the like may be employed.

The light-blocking layer 132 is provided between adjacent coloring layers 131. The light-blocking layer 132 blocks light emitted from an adjacent light-emitting element 170 to prevent color mixture between adjacent light-emitting elements 170. Here, the coloring layer 131 is provided such that its end portion overlaps with the light-blocking layer 132, whereby light leakage can be suppressed. For the light-blocking layer 132, a material that blocks light from the light-emitting element 170 can be used; for example, a black matrix can be formed using a metal material or a resin material containing pigment or dye. Note that it is preferable to provide the light-blocking layer 132 in a region other than the display portion 62, such as the scan line driver circuit 64, in which case undesired leakage of guided light or the like can be inhibited.

The first substrate 111 and the second substrate 113 are attached to each other with the bonding layer 174.

The display device of one embodiment of the present invention includes a portion where a signal line connected to one terminal group intersects with a signal line connected to another terminal group (see FIG. 3A or the like). FIG. 18 illustrates a cross-sectional structure example of this portion as an intersection portion 260. In the intersection portion 260, a conductive layer 65*a* and a conductive layer 65*b* are electrically connected to each other with a conductive layer 69, and the conductive layer 69 and a conductive layer 66 overlap with each other with the insulating layers 211, 212, and 213 positioned therebetween. These conductive layers 65*a*, 65*b*, and 69 correspond to parts of one signal line (or one lead wiring), and the conductive layer 66 corresponds to a part of another signal line (or another lead wiring). The conductive layers are preferably formed using the same material and the same fabrication step as the conductive layers included in the transistor. In an example described in this embodiment, the conductive layers 65*a*, 65*b*, and 66 are formed using the same material and the same fabrication step as the conductive layers functioning as a source electrode and a drain electrode, and the conductive layer 69 is formed using the same material and the same fabrication step as the conductive layer functioning as a gate electrode. The conductive layer 65*a* is electrically connected to the FPC 162 through a conductive layer 255 and a connector 242. The conductive layer 66 is electrically connected to another FPC.

As the connector 242, any of various anisotropic conductive films (ACF), anisotropic conductive pastes (ACP), and the like can be used.

Figure 19:
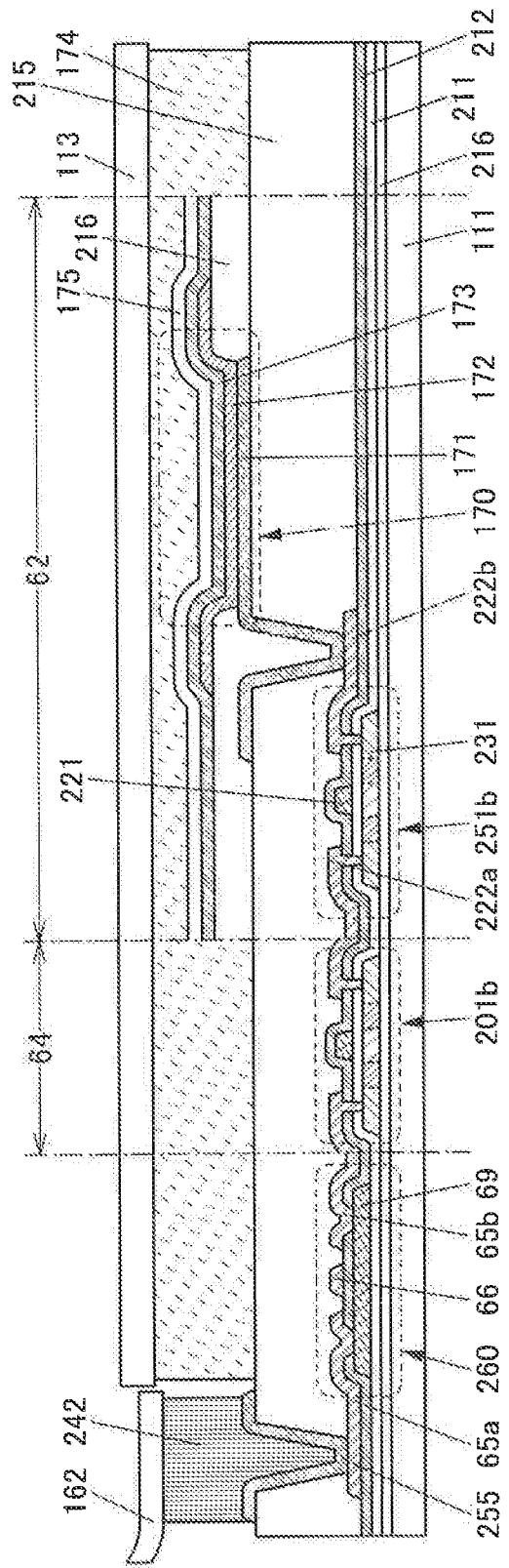
FIG. 19 illustrates a structure example of a display device.

FIG. 19 is a cross-sectional view of a light-emitting display device employing a separate coloring method and having a bottom-emission structure.

The display device illustrated in FIG. 19 includes the display portion 62 and the scan line driver circuit 64.

A transistor 251*b*, the light-emitting element 170, and the like are provided over the first substrate 111 in the display portion 62. A transistor 201*b* and the like are provided over the first substrate 111 in the scan line driver circuit 64.

The transistor 251*b* includes the conductive layer 221 functioning as a gate electrode, the insulating layer 211 functioning as a gate insulating layer, the semiconductor layer 231, and the conductive layer 222*a* and the conductive layer 222*b* functioning as a source electrode and a drain electrode. The insulating layer 216 functions as a base film.

The transistor 251*b* includes low-temperature polysilicon (LTPS) in the semiconductor layer 231.

The light-emitting element 170 includes the pixel electrode 171, the EL layer 172, and the common electrode 173. The light-emitting element 170 emits light to the first substrate 111 side. The pixel electrode 171 is electrically connected to the conductive layer 222*b* of the transistor 251*b* through an opening formed in the insulating layer 215. The EL layer 172 is separated between the light-emitting elements 170. The common electrode 173 is shared by the light-emitting elements 170.

The light-emitting element 170 is sealed with an insulating layer 175. The insulating layer 175 functions as a protective layer that prevents diffusion of impurities such as water into the light-emitting element 170.

The first substrate 111 and the second substrate 113 are attached to each other with the bonding layer 174.

In the intersection portion 260, the conductive layer 65*a* and the conductive layer 65*b* are electrically connected to each other with the conductive layer 69, and the conductive layer 69 and the conductive layer 66 overlap with each other with the insulating layer 212 positioned therebetween. The conductive layers 65*a*, 65*b*, and 69 correspond to parts of one signal line (or one lead wiring), and the conductive layer 66 corresponds to a part of another signal line (or another lead wiring). The conductive layer 65*a* is electrically connected to the FPC 162 through the conductive layer 255 and the connector 242. The conductive layer 66 is electrically connected to another FPC.

Figure 20:
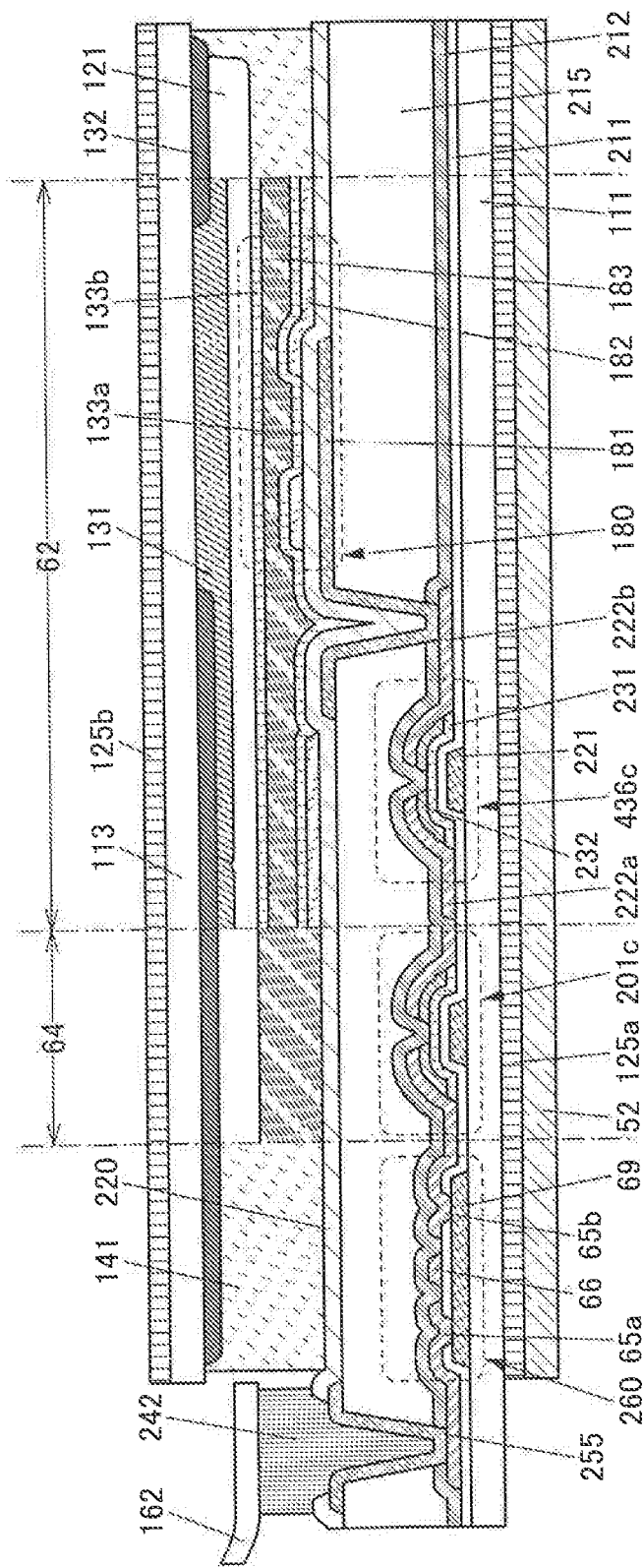
FIG. 20 illustrates a structure example of a display device.

FIG. 20 is a cross-sectional view of a transmissive liquid crystal display device having a horizontal electric field mode.

The display device illustrated in FIG. 20 includes the display portion 62 and the scan line driver circuit 64.

A transistor 436*c*, the liquid crystal element 180, and the like are provided over the first substrate 111 in the display portion 62. A transistor 201*c* and the like are provided over the first substrate 111 in the scan line driver circuit 64.

The transistor 436*c* includes the conductive layer 221 functioning as a gate electrode, the insulating layer 211 functioning as a gate insulating layer, the semiconductor layer 231, an impurity semiconductor layer 232, and the conductive layer 222*a* and the conductive layer 222*b* functioning as a source electrode and a drain electrode. The transistor 436c is covered with the insulating layer 212.

The transistor 436c includes amorphous silicon in the semiconductor layer 231.

The liquid crystal element 180 is a liquid crystal element having a fringe field switching (FFS) mode. The liquid crystal element 180 includes a pixel electrode 181, a common electrode 182, and a liquid crystal layer 183. The alignment of the liquid crystal layer 183 can be controlled with the electrical field generated between the pixel electrode 181 and the common electrode 182. The liquid crystal layer 183 is positioned between alignment films 133a and 133b. The pixel electrode 181 is electrically connected to the conductive layer 222b of the transistor 436c through an opening formed in the insulating layer 215. The common electrode 182 may have a top-surface shape (also referred to as a planar shape) that has a comb-like shape or a top-surface shape that is provided with a slit. One or more openings can be provided in the common electrode 182.

An insulating layer 220 is provided between the pixel electrode 181 and the common electrode 182. The pixel electrode 181 includes a portion that overlaps with the common electrode 182 with the insulating layer 220 positioned therebetween. Furthermore, the common electrode 182 is not placed above the pixel electrode 181 in some areas of a region where the pixel electrode 181 and the coloring layer 131 overlap with each other.

An alignment film is preferably provided in contact with the liquid crystal layer 183. The alignment film can control the alignment of the liquid crystal layer 183.

Light from a backlight unit 52 is emitted to the outside of the display device through the first substrate 111, the pixel electrode 181, the common electrode 182, the liquid crystal layer 183, the coloring layer 131, and the second substrate 113. As materials of these layers that transmit the light from the backlight unit 52, visible-light-transmitting materials are used.

An overcoat 121 is preferably provided between the coloring layer 131 or the light-blocking layer 132, and the liquid crystal layer 183. The overcoat 121 can reduce the diffusion of impurities contained in the coloring layer 131 and the light-blocking layer 132 and the like into the liquid crystal layer 183.

The first substrate 111 and the second substrate 113 are attached to each other with a bonding layer 141. The liquid crystal layer 183 is encapsulated in a region that is surrounded by the first substrate 111, the second substrate 113, and the bonding layer 141.

A polarizing plate 125a and a polarizing plate 125b are provided with the display portion 62 of the display device positioned therebetween. Light from the backlight unit 52 provided outside the polarizing plate 125a enters the display device through the polarizing plate 125a. In this case, the optical modulation of the light can be controlled by controlling the alignment of the liquid crystal layer 183 with a voltage supplied between the pixel electrode 181 and the common electrode 182. In other words, the intensity of light emitted through the polarizing plate 125b can be controlled. Furthermore, the coloring layer 131 absorbs light of wavelengths other than a specific wavelength range from the incident light. As a result, the ejected light is light that exhibits red, blue, or green colors, for example.

In the intersection portion 260, the conductive layer 65a and the conductive layer 65b are electrically connected to each other with the conductive layer 69, and the conductive layer 69 and the conductive layer 66 overlap with each other with the insulating layer 212 positioned therebetween. The conductive layers 65a, 65b, and 69 correspond to parts of one signal line (or one lead wiring), and the conductive layer 66 corresponds to a part of another signal line (or another lead wiring). The conductive layer 65a is electrically connected to the FPC 162 through the conductive layer 255 and the connector 242. The conductive layer 66 is electrically connected to another FPC.

Figure 21:
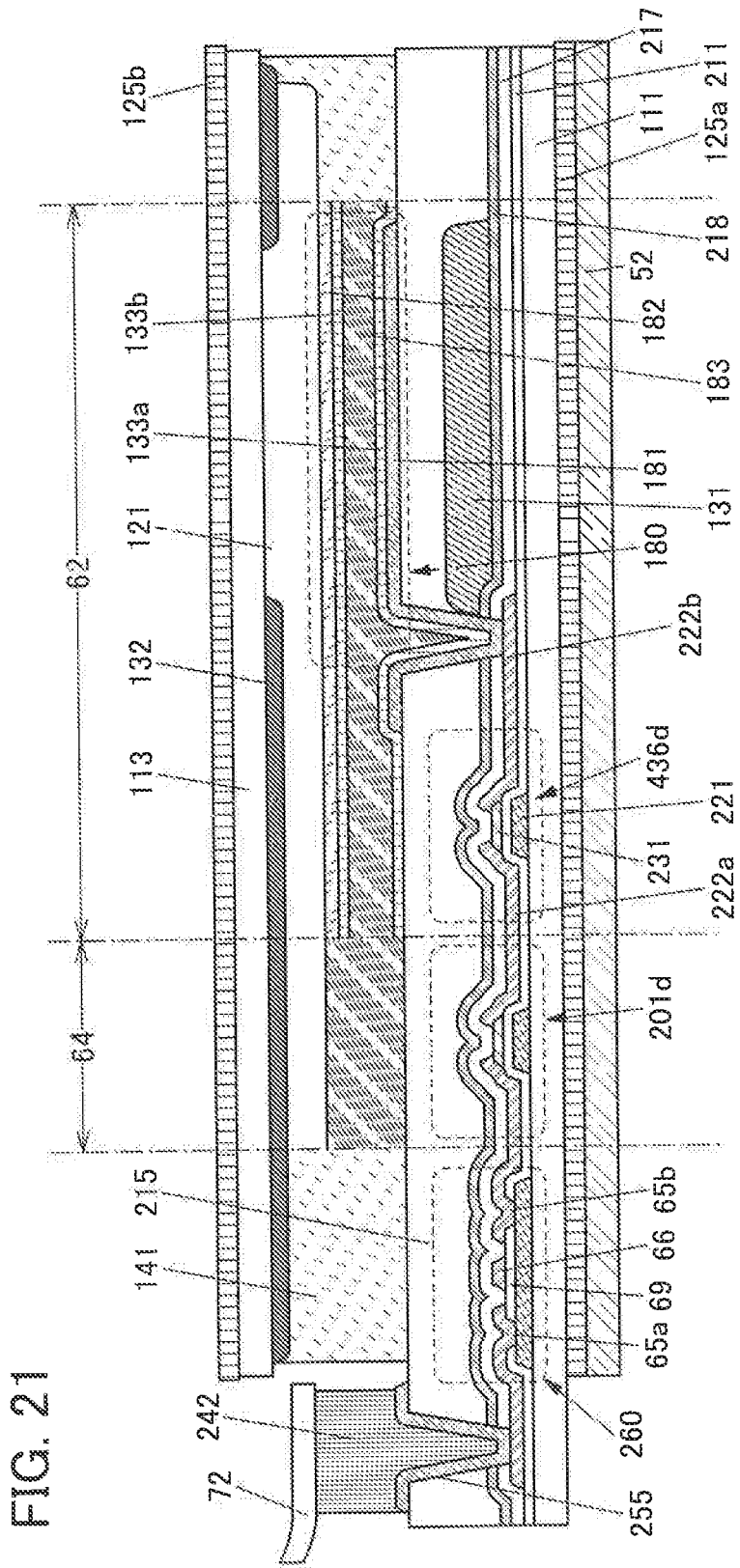
FIG. 21 illustrates a structure example of a display device.

FIG. 21 is a cross-sectional view of a transmissive liquid crystal display device having a vertical electric field mode.

The display device illustrated in FIG. 21 includes the display portion 62 and the scan line driver circuit 64.

A transistor 436d, the liquid crystal element 180, and the like are provided over the first substrate 111 in the display portion 62. A transistor 201d and the like are provided over the first substrate 111 in the scan line driver circuit 64. The coloring layer 131 is provided on the first substrate 111 side in the display device illustrated in FIG. 21. In this manner, the structure on the second substrate 113 side can be simplified.

The transistor 436d includes the conductive layer 221 functioning as a gate electrode, the insulating layer 211 functioning as a gate insulating layer, the semiconductor layer 231, the impurity semiconductor layer 232, and the conductive layer 222a and the conductive layer 222b functioning as a source electrode and a drain electrode. The transistor 436d is covered with insulating layers 217 and 218.

The transistor 436d includes a metal oxide in the semiconductor layer 231.

The liquid crystal element 180 includes the pixel electrode 181, the common electrode 182, and the liquid crystal layer 183. The liquid crystal layer 183 is positioned between the pixel electrode 181 and the common electrode 182. The alignment film 133a and the alignment film 133b are respectively in contact with the pixel electrode 181 and the common electrode 182. The pixel electrode 181 is electrically connected to the conductive layer 222b of the transistor 436d through an opening formed in the insulating layer 215.

Light from the backlight unit 52 is emitted to the outside of the display device through the first substrate 111, the coloring layer 131, the pixel electrode 181, the liquid crystal layer 183, the common electrode 182, and the second substrate 113. As materials of these layers that transmit the light from the backlight unit 52, visible-light-transmitting materials are used.

The overcoat 121 is provided between the light-blocking layer 132 and the common electrode 182.

The first substrate 111 and the second substrate 113 are attached to each other with the bonding layer 141. The liquid crystal layer 183 is encapsulated in a region that is surrounded by the first substrate 111, the second substrate 113, and the bonding layer 141.

The polarizing plate 125a and the polarizing plate 125b are provided with the display portion 62 of the display device positioned therebetween.

In the intersection portion 260, the conductive layer 65a and the conductive layer 65b are electrically connected to each other with the conductive layer 69, and the conductive layer 69 and the conductive layer 66 overlap with each other with the insulating layer 212 positioned therebetween. The conductive layers 65a, 65b, and 69 correspond to parts of one signal line (or one lead wiring), and the conductive layer 66 corresponds to a part of another signal line (or another lead wiring). The conductive layer 65a is electrically connected to the FPC 162 through the conductive layer 255 and the connector 242. The conductive layer 66 is electrically connected to another FPC.

<1-9. Structure Example of Transistor>

Structure examples of transistors having different structures from those illustrated in FIGS. 18 to 21 are described with reference to FIGS. 22A to 22C, FIGS. 23A to 23D, and FIGS. 24A to 24F.

FIGS. 22A to 22C and FIGS. 23A to 23D illustrate transistors each including a metal oxide in a semiconductor layer 32. Since the semiconductor layer 32 includes a metal oxide, the frequency of updating a video signal can be extremely low when there is no change in a video, or when the change is below a certain level, leading to reduced power consumption.

The transistors are each provided over an insulating surface 11. The transistors each include a conductive layer 31 functioning as a gate electrode, an insulating layer 34 functioning as a gate insulating layer, the semiconductor layer 32, and a pair of conductive layers 33a and 33b functioning as a source electrode and a drain electrode. A region of the semiconductor layer 32 overlapping with the conductive layer 31 functions as a channel formation region. The conductive layers 33a and 33b are each in contact with the semiconductor layer 32.

Figure 22A:
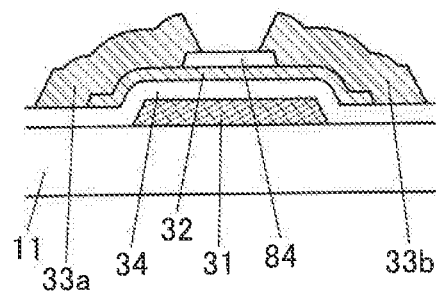
FIGS. 22A to 22C each illustrate a structure example of a transistor.

The transistor illustrated in FIG. 22A includes an insulating layer 84 over a channel formation region of the semiconductor layer 32. The insulating layer 84 serves as an etching stopper in the etching of the conductive layers 33a and 33b.

Figure 22B:
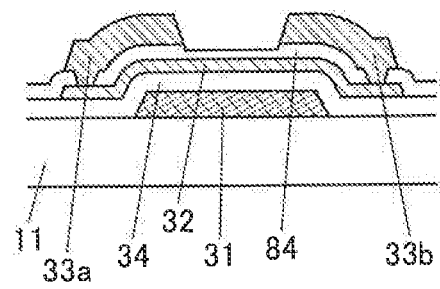

The transistor illustrated in FIG. 22B has a structure in which the insulating layer 84 extends over the insulating layer 34 to cover the semiconductor layer 32. In this structure, the conductive layers 33a and 33b are connected to the semiconductor layer 32 through openings formed in the insulating layer 84.

Figure 22C:
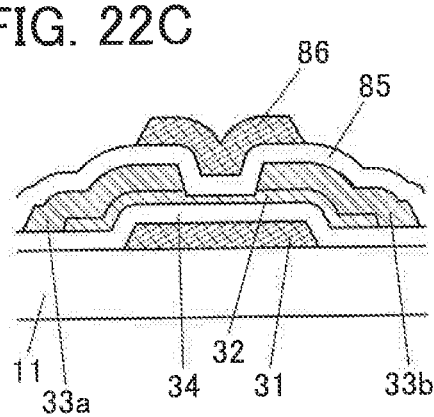

The transistor illustrated in FIG. 22C includes an insulating layer 85 and a conductive layer 86. The insulating layer 85 is provided to cover the semiconductor layer 32, the conductive layer 33a, and the conductive layer 33b. The conductive layer 86 is provided over the insulating layer 85 and overlaps with the semiconductor layer 32.

The conductive layer 86 is positioned to face the conductive layer 31 with the semiconductor layer 32 positioned therebetween. In the case where the conductive layer 31 is used as a first gate electrode, the conductive layer 86 can serve as a second gate electrode. By supplying the same potential to the conductive layer 31 and the conductive layer 86, the on-state current of the transistor can be increased. When a potential for controlling the threshold voltage is supplied to one of the conductive layers 31 and 86 and a potential for driving is supplied to the other, the threshold voltage of the transistor can be controlled.

Figure 23A:
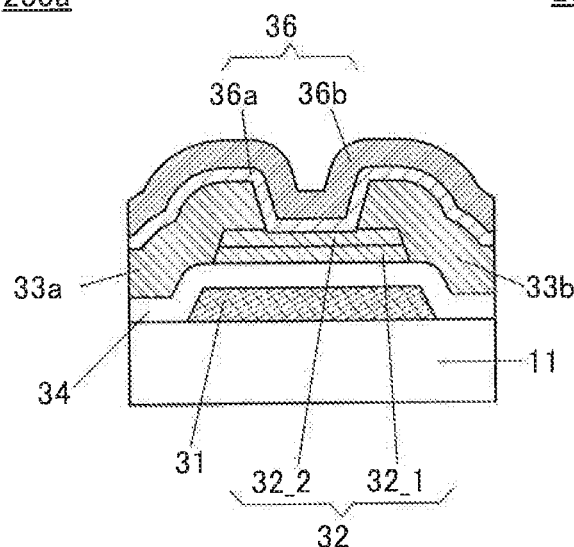
FIGS. 23A to 23D each illustrate a structure example of a transistor.
Figure 23B:
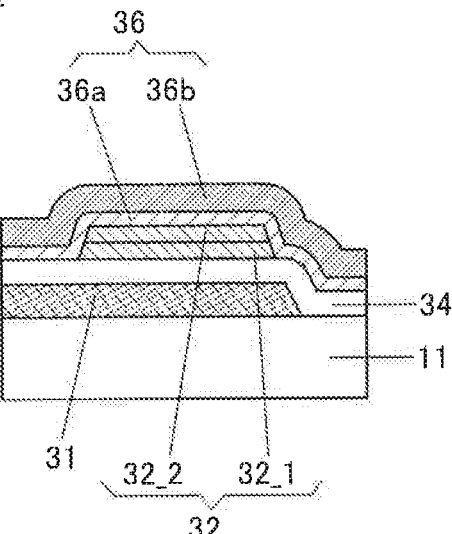

FIG. 23A is a cross-sectional view of a transistor 200a in the channel length direction, and FIG. 23B is a cross-sectional view of the transistor 200a in the channel width direction.

The transistor 200a is a modification example of the transistor 201d illustrated in FIG. 21.

The transistor 200a is different from the transistor 201d in the structure of the semiconductor layer 32.

The semiconductor layer 32 of the transistor 200a includes a semiconductor layer 32_1 over the insulating layer 34 and a semiconductor layer 32_2 over the semiconductor layer 32_1.

The semiconductor layer 32_1 and the semiconductor layer 32_2 preferably include the same element. The semiconductor layer 32_1 and the semiconductor layer 32_2 each preferably include In, M (M is Ga, Al, Y, or Sn), and Zn.

The semiconductor layer 32_1 and the semiconductor layer 32_2 each preferably include a region where the atomic proportion of In is larger than the atomic proportion of M. For example, the atomic ratio of In to M and Zn in each of the semiconductor layer 32_1 and the semiconductor layer 32_2 is preferably In:M:Zn=4:2:3 or in the neighborhood thereof. The term "neighborhood" includes the following: when In is 4, M is greater than or equal to 1.5 and less than or equal to 2.5, and Zn is greater than or equal to 2 and less than or equal to 4. Alternatively, the atomic ratio of In to M and Zn in each of the semiconductor layer 32_1 and the semiconductor layer 32_2 is preferably In:M:Zn=5:1:6 or in the neighborhood thereof. When the compositions of the semiconductor layer 32_1 and the semiconductor layer 32_2 are substantially the same, they can be formed using the same sputtering target and the manufacturing cost can thus be reduced. Since the same sputtering target is used, the semiconductor layer 32_1 and the semiconductor layer 32_2 can be formed successively in the same vacuum chamber. This can suppress entry of impurities into the interface between the semiconductor layer 32_1 and the semiconductor layer 32_2.

The semiconductor layer 32_1 may have a region having lower crystallinity than the semiconductor layer 32_2. Note that the crystallinity of each of the semiconductor layer 32_1 and the semiconductor layer 32_2 can be determined by analysis by X-ray diffraction (XRD) or with a transmission electron microscope (TEM).

The region having low crystallinity in the semiconductor layer 32_1 serves as a diffusion path of excess oxygen, through which excess oxygen can be diffused into the semiconductor layer 32_2 having higher crystallinity than the semiconductor layer 32_1. When a multi-layer structure including the semiconductor layers having different crystal structures is employed and the region having low crystallinity is used as a diffusion path of excess oxygen as described above, the transistor can be highly reliable.

The semiconductor layer 32_2 having a region having higher crystallinity than the semiconductor layer 32_1 can prevent impurities from entering the semiconductor layer 32. In particular, the increased crystallinity of the semiconductor layer 32_2 can reduce damage at the time of processing into the conductive layers 33a and 33b. The surface of the semiconductor layer 32, i.e., the surface of the semiconductor layer 32_2 is exposed to an etchant or an etching gas at the time of processing into the conductive layers 33a and 33b. However, when the semiconductor layer 32_2 has a region having high crystallinity, the semiconductor layer 32_2 has higher etching resistance than the semiconductor layer 32_1. Therefore, the semiconductor layer 32_2 serves as an etching stopper.

When the semiconductor layer 32_1 has a region having lower crystallinity than the semiconductor layer 32_2, in some cases, the semiconductor layer 32_1 has a high carrier density.

When the semiconductor layer 32_1 has a high carrier density, the Fermi level is sometimes high relative to the conduction band of the semiconductor layer 32_1. This lowers the conduction band minimum of the semiconductor layer 32_1, so that the energy difference between the conduction band minimum of the semiconductor layer 32_1 and the trap level, which might be formed in a gate insulating layer (here, the insulating layer 34), is increased in some cases. The increase of the energy difference can reduce trap of charges in the gate insulating layer and reduce variation in the threshold voltage of the transistor, in some cases. In addition, when the semiconductor layer 32_1 has a high carrier density, the semiconductor layer 32 can have high field-effect mobility.

Although the semiconductor layer 32 in the transistor 200a has a multi-layer structure including two layers in this example, the structure is not limited thereto, and the semiconductor layer 32 may have a multi-layer structure including three or more layers.

A structure of an insulating layer 36 provided over the conductive layer 33a and the conductive layer 33b is described.

The insulating layer 36 of the transistor 200a includes an insulating layer 36a and an insulating layer 36b over the insulating layer 36a. The insulating layer 36a has a function of supplying oxygen to the semiconductor layer 32 and function of preventing impurities (typically, water, hydrogen, and the like) from entering the semiconductor layer 32. As the insulating layer 36a, an aluminum oxide film, an aluminum oxynitride film, or an aluminum nitride oxide film can be used. In particular, the insulating layer 36a is preferably an aluminum oxide film formed by a reactive sputtering method. As an example of a method for forming an aluminum oxide by a reactive sputtering method, the following method can be given.

First, a mixed gas of an inert gas (typically, an Ar gas) and an oxygen gas is introduced into a sputtering chamber. Subsequently, a voltage is applied to an aluminum target provided in the sputtering chamber, whereby the aluminum oxide film can be deposited. Electric power used for applying a voltage to the aluminum target is supplied from a DC power source, an AC power source, or an RF power source. The DC power source is particularly preferably used to improve the productivity.

The insulating layer 36b has a function of preventing the entry of impurities (typically, water, hydrogen, and the like). As the insulating layer 36b, a silicon nitride film, a silicon nitride oxide film, or a silicon oxynitride film can be used. In particular, a silicon nitride film formed by a PECVD method is preferably used as the insulating layer 36b. The silicon nitride film formed by a PECVD method is preferable because the film is likely to have a high film density. Note that the hydrogen concentration in the silicon nitride film formed by a PECVD method is high in some cases.

Since the insulating layer 36a is provided below the insulating layer 36b in the transistor 200a, hydrogen in the insulating layer 36b does not or is less likely to diffuse into the semiconductor layer 32 side.

The transistor 200a is a single-gate transistor. The use of a single-gate transistor can reduce the number of masks, leading to increased productivity.

Figure 23C:
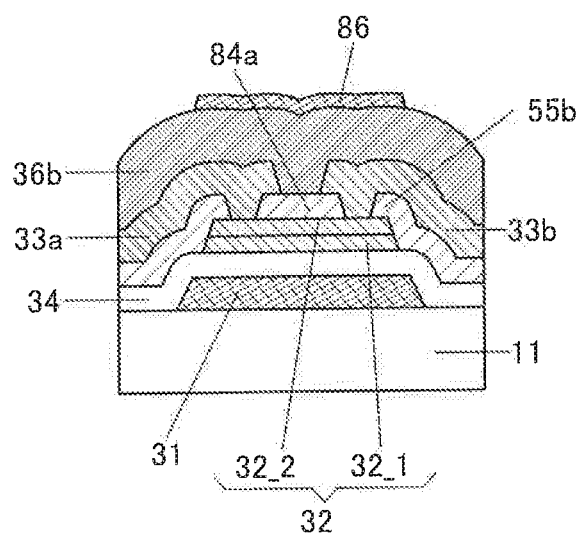
Figure 23D:
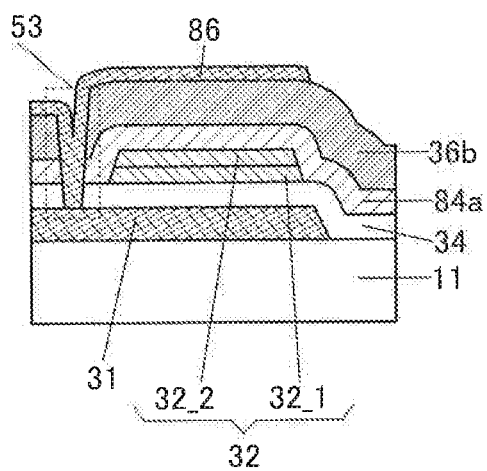

FIG. 23C is a cross-sectional view of a transistor 200b in the channel length direction, and FIG. 23D is a cross-sectional view of the transistor 200b in the channel width direction.

The transistor 200b is a modification example of the transistor illustrated in FIG. 22B.

The transistor 200b is different from the transistor illustrated in FIG. 22B in the structures of the semiconductor layer 32 and the insulating layer 84. Specifically, the transistor 200b includes the semiconductor layer 32 having a two-layer structure, and the transistor 200b includes an insulating layer 84a instead of the insulating layer 84. The transistor 200b further includes the insulating layer 36b and the conductive layer 86.

The insulating layer 84a has a function similar to that of the insulating layer 36a.

An opening 53 is provided through the insulating layers 34, 84a, and 36b. The conductive layer 86 is electrically connected to the conductive layer 31 in the opening 53.

The structure of the transistor 200a or 200b can be formed using the existing production line without high capital investment. For example, a manufacturing plant for an oxide semiconductor can be simply substituted for a manufacturing plant for hydrogenated amorphous silicon.

FIGS. 24A to 24F illustrate transistors each including silicon in the semiconductor layer 32.

The transistors are each provided over the insulating surface 11. The transistors each include the conductive layer 31 functioning as a gate electrode, the insulating layer 34 functioning as a gate insulating layer, one or both of the semiconductor layer 32 and a semiconductor layer 32p, a pair of conductive layers 33a and 33b functioning as a source electrode and a drain electrode, and an impurity semiconductor layer 35. A region of the semiconductor layer overlapping with the conductive layer 31 functions as a channel formation region. The semiconductor layer is in contact with the conductive layer 33a or 33b.

Figure 24A:
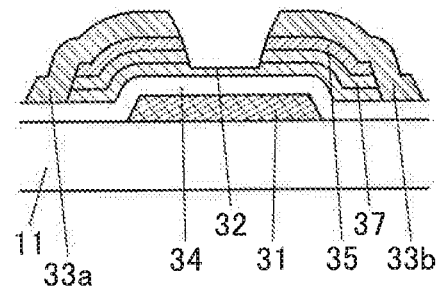
FIGS. 24A to 24F each illustrate a structure example of a transistor.

The transistor illustrated in FIG. 24A is a channel-etched bottom-gate transistor. The impurity semiconductor layer 35 is provided between the conductive layer 33a or the conductive layer 33b, and the semiconductor layer 32.

The transistor illustrated in FIG. 24A includes a semiconductor layer 37 between the semiconductor layer 32 and the impurity semiconductor layer 35.

The semiconductor layer 37 may be formed using a semiconductor film similar to the semiconductor layer 32. The semiconductor layer 37 can serve as an etching stopper that prevents the removal of the semiconductor layer 32 in the etching of the impurity semiconductor layer 35. Although FIG. 24A illustrates an example in which the semiconductor layer 37 is divided into a right part and a left part, the semiconductor layer 37 may partly cover the channel formation region of the semiconductor layer 32.

The semiconductor layer 37 may include an impurity at a concentration lower than the impurity semiconductor layer 35. In that case, the semiconductor layer 37 can serve as a lightly doped drain (LDD) regions, so that hot-carrier degradation that is caused when a transistor is driven can be suppressed.

Figure 24B:
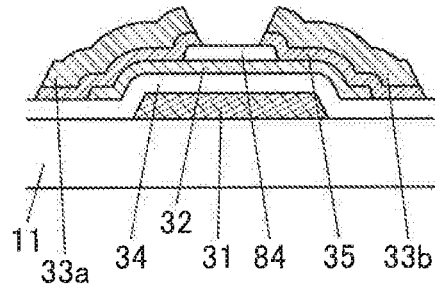

The transistor illustrated in FIG. 24B includes the insulating layer 84 over the channel formation region of the semiconductor layer 32. The insulating layer 84 serves as an etching stopper in the etching of the impurity semiconductor layer 35.

Figure 24C:
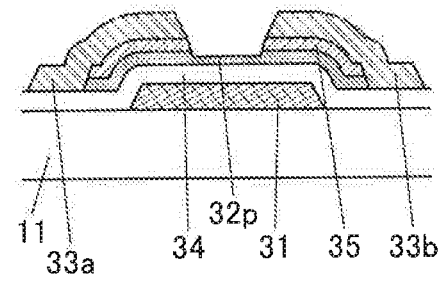

The transistor illustrated in FIG. 24C includes the semiconductor layer 32p instead of the semiconductor layer 32. The semiconductor layer 32p includes a semiconductor film having high crystallinity. The semiconductor layer 32p includes a polycrystalline semiconductor or a single crystal semiconductor, for example. With such a structure, a transistor with high field-effect mobility can be formed.

Figure 24D:
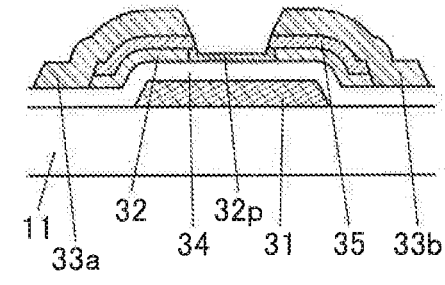

The transistor illustrated in FIG. 24D includes the semiconductor layer 32p in the channel formation region of the semiconductor layer 32. The transistor illustrated in FIG. 24D can be formed by, for example, irradiation of a semiconductor film to be the semiconductor layer 32 with laser light or the like to locally crystallize the semiconductor film. In this way, a transistor having high field-effect mobility can be obtained.

Figure 24E:
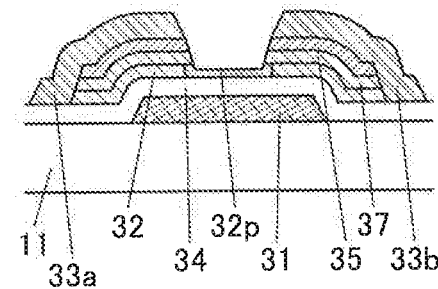

The transistor illustrated in FIG. 24E includes the semiconductor layer 32p having crystallinity in the channel formation region of the semiconductor layer 32 illustrated in FIG. 24A.

Figure 24F:
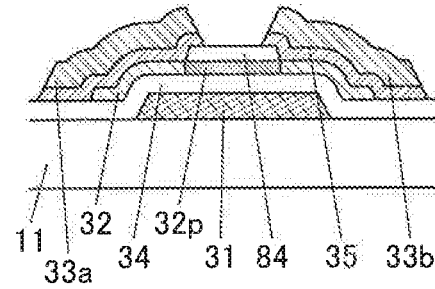

The transistor illustrated in FIG. 24F includes the semiconductor layer 32p having crystallinity in the channel formation region of the semiconductor layer 32 illustrated in FIG. 24B.

[Semiconductor Layer]

There is no particular limitation on the crystallinity of a semiconductor material used for the transistors disclosed in one embodiment of the present invention, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be suppressed.

As a semiconductor material used for the transistors, a metal oxide whose energy gap is greater than or equal to 2 eV, preferably greater than or equal to 2.5 eV, further preferably greater than or equal to 3 eV can be used. A typical example thereof is a metal oxide containing indium, and for example, a CAC-OS described later or the like can be used.

A transistor with a metal oxide having a larger band gap and a lower carrier density than silicon has a low off-state current; therefore, charges stored in a capacitor that is series-connected to the transistor can be held for a long time.

The semiconductor layer can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where the metal oxide contained in the semiconductor layer contains an In-M-Zn-based oxide, it is preferable that the atomic ratio of metal elements of a sputtering target used for forming a film of the In-M-Zn oxide satisfy In≥M and Zn≥M The atomic ratio of metal elements of such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio of metal elements in the formed oxide semiconductor layer varies from the above atomic ratios of metal elements of the sputtering targets in a range of ±40%.

Refer to Embodiment 4 for details of the metal oxide favorably used for a semiconductor layer.

As a semiconductor material used for the transistor, for example, silicon can be used. In particular, amorphous silicon is preferably used. By using amorphous silicon, the transistor can be formed over a large-area substrate with high yield, so that mass productivity can be improved.

Alternatively, silicon having crystallinity such as microcrystalline silicon, polycrystalline silicon, or single crystal silicon can be used. In particular, polycrystalline silicon can be formed at a lower temperature than single-crystal silicon and has higher field-effect mobility and higher reliability than amorphous silicon.

As described above, in the display module of one embodiment of the present invention, the display portion is divided into a plurality of regions and a scan line driver circuit and a signal line driver circuit are electrically connected to each region. Then, image rewriting of the plurality of regions can be performed at the same time; thus, image rewriting can be performed in a frame period even when a transistor with low field-effect mobility is used. Moreover, when an 8K display module is manufactured, for example, an IC and a printed circuit board that are for 4K display modules can be used; thus, a display module with high resolution can be manufactured easily.

In the display module of one embodiment of the present invention, a region where signal lines electrically connected to a first signal line driver circuit and signal lines electrically connected to a second signal line driver circuit are mixed is provided between two regions into which the display portion is divided. With this structure, a boundary between the two regions is hardly recognized as a dividing line by a viewer. Thus, the display quality of a large display module with high resolution can be improved.

This embodiment can be combined with any of other embodiments as appropriate. In the case where a plurality of structure examples are described in one embodiment in this specification, some of the structure examples can be combined as appropriate.

Embodiment 2

Described in this embodiment is a metal oxide that can be used in a semiconductor layer of a transistor disclosed in one embodiment of the present invention. Note that in the case where a metal oxide is used in a semiconductor layer of a transistor, the metal oxide can be rephrased as an oxide semiconductor.

An oxide semiconductor is classified into a single crystal oxide semiconductor and a non-single-crystal oxide semiconductor. Examples of the non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

A cloud-aligned composite OS (CAC-OS) may be used in a semiconductor layer of a transistor disclosed in one embodiment of the present invention.

The aforementioned non-single-crystal oxide semiconductor or CAC-OS can be suitably used in a semiconductor layer of a transistor disclosed in one embodiment of the present invention. As the non-single-crystal oxide semiconductor, an nc-OS or a CAAC-OS can be suitably used.

In one embodiment of the present invention, a CAC-OS is preferably used in a semiconductor layer of a transistor. The use of the CAC-OS allows the transistor to have high electrical characteristics or high reliability.

The CAC-OS will be described in detail below.

A CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in a channel formation region of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes conductive regions and insulating regions. The conductive regions have the aforementioned conducting function and the insulating regions have the aforementioned insulating function. In some cases, the conductive regions and the insulating regions in the material are separated at the nanoparticle level. In some cases, the conductive regions and the insulating regions are unevenly distributed in the material. The conductive regions are sometimes observed to be coupled in a cloud-like manner with their boundaries blurred.

In the CAC-OS or the CAC metal oxide, the conductive regions and the insulating regions each have a size greater than or equal to 0.5 nm and less than or equal to 10 nm, preferably greater than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or CAC metal oxide is used in a channel formation region of a transistor, high current drive capability in the on state of the transistor, that is, high on-state current and high field-effect mobility, can be obtained.

In other words, the CAC-OS or the CAC-metal oxide can be referred to as a matrix composite or a metal matrix composite.

The CAC-OS has, for example, a composition in which elements included in a metal oxide are unevenly distributed. The unevenly distributed elements each have a size greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed and regions including the metal element(s) are mixed is referred to as a mosaic pattern or a patch-like pattern. The regions each have a size greater than or equal to 0.5 nm and less than or equal to 10 nm, preferably greater than or equal to 1 nm and less than or equal to 2 nm, or a similar size.

Note that a metal oxide preferably contains at least indium. In particular, indium and zinc are preferably contained. In addition, one or more elements selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite metal oxide with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \le x0 \le 1$; m0 is a given number).

The above crystalline compounds have a single crystal structure, a polycrystalline structure, or a c-axis-aligned crystalline (CAAC) structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated intentionally, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility ($\mu$) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility ($\mu$) can be achieved.

A semiconductor element including a CAC-OS has high reliability. Thus, the CAC-OS is suitably used in a variety of semiconductor devices typified by a display.

This embodiment can be combined with any of the other embodiments as appropriate.

Embodiment 3

In this embodiment, examples of a method for crystallizing silicon (a method for forming polycrystalline silicon) which can be used for a semiconductor layer of a transistor and a laser crystallization apparatus are described.

To form polycrystalline silicon layers having favorable crystallinity, it is preferable that an amorphous silicon layer be provided over a substrate and crystallized by laser irradiation. For example, the substrate is moved while the amorphous silicon layer is irradiated with a linear beam, so that polycrystalline silicon layers can be formed in desired regions over the substrate.

The method using a linear beam is relatively favorable in throughput. On the other hand, the method tends to produce variations in crystallinity owing to a change in the output of laser light and a change in the beam profile caused by the output change because laser light is moved relative to a region and is emitted to the region a plurality of times. For example, a display device that uses a transistor including a semiconductor layer crystallized by this method in a pixel might display a random stripe pattern caused by variations in crystallinity.

The length of the linear beam is ideally greater than or equal to the length of a side of the substrate; however, the length of the linear beam is limited by an output of a laser oscillator and the structure of an optical system. Thus, it is practical to irradiate a large substrate with the laser light by turning back the laser light in a substrate plane. Consequently, there is a region irradiated with the laser light a plurality of times. Since the crystallinity of such a region is likely to be different from that of the other region, display unevenness is sometimes caused in the region.

To avoid such a problem, an amorphous silicon layer formed over a substrate may be crystallized by local laser irradiation. Local laser irradiation easily forms polycrystalline silicon layers with small variation in crystallinity.

Figure 25A:
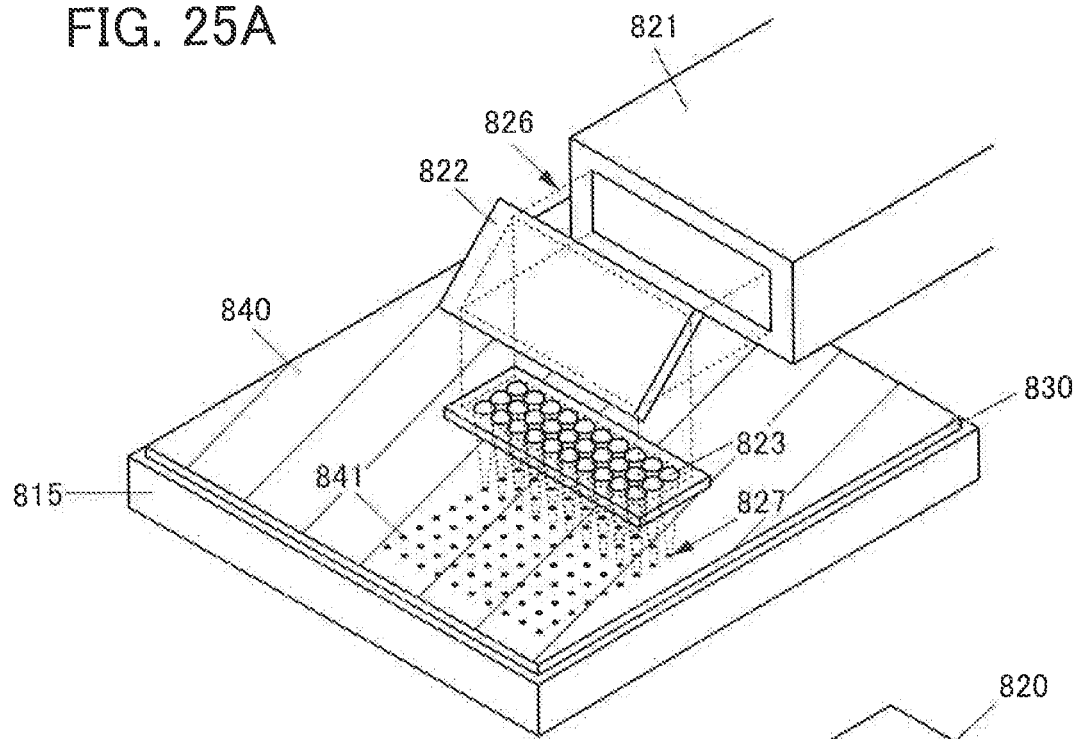
FIGS. 25A and 25B illustrate a laser irradiation method and a laser crystallization apparatus.

FIG. 25A illustrates a method of locally irradiating an amorphous silicon layer formed over a substrate with laser light.

Laser light 826 emitted from an optical system unit 821 is reflected by a mirror 822 and enters a microlens array 823. The microlens array 823 collects the laser light 826 to form a plurality of laser beams 827.

A substrate 830 over which an amorphous silicon layer 840 is formed is fixed to a stage 815. The amorphous silicon layer 840 is irradiated with the plurality of laser beams 827, so that a plurality of polycrystalline silicon layers 841 can be formed at the same time.

Microlenses of the microlens array 823 are preferably provided with a pixel pitch of a display device. Alternatively, they may be provided at intervals of an integral multiple of the pixel pitch. In either of the cases, polycrystalline silicon layers can be formed in regions corresponding to all pixels by repeating laser irradiation and movement of the stage 815 in the X direction or the Y direction.

For example, when the microlens array 823 includes M rows and N columns (M and N are natural numbers) of microlenses arranged with a pixel pitch, laser irradiation is performed at a predetermined start position first, so that M rows and N columns of polycrystalline silicon layers 841 can be formed. Then, the stage 815 is moved by N columns in the row direction and laser irradiation is performed, so that M rows and N columns of polycrystalline silicon layers 841 can be further formed. Consequently, M rows and 2N columns of polycrystalline silicon layers 841 can be obtained. By repeating the steps, a plurality of polycrystalline silicon layers 841 can be formed in desired regions. In the case where laser irradiation is performed by turning back the laser light, the following steps are repeated: the stage 815 is moved by N columns in the row direction; laser irradiation is performed; the stage 815 is moved by M rows in the column direction: and laser irradiation is performed.

Note that even when a method of performing laser irradiation while the stage 815 is moved in one direction is employed, polycrystalline silicon layers can be formed with a pixel pitch by adjusting the oscillation frequency of the laser light and the moving speed of the stage 815 properly.

The size of the laser beam 827 can be an area in which the whole semiconductor layer of a transistor is included, for example. Alternatively, the size can be an area in which the whole channel region of a transistor is included. Further alternatively, the size can be an area in which part of a channel region of a transistor is included. The size can be selected from them depending on required electrical characteristics of a transistor.

Note that in the case of a display device including a plurality of transistors in a pixel, the size of the laser beam 827 can be an area in which the whole semiconductor layer of each transistor in a pixel is included. Alternatively, the size of the laser beam 827 may be an area in which the whole semiconductor layers of transistors in a plurality of pixels are included.

Figure 26A:
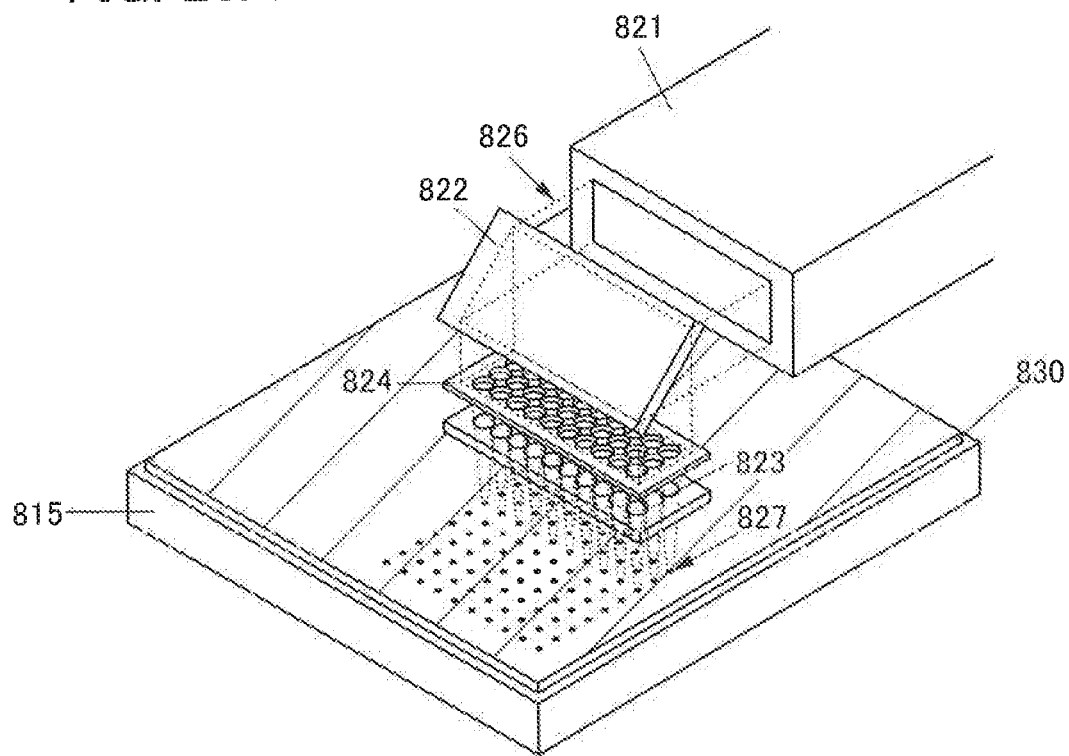
FIGS. 26A and 26B illustrate a laser irradiation method.
Figure 26B:
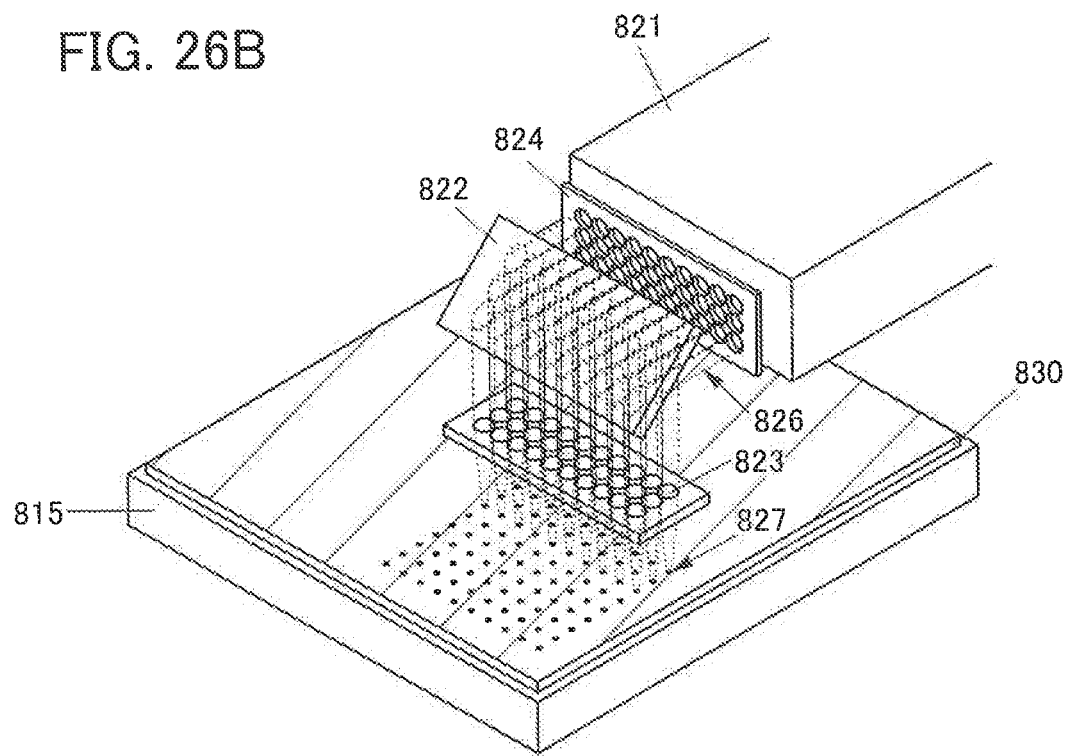

As illustrated in FIG. 26A, a mask 824 may be provided between the mirror 822 and the microlens array 823. The mask 824 includes a plurality of openings corresponding to respective microlenses. The shape of the opening can be reflected by the shape of the laser beam 827; as illustrated in FIG. 26A, the laser beam 827 having a circular shape can be obtained in the case where the mask 824 includes circular openings. The laser beam 827 having a rectangular shape can be obtained in the case where the mask 824 includes rectangular openings. The mask 824 is effective in the case where only a channel region of a transistor is crystallized, for example. Note that the mask 824 may be provided between the optical system unit 821 and the mirror 822 as illustrated in FIG. 26B.

Figure 25B:
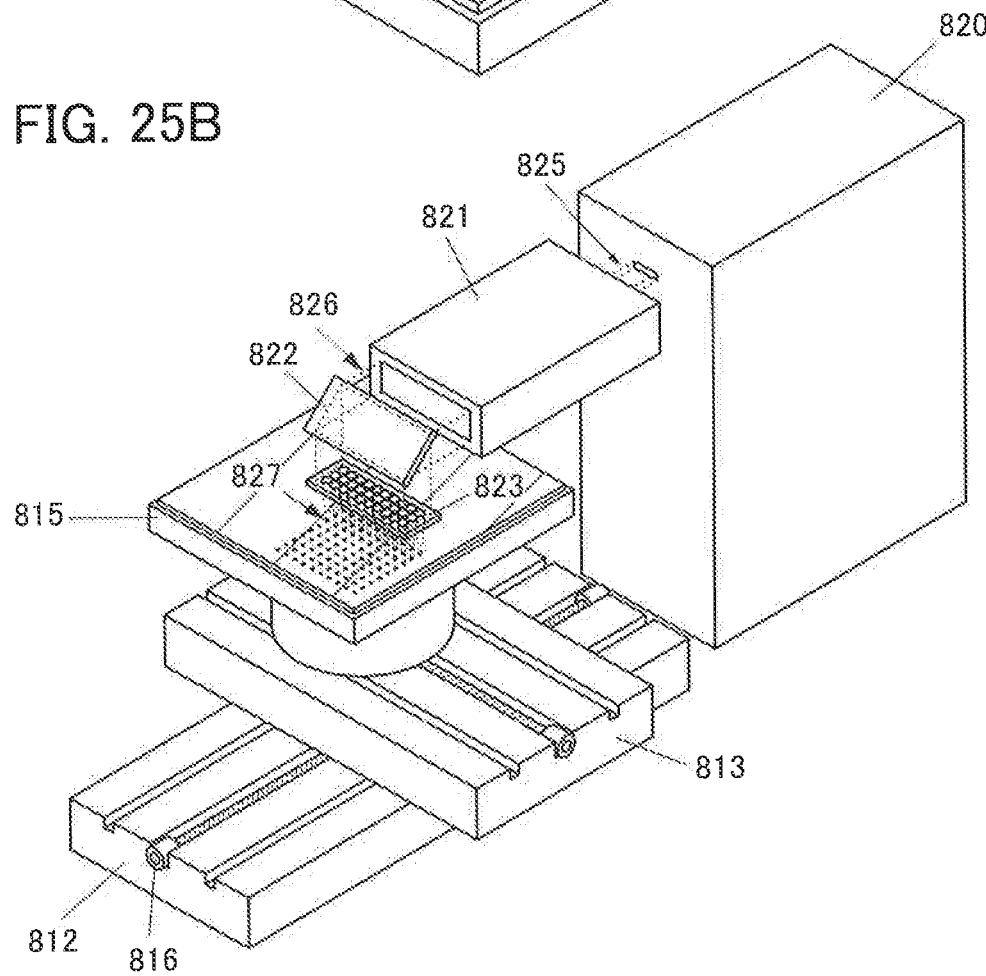

FIG. 25B is a perspective view illustrating a main structure of a laser crystallization apparatus which can be used in the above local laser irradiation step. The laser crystallization apparatus includes a moving mechanism 812, a moving mechanism 813, and the stage 815 which are components of an XY stage. The crystallization apparatus further includes a laser oscillator 820, the optical system unit 821, the mirror 822, and the microlens array 823 to shape the laser beam 827.

The moving mechanism 812 and the moving mechanism 813 each have a function of performing reciprocating linear motion in the horizontal direction. As a mechanism for powering the moving mechanism 812 and the moving mechanism 813, a ball screw mechanism 816 driven by a motor can be used, for example. The moving directions of the moving mechanism 812 and the moving mechanism 813 cross orthogonally; thus, the stage 815 fixed to the moving mechanism 813 can be moved in the X direction and in the Y direction freely.

The stage 815 includes a fixing mechanism such as a vacuum suction mechanism and can fix the substrate 830 or the like. Furthermore, the stage 815 may include a heating mechanism as needed. Although not illustrated, the stage 815 may include a pusher pin and a vertical moving mechanism thereof, and the substrate 830 or the like can be moved up and down when being transferred.

The laser oscillator 820 is preferably a pulsed laser, but may be a CW laser as long as it outputs light with a wavelength and intensity suitable for the purpose of processing. Typically, an excimer laser that emits ultraviolet light with a wavelength of 351 nm to 353 nm (XeF), a wavelength of 308 nm (XeCl), or the like can be used. Alternatively, a second harmonic wavelength (515 nm, 532 nm, or the like) or a third harmonic wavelength (343 nm, 355 nm, or the like) of a solid-state laser such as a YAG laser or a fiber laser may be used. A plurality of laser oscillators 820 may be provided.

The optical system unit 821 includes a mirror, a beam expander, a beam homogenizer, or the like, for example, and can homogenize and expand the energy in-plane distribution of laser light 825 emitted from the laser oscillator 820.

As the mirror 822, a dielectric multilayer mirror can be used, for example, and is provided so that the incident angle of the laser light is substantially 45°. The microlens array 823 can have a shape such that a plurality of convex lenses are provided on the top surface or on the top and bottom surfaces of a quartz board, for example.

With the above-described laser crystallization apparatus, polycrystalline silicon layers with small variation in crystallinity can be formed.

This embodiment can be combined with any of the other embodiments as appropriate.

Embodiment 4

In this embodiment, an electronic device of one embodiment of the present invention is described with reference to FIGS. 27A to 27D.

Electronic devices of this embodiment are provided with a display device of one embodiment of the present invention in a display portion. Thus, the electronic devices achieve high resolution. In addition, the electronic devices can achieve both high resolution and a large screen.

The display portion of the electronic device of this embodiment can display, for example, an image with a resolution of full high definition, 4K2K, 8K4K, 16K8K, or more. As a screen size of the display portion, the diagonal size can be greater than or equal to 20 inches, greater than or equal to 30 inches, greater than or equal to 50 inches, greater than or equal to 60 inches, or greater than or equal to 70 inches.

Examples of electronic devices include electronic devices with a relatively large screen, such as a television device, a desktop or laptop personal computer, a monitor of a computer or the like, digital signage, and a large game machine (e.g., a pachinko machine); a camera such as a digital camera or a digital video camera; a digital photo frame; a mobile phone; a portable game console; a portable information terminal; and an audio reproducing device.

The electronic device of this embodiment can be incorporated along a curved inside/outside wall surface of a house or a building or a curved interior/exterior surface of a car.

The electronic device of this embodiment may include an antenna. When a signal is received by the antenna, the electronic device can display an image, data, or the like on a display portion. When the electronic device includes the antenna and a secondary battery, the antenna may be used for contactless power transmission.

The electronic device of this embodiment may include a sensor (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays).

The electronic device of this embodiment can have a variety of functions such as a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Figure 27A:
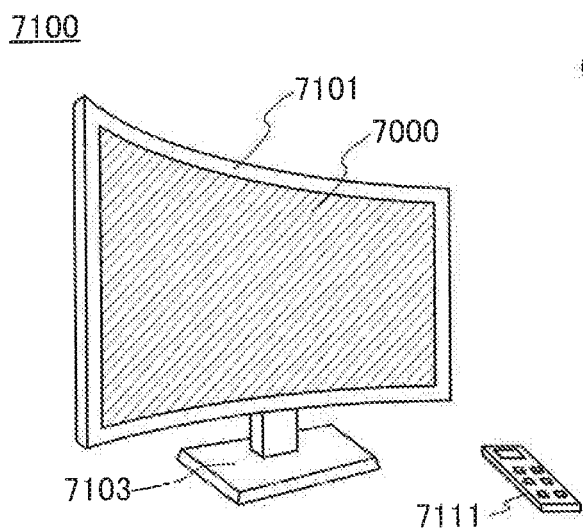
FIGS. 27A to 27D each illustrate an example of an electronic device.

FIG. 27A illustrates an example of a television device. In a television device 7100, a display portion 7000 is incorporated in a housing 7101. In addition, here, the housing 7101 is supported by a stand 7103.

The display device of one embodiment of the present invention can be used in the display portion 7000.

The television device 7100 illustrated in FIG. 27A can be operated with an operation switch provided in the housing 7101 or a separate remote controller 7111. Furthermore, the display portion 7000 may include a touch sensor. The television device 7100 can be operated by touching the display portion 7000 with a finger or the like. Furthermore, the remote controller 7111 may be provided with a display portion for displaying data outputted from the remote controller 7111. With operation keys or a touch panel of the remote controller 7111, channels and volume can be controlled and images displayed on the display portion 7000 can be controlled.

Note that the television device 7100 is provided with a receiver, a modem, and the like. With use of the receiver, general television broadcasting can be received. When the television device is connected to a communication network with or without wires via the modem, one-way (from a transmitter to a receiver) or two-way (between a transmitter and a receiver or between receivers) data communication can be performed.

Figure 27B:
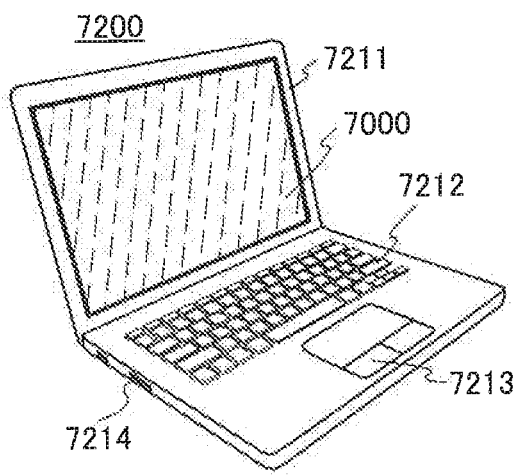

FIG. 27B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used in the display portion 7000.

Figure 27C:
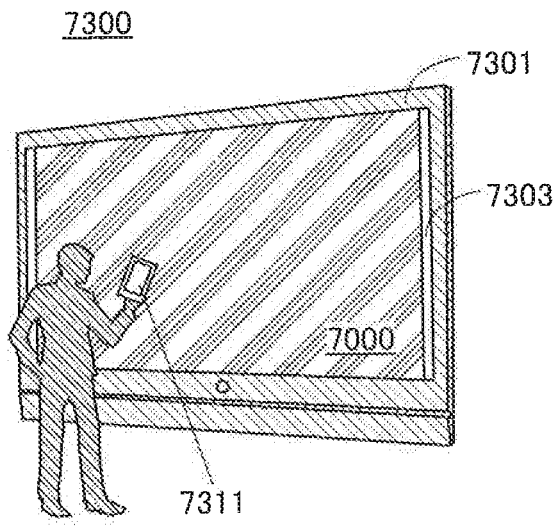
Figure 27D:
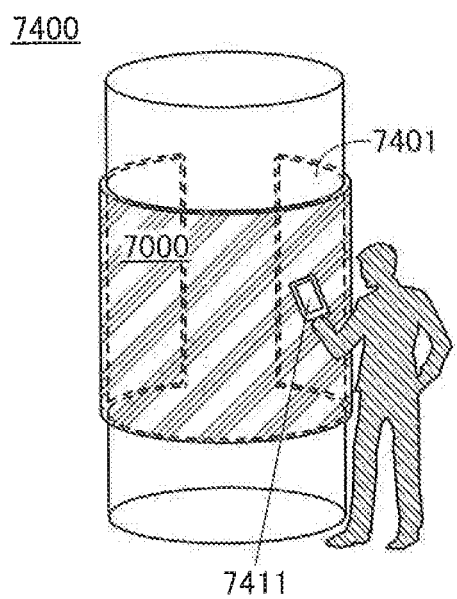

FIGS. 27C and 27D illustrate examples of digital signage.

A digital signage 7300 illustrated in FIG. 27C includes a housing 7301, the display portion 7000, a speaker 7303, and the like. Also, the digital signage can include an LED lamp, operation keys (including a power switch or an operation switch), a connection terminal, a variety of sensors, a microphone, and the like.

FIG. 27D illustrates a digital signage 7400 mounted on a cylindrical pillar 7401. The digital signage 7400 includes the display portion 7000 provided along a curved surface of the pillar 7401.

The display device of one embodiment of the present invention can be used for each of the display portions 7000 illustrated in FIGS. 27C and 27D.

A larger area of the display portion 7000 can provide more information at a time. In addition, the larger display portion 7000 attracts more attention, so that the effectiveness of the advertisement can be increased, for example.

It is preferable to use a touch panel in the display portion 7000 because a device with such a structure does not just display a still or moving image, but can be operated by users intuitively. Alternatively, in the case where the display device of one embodiment of the present invention is used for providing information such as route information or traffic information, usability can be enhanced by intuitive operation.

Furthermore, as illustrated in FIGS. 27C and 27D, it is preferable that the digital signage 7300 or the digital signage 7400 work with an information terminal 7311 or an information terminal 7411 such as a smartphone a user has through wireless communication. For example, information of an advertisement displayed on the display portion 7000 can be displayed on a screen of the portable information terminal 7311 or 7411. Moreover, by operation of the portable information terminal 7311 or 7411, a displayed image on the display portion 7000 can be switched.

Furthermore, it is possible to make the digital signage 7300 or 7400 execute a game with use of the screen of the portable information terminal 7311 or 7411 as an operation means (controller). Thus, an unspecified number of people can join in and enjoy the game concurrently.

This embodiment can be combined with any of the other embodiments as appropriate.

Embodiment 5

In this embodiment, a television device of one embodiment of the present invention is described with reference to FIGS. 28A and 28B.

Figure 28A:
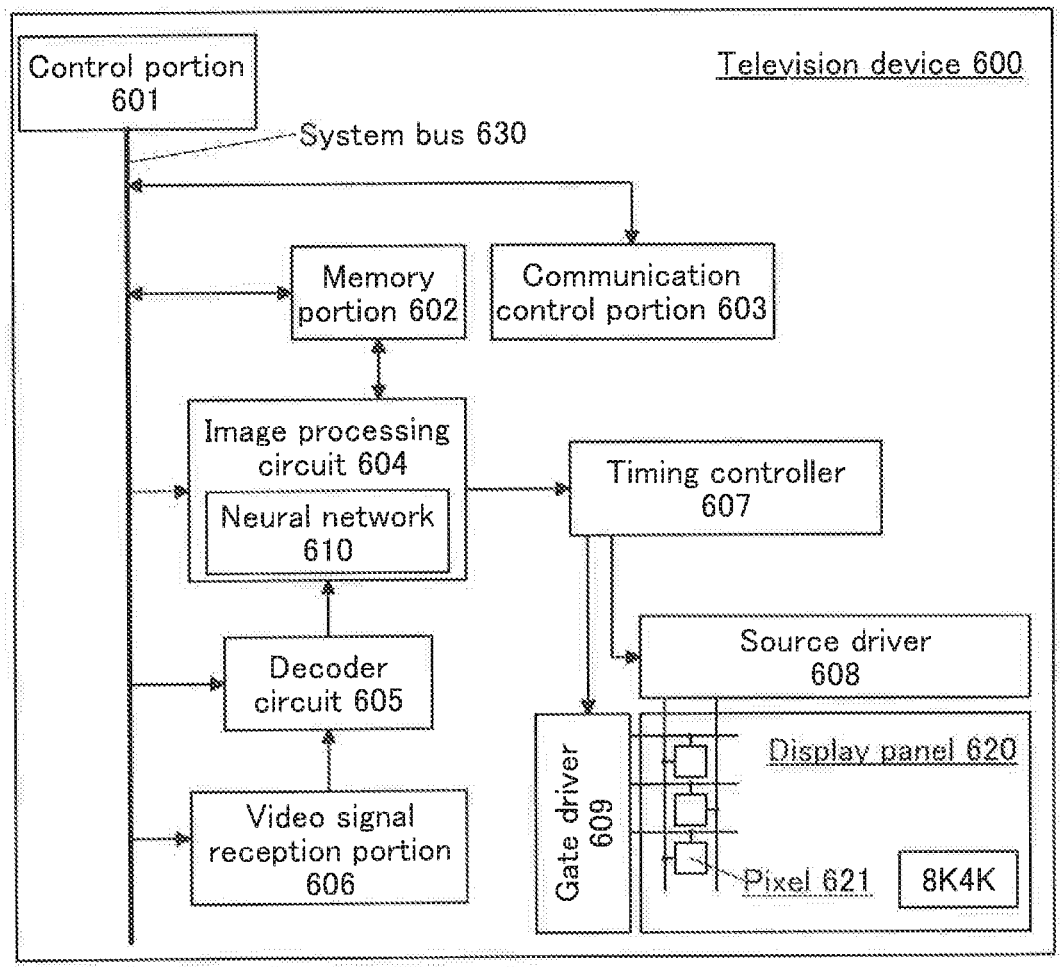
FIGS. 28A and 28B illustrate a television device and a neural network.

FIG. 28A is a block diagram illustrating a television device 600.

Note that in a block diagram attached to this specification, components are classified according to their functions and shown as independent blocks; however, it is practically difficult to completely separate the components according to their functions, and one component may have a plurality of functions.

The television device 600 includes a control portion 601, a memory portion 602, a communication control portion 6, an image processing circuit 604, a decoder circuit 605, a video signal reception portion 606, a timing controller 607, a source driver 608, a gate driver 609, a display panel 620, and the like.

The display device described in Embodiment 1 can be used for the display panel 620 illustrated in FIG. 28A. Thus, the television device 600 with a large size, high resolution, and high display quality can be fabricated.

The control portion 601 can function as, for example, a central processing unit (CPU). For example, the control portion 601 has a function of controlling components such as the memory portion 602, the communication control portion 603, the image processing circuit 604, the decoder circuit 605, and the video signal reception portion 606 via a system bus 630.

Signals are transmitted between the control portion 601 and the components via the system bus 630. The control portion 601 has a function of processing signals inputted from the components which are connected via the system bus 630, a function of generating signals to be outputted to the components, and the like, so that the components connected to the system bus 630 can be controlled comprehensively.

The memory portion 602 functions as a register, a cache memory, a main memory, a secondary memory, or the like that can be accessed by the control portion 601 and the image processing circuit 604.

As a memory device that can be used as a secondary memory, a memory device that includes a rewritable non-volatile memory element can be used, for example. Examples of them include a flash memory, a magnetoresistive random access memory (MRAM), a phase change RAM (PRAM), a resistive RAM (ReRAM), and a ferroelectric RAM (FeRAM).

As a memory device that can be used as a temporary memory such as a register, a cache memory, or a main memory, a volatile memory element such as a dynamic RAM (DRAM) or a static random access memory (SRAM) may be used.

For example, as a RAM provided in the main memory, a DRAM is used, in which case a memory space as a workspace for the control portion 601 is virtually allocated and used. An operating system, an application program, a program module, program data, and the like which are stored in the memory portion 602 are loaded into the RAM and executed. The data, program, and program module which are loaded into the RAM are directly accessed and operated by the control portion 601.

In the ROM, a basic input/output system (BIOS), firmware, and the like for which rewriting is not needed can be stored. As the ROM, a mask ROM, a one-time programmable read only memory (OTPROM), or an erasable programmable read only memory (EPROM) can be used. As an EPROM, an ultra-violet erasable programmable read only memory (UV-EPROM) which can erase stored data by irradiation with ultraviolet rays, an electrically erasable programmable read only memory (EEPROM), a flash memory, and the like can be given.

Besides the memory portion 602, a detachable memory device may be connected to the television device 600. For example, it is preferable to provide a terminal connected to a storage media drive functioning as a storage device such as a hard disk drive (HDD) or a solid state drive (SSD) or a storage medium such as a flash memory, a Blu-ray Disc, or a DVD. With such a structure, an image can be stored.

The communication control portion 603 has a function of controlling communication exchanged via a computer network. For example, the communication control portion 603 controls a control signal for connection to a computer network in response to instructions from the control portion 601 and transmits the signal to the computer network. Accordingly, communication can be performed by connecting to a computer network such as the Internet, which is an infrastructure of the World Wide Web (WWW), an intranet, an extranet, a personal area network (PAN), a local area network (LAN), a campus area network (CAN), a metropolitan area network (MAN), a wide area network (WAN), or a global area network (GAN).

The communication control portion 603 may have a function of communicating with a computer network or another electronic device with a communication standard such as Wi-Fi (registered trademark), Bluetooth (registered trademark), or ZigBee (registered trademark).

The communication control portion 603 may have a function of wireless communication. For example, an antenna and a high frequency circuit (an RF circuit) are provided to receive and transmit an RF signal. The high frequency circuit converts an electromagnetic signal into an electric signal in a frequency band in accordance with respective national laws and transmits the electromagnetic signal wirelessly to another communication device. Several tens of kilohertz to several tens of gigahertz are a practical frequency band which is generally used. The high frequency circuit connected to an antenna includes a high frequency circuit portion compatible with a plurality of frequency bands; the high frequency circuit portion can include an amplifier, a mixer, a filter, a DSP, an RF transceiver, or the like.

The video signal reception portion 606 includes, for example, an antenna, a demodulation circuit, and analog-digital conversion circuit (AD converter circuit), and the like. The demodulation circuit has a function of demodulating a signal inputted from the antenna. The AD converter circuit has a function of converting the demodulated analog signal into a digital signal. The signal processed in the video signal reception portion 606 is transmitted to the decoder circuit 605.

The decoder circuit 605 has a function of decoding video data included in a digital signal inputted from the video signal reception portion 606, in accordance with the specifications of the broadcasting standard for transmitting the video data, and a function of generating a signal transmitted to the image processing circuit. For example, as the broadcasting standard in 8K broadcasts, H.265 MPEG-H high efficiency video coding (hereinafter referred to as HEVC) is given.

The antenna included in the video signal reception portion 606 can receive airwaves such as a ground wave and a satellite wave. The antenna can receive airwaves for analog broadcasting, digital broadcasting, and the like, and image-sound-only broadcasting, sound-only broadcasting, and the like. For example, the antenna can receive airwaves transmitted in a certain frequency band, such as a UHF band (about 300 MHz to 3 GHz) or a VHF band (30 MHz to 300 MHz). When a plurality of pieces of data received in a plurality of frequency bands is used, the transfer rate can be increased and more information can thus be obtained. Accordingly, the display panel 620 can display a video with resolution higher than the full high definition, such as 4K2K, 8K4K, 16K8K, or more.

Alternatively, the video signal reception portion 606 and the decoder circuit 605 may generate a signal using the broadcasting data transmitted to the image processing circuit 604 with data transmission technology through a computer network. In the case where a digital signal is received, the video signal reception portion 606 does not necessarily include a demodulating circuit, an AD converter circuit, and the like.

The image processing circuit 604 has a function of generating a video signal outputted to the timing controller 607, on the basis of a video signal inputted from the decoder circuit 605.

The timing controller 607 has a function of generating a signal (e.g., a clock signal or a start pulse signal) outputted to the gate driver 609 and the source driver 608 on the basis of a synchronization signal included in a video signal or the like on which the image processing circuit 604 performs processing. In addition, the timing controller 607 has a function of generating a video signal outputted to the source driver 608, as well as the above signal.

The display panel 620 includes a plurality of pixels 621. Each pixel 621 is driven by a signal supplied from the gate driver 609 and the source driver 608. Here, an example of a display panel with the 7680×4320 pixels, i.e., the resolution corresponding to the standard of 8K4K, is shown. Note that the resolution of the display panel 620 is not limited to the above, and may have resolution corresponding to the standard such as full high-definition (the number of pixels is 1920×1080) or 4K2K (the number of pixels is 3840×2160).

The control portion 601 or the image processing circuit 604 illustrated in FIG. 28A may include, for example, a processor. For example, a processor functioning as a CPU can be used for the control portion 601. Another processor such as a digital signal processor (DSP) or a graphics processing unit (GPU) can be used, for example for the image processing circuit 604. Furthermore, such a processor obtained with a programmable logic device (PLD) such as a field programmable gate array (FPGA) or a field programmable analog array (FPAA) may be used for the control portion 601 or the image processing circuit 604.

The processor interprets and executes instructions from various programs to process various kinds of data and control programs. The programs executed by the processor may be stored in a memory region included in the processor or a memory device which is additionally provided.

Two or more functions among the functions of the control portion 601, the memory portion 602, the communication control portion 603, the image processing circuit 604, the decoder circuit 605, the video signal reception portion 606, and the timing controller 607 are aggregated in one IC chip to form a system LSI. For example, such a system LSI may include a processor, a decoder circuit, a tuner circuit, an AD converter circuit, a DRAM, an SRAM, and the like.

Note that a transistor that includes an oxide semiconductor in a channel formation region and that has an extremely low off-state current can be used in an IC or the like included in the control portion 601 or another component. With use of the transistor having an extremely low off-state current as a switch for holding electric charge (data) which flows into a capacitor serving as a memory element, a long data retention period can be ensured. By utilizing this characteristic for a register or a cache memory of the control portion 601 or the like, normally-off computing is achieved where the control portion 601 operates only when needed and data on the previous processing is stored in the memory element in the rest of time; thus, power consumption of television device 600 can be reduced.

Note that the structure of the television device 600 illustrated in FIG. 28A is just an example, and all of the components illustrated here are not necessarily included. The television device 600 may include at least necessary components among the components illustrated in FIG. 28A. Furthermore, the television device 600 may include a component other than the components illustrated in FIG. 28A.

For example, the television device 600 may include an external interface, a sound output portion, a touch panel unit, a sensor unit, a camera unit, or the like besides the components in FIG. 28A. Examples of the external interfaces include an external connection terminal such as an universal serial bus (USB) terminal, a local area network (LAN) connection terminal, a power reception terminal, a sound output terminal, a sound input terminal, a video output terminal, and a video input terminal, a transceiver for optical communication using infrared rays, visible light, ultraviolet rays, or the like, a physical button provided on a housing, or the like. Examples of sound input/output portions include a sound controller, a microphone, and a speaker.

The image processing circuit 604 is described in detail below.

The image processing circuit 604 preferably has a function of performing image processing on the basis of a video signal inputted from the decoder circuit 605.

Examples of the image processing include noise removal, grayscale conversion, tone correction, and luminance correction. As the tone correction or the luminance correction, gamma correction can be given, for example.

Furthermore, the image processing circuit 604 preferably has a function of pixel interpolation in accordance with up-conversion of the resolution, a function of frame interpolation in accordance with up-conversion of the frame frequency, or the like.

The noise removing process is a process for removing various noise, such as mosquito noise which appears near outline of texts and the like, block noise which appears in high-speed moving images, random noise causing flicker, and dot noise caused by up-conversion of the resolution.

The grayscale conversion processing converts the grayscale of an image to a grayscale corresponding to output characteristics of the display panel 620. For example, in the case where the number of grayscale levels is increased, gradation values of pixels are interpolated and assigned to respective images inputted with low grayscale levels, so that a smooth histogram can be obtained. In addition, a high-dynamic range (HDR) processing for increasing the dynamic range is also included in the grayscale conversion processing.

The pixel interpolation process interpolates data which does not actually exist when resolution is up-converted. For example, referring pixels around the target pixel, data is interpolated to display intermediate color between the pixels.

The tone correction process corrects the tone of an image. The luminance correction process corrects the brightness (luminance contrast) of an image. For example, these processes detect a type, luminance, color purity, and the like of a lighting in a space where the television device 600 is provided, and corrects luminance and tone of images displayed on the display panel 620 to be optimal luminance and tone in accordance with the detection. These processes can have a function of referring a displayed image to various images of various scenes in an image list stored in advance, and then correcting luminance and tone of the displayed image to be suitable to the images in the closest scene of the image.

In the case where the frame frequency of the displayed video is increased, the frame interpolation generates an image for a frame that does not exist originally (interpolation frame). For example, an image for an interpolation frame which is interposed between two images is generated from difference between the two images. Alternatively, images for a plurality of interpolation frames can be generated between two images. For example, when the frame frequency of a video signal inputted from the decoder circuit 605 is 60 Hz, a plurality of interpolation frames are generated, and the frame frequency of a video signal outputted to the timing controller 607 can be increased twofold (120 Hz), fourfold (240 Hz), eightfold (480 Hz), or the like.

The image processing circuit 604 preferably has a function of performing image processing utilizing a neural network. FIG. 28A illustrates an example in which the image processing circuit 604 includes a neural network 610.

For example, with the neural network 610, features can be extracted from image data included in a video. In addition, the image processing circuit 604 can select an optimal correction method in accordance with the extracted feature or select a parameter used for the correction.

Alternatively, the neural network 610 itself may have a function of performing image processing. In other words, the neural network 610 may receive image data on which image processing is not performed and output image data that has been subjected to image processing.

Data of a weight coefficient used for the neural network 610 is stored in the memory portion 602 as a data table. The data table including the weight coefficient can be updated, for example, by the communication control portion 603 through the computer network. Alternatively, the image processing circuit 604 may have a learning function and enable the update of the data table including the weight coefficient.

Figure 28B:
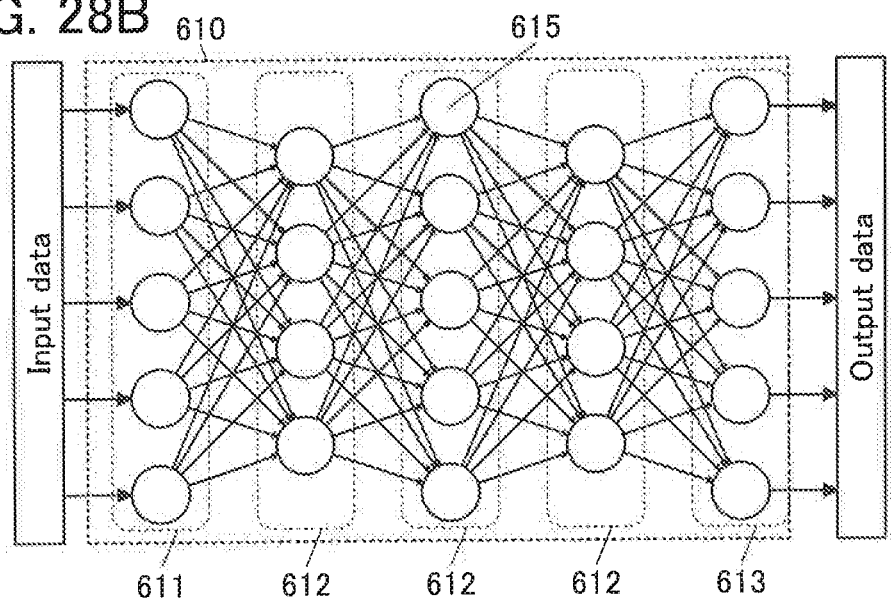

FIG. 28B is a schematic view illustrating the neural network 610 included in the image processing circuit 604.

In this specification and the like, the neural network indicates a general model having the capability of solving problems, which is modeled on a biological neural network and determines the connection strength of neurons by the learning. The neural network includes an input layer, a middle layer (also referred to as hidden layer), and an output layer. A neural network having two or more middle layers is referred to as deep neural network (DNN), and the learning using such a DNN is referred to as deep learning.

In the description of the neural network in this specification and the like, to determine a connection strength of neurons (also referred to as weight coefficient) from the existing data is called "leaning" in some cases. In this specification and the like, to form a neural network using the connection strength obtained by the learning, to lead to a new conclusion, is called "inference" in some cases.

The neural network 610 includes an input layer 611, one or more middle layers 612, and an output layer 613. Input data is inputted to the input layer 611. Output data is outputted from the output layer 613.

Each of the input layer 611, the middle layer 612, and the output layer 613 includes neurons 615. The neuron 615 indicates a circuit element that performs product-sum operation (product-sum operation element). In FIG. 28B, directions of inputting/outputting data between the two neurons 615 in two layers are denoted by arrows.

The arithmetic processing in each layer is executed by the product-sum operation of an output of the neuron 615 in the previous layer and a weight coefficient. For example, when the output from an i-th neuron in the input layer 611 is denoted by $x_i$, and the connection strength (weight coefficient) between the output $x_i$, and a j-th neuron in the middle layer 612 next to the input layer 611 is denoted by $w_{ij}$, the output from the j-th neuron in the middle layer can be denoted by $y_j=f(\Sigma w_{ij} \cdot x_i)$. Note that i and j are each an integer greater than or equal to 1. Here, f(x) represents an activation function, and a sigmoid function, a threshold function, or the like can be used therefor. In this manner, the output of the neuron 615 in each layer is a value obtained from the activation function with respect to the result of product-sum operation of the output from the neuron 615 in the previous layer and the weight coefficient. The connection between layers may be a full connection where all of the neurons are connected or a partial connection where part of neurons is connected.

FIG. 28B illustrates an example including three middle layers 612. The number of the middle layers 612 is not limited to three, and a structure including at least one middle layer is acceptable. The number of neurons included in one middle layer 612 may be changed as appropriate depending on the specifications. For example, the number of the neurons 615 included in one middle layer 612 may be larger or smaller than the number of the neurons 615 included in the input layer 611 or the output layer 613.

The weight coefficient serving as an indicator of the connection strength between the neurons 615 is determined by learning. Although the learning may be executed by the processor in the television device 600, it is preferable to execute the learning with a calculator having high arithmetic processing properties, such as a dedicated server or a cloud. The weight coefficient determined by the learning is stored in the memory portion 602 as the data table and used when the weight coefficient is read out by the image processing circuit 604. The table can be updated as needed through the computer network.

This embodiment can be combined with any of the other embodiments as appropriate. This application is based on Japanese Patent Application Serial No. 2017-015379 filed with Japan Patent Office on Jan. 31, 2017, the entire contents of which are hereby incorporated by reference.

What is claimed is:

1. A display device comprising:
a display portion comprising:
a plurality of pixels arranged in matrix; and
first to fourth signal lines; and
first and second signal line drivers,
wherein the plurality of pixels comprises first to fourth pixels arranged in a same row direction,
wherein the first to fourth signal lines are electrically connected to the first to fourth pixels, respectively,
wherein the display portion comprises a first region and a second region adjacent to each other,
wherein the first region comprises the first and second pixels adjacent to each other,
wherein the second region comprises the third and fourth pixels adjacent to each other,
wherein the third pixel is nearer to the first region than the fourth pixel,
wherein the third and fourth signal lines intersect with each other,
wherein the first, second, and fourth signal lines are electrically connected to the first signal line driver, and
wherein the third signal line is electrically connected to the second signal line driver.

2. The display device according to claim 1, wherein a diagonal size of the display portion is greater than or equal to 50 inches.

3. The display device according to claim 1, wherein resolution of the display portion is higher than or equal to 4K.

4. A display module comprising:
the display device according to claim 1; and
first and second reference voltage generating circuits,
wherein the first reference voltage generating circuit is electrically connected to the first signal line driver circuit, and
wherein the second reference voltage generating circuit is electrically connected to the second signal line driver circuit.

5. A display device comprising:
a display portion comprising:
a plurality of pixels arranged in matrix; and
first to fourth signal lines; and
first and second flexible printed circuits (FPCs),
wherein the plurality of pixels comprises first to fourth pixels arranged in a same row direction,
wherein the first to fourth signal lines are electrically connected to the first to fourth pixels, respectively,
wherein the display portion comprises a first region and a second region adjacent to each other,
wherein the first region comprises the first and second pixels adjacent to each other,
wherein the second region comprises the third and fourth pixels adjacent to each other,
wherein the third pixel is nearer to the first region than the fourth pixel,
wherein the third and fourth signal lines intersect with each other,
wherein the first, second, and fourth signal lines are electrically connected to the first FPC, and
wherein the third signal line is electrically connected to the second FPC.

6. The display device according to claim 5, wherein a diagonal size of the display portion is greater than or equal to 50 inches.

7. The display device according to claim 5, wherein resolution of the display portion is higher than or equal to 4K.

8. A display module comprising:
the display device according to claim 5; and
first and second reference voltage generating circuits,
wherein the first reference voltage generating circuit is electrically connected to the first FPC, and
wherein the second reference voltage generating circuit is electrically connected to the second FPC.

9. A display module comprising first and second reference voltage generating circuits and a display device, the display device comprising:
a display portion comprising:
a plurality of pixels arranged in matrix; and
first to fourth signal lines; and
first and second signal line drivers,
wherein the plurality of pixels comprises first to fourth pixels arranged in a same row direction,
wherein the first to fourth signal lines are electrically connected to the first to fourth pixels, respectively, wherein the display portion comprises a first region and a second region adjacent to each other,
wherein the first region comprises the first and second pixels adjacent to each other,
wherein the second region comprises the third and fourth pixels adjacent to each other,
wherein the third pixel is nearer to the first region than the fourth pixel,
wherein the first, second, and fourth signal lines are electrically connected to the first signal line driver,
wherein the third signal line is electrically connected to the second signal line driver,
wherein the first reference voltage generating circuit is electrically connected to the first signal line driver circuit, and
wherein the second reference voltage generating circuit is electrically connected to the second signal line driver circuit.

* * * * *